United States Patent
Kawamura et al.

(10) Patent No.: US 8,983,399 B2
(45) Date of Patent: Mar. 17, 2015

(54) SEMICONDUCTOR DEVICE, METHOD OF MANUFACTURING THE SAME, IN-MILLIMETER-WAVE DIELECTRIC TRANSMISSION DEVICE, METHOD OF MANUFACTURING THE SAME, AND IN-MILLIMETER-WAVE DIELECTRIC TRANSMISSION SYSTEM

(75) Inventors: Hirofumi Kawamura, Chiba (JP); Yasuhiro Okada, Tokyo (JP)

(73) Assignee: Sony Corporation, Tokyo (JP)

(*) Notice: Subject to any disclaimer, the term of this patent is extended or adjusted under 35 U.S.C. 154(b) by 922 days.

(21) Appl. No.: 13/141,726

(22) PCT Filed: Dec. 8, 2009

(86) PCT No.: PCT/JP2009/070519
§ 371 (c)(1),
(2), (4) Date: Sep. 8, 2011

(87) PCT Pub. No.: WO2010/079663
PCT Pub. Date: Jul. 15, 2010

(65) Prior Publication Data
US 2011/0309893 A1    Dec. 22, 2011

(30) Foreign Application Priority Data
Jan. 7, 2009   (JP) .................... 2009-001922
Jul. 13, 2009  (JP) .................... 2009-164506

(51) Int. Cl.
*H04B 1/38*   (2006.01)
*H01L 23/48*  (2006.01)
(Continued)

(52) U.S. Cl.
CPC ............... *H01L 23/48* (2013.01); *H01L 23/66* (2013.01); *H01L 24/49* (2013.01);
(Continued)

(58) Field of Classification Search
USPC ............... 455/41.1, 41.2, 73, 575.1, 575.5; 361/760, 762, 765, 784, 790, 814, 816, 361/818; 257/685, 686, 777, 778, 779, 780
See application file for complete search history.

(56) References Cited

U.S. PATENT DOCUMENTS 5,629,838 A     5/1997  Knight et al.
5,898,909 A *   4/1999  Yoshihara et al. ............ 455/73
(Continued)

FOREIGN PATENT DOCUMENTS

EP    1667227 A1   6/2006
JP    09-504908    5/1997
(Continued)

OTHER PUBLICATIONS

Extended European Supplemental Search Report issued in connection with related European Patent Application No. EP 09837549 dated Aug. 23, 2013.
(Continued)

*Primary Examiner* — Tuan A Tran
(74) *Attorney, Agent, or Firm* — Dentons US LLP

(57) ABSTRACT

Provided is an in-millimeter-wave dielectric transmission device. The in-millimeter-wave dielectric transmission device includes a semiconductor chip provided on one interposer substrate and capable of in-millimeter-wave dielectric transmission, an antenna structure connected to the semiconductor chip, two semiconductor packages including a molded resin configured to cover the semiconductor chip and the antenna structure, and a dielectric transmission path provided between the two semiconductor packages to transmit a millimeter wave signal. The semiconductor packages are mounted such that the antenna structures thereof are arranged with the dielectric transmission path interposed therebetween.

9 Claims, 35 Drawing Sheets

(51) Int. Cl.
*H01L 23/66* (2006.01)
*H01L 23/00* (2006.01)
*H01L 25/065* (2006.01)
*H01L 25/10* (2006.01)
*H01P 3/12* (2006.01)
*H01Q 9/04* (2006.01)
*H01Q 23/00* (2006.01)

(52) U.S. Cl.
CPC ......... *H01L 25/0655* (2013.01); *H01L 25/105* (2013.01); *H01P 3/121* (2013.01); *H01P 3/122* (2013.01); *H01Q 9/0407* (2013.01); *H01Q 23/00* (2013.01); *H01L 25/0657* (2013.01); *H01L 24/48* (2013.01); *H01L 2223/6627* (2013.01); *H01L 2223/6677* (2013.01); *H01L 2224/48091* (2013.01); *H01L 2224/48137* (2013.01); *H01L 2224/48227* (2013.01); *H01L 2224/49171* (2013.01); *H01L 2224/49175* (2013.01); *H01L 2924/01004* (2013.01); *H01L 2924/01014* (2013.01); *H01L 2924/01029* (2013.01); *H01L 2924/01033* (2013.01); *H01L 2924/01038* (2013.01); *H01L 2924/01057* (2013.01); *H01L 2924/01082* (2013.01); *H01L 2924/14* (2013.01); *H01L 2924/15311* (2013.01); *H01L 2924/15331* (2013.01); *H01L 2924/1903* (2013.01); *H01L 2924/19104* (2013.01); *H01L 2924/3011* (2013.01); *H01L 2924/3025* (2013.01); *H01L 2924/01005* (2013.01); *H01L 2924/01006* (2013.01); *H01L 2924/01019* (2013.01); *H01L 2924/01023* (2013.01); *H01L 2924/01042* (2013.01); *H01L 2924/01074* (2013.01); *H01L 2924/01075* (2013.01); *H01L 2924/014* (2013.01); *H01L 2225/0651* (2013.01); *H01L 2225/06575* (2013.01); *H01L 2225/1023* (2013.01); *H01L 2225/1058* (2013.01); *H01L 2225/1005* (2013.01); *H01L 2224/32145* (2013.01); *H01L 2224/32225* (2013.01); *H01L 2224/73265* (2013.01)

USPC ...... 455/73; 455/41.2; 455/575.1; 455/575.5; 361/760; 361/762; 361/765; 361/784; 361/790; 361/814; 361/816; 361/818; 257/777

(56) References Cited

U.S. PATENT DOCUMENTS

| | | | | |
|---|---|---|---|---|
| 6,308,894 | B1 * | 10/2001 | Hirai et al. | 235/492 |
| 6,518,887 | B2 * | 2/2003 | Suzuki et al. | 340/572.8 |
| 6,628,178 | B2 * | 9/2003 | Uchikoba | 333/193 |
| 6,698,084 | B2 * | 3/2004 | Uchikoba | 29/601 |
| 6,770,955 | B1 | 8/2004 | Coccioli et al. | |
| 7,018,844 | B2 * | 3/2006 | Yagi et al. | 436/106 |
| 7,173,282 | B2 * | 2/2007 | Yamazaki et al. | 257/72 |
| 7,315,455 | B2 * | 1/2008 | Furukawa et al. | 361/760 |
| 7,372,149 | B2 * | 5/2008 | Yamamoto et al. | 257/728 |
| 7,667,974 | B2 * | 2/2010 | Nakatani et al. | 361/760 |
| 7,840,188 | B2 * | 11/2010 | Kurokawa | 455/73 |
| 7,948,059 | B2 * | 5/2011 | Ozeki et al. | 257/620 |
| 8,159,043 | B2 * | 4/2012 | Yamazaki et al. | 257/531 |
| 2003/0122233 | A1 * | 7/2003 | Yagi et al. | 257/678 |
| 2004/0042186 | A1 * | 3/2004 | Furukawa et al. | 361/760 |
| 2005/0179122 | A1 * | 8/2005 | Okawa et al. | 257/679 |
| 2006/0017157 | A1 * | 1/2006 | Yamamoto et al. | 257/728 |
| 2006/0043585 | A1 | 3/2006 | Sukegawa | |
| 2007/0273022 | A1 * | 11/2007 | Ozeki et al. | 257/701 |
| 2008/0048307 | A1 | 2/2008 | Nakatani et al. | |

FOREIGN PATENT DOCUMENTS

| | | |
|---|---|---|
| JP | 2004-104816 | 4/2004 |
| JP | 2006-093659 | 4/2006 |
| WO | WO/2005/074029 A1 | 8/2005 |

OTHER PUBLICATIONS

International Search Report dated Feb. 2, 2010.
Japanese Office Action issued in connection with related Japanese Patent Application No. 2009-164506 dated Dec. 3, 2013.
Chinese Office Action issued in connection with related Chinese Patent Application No. 200980153550.4 dated Nov. 27, 2013.

* cited by examiner

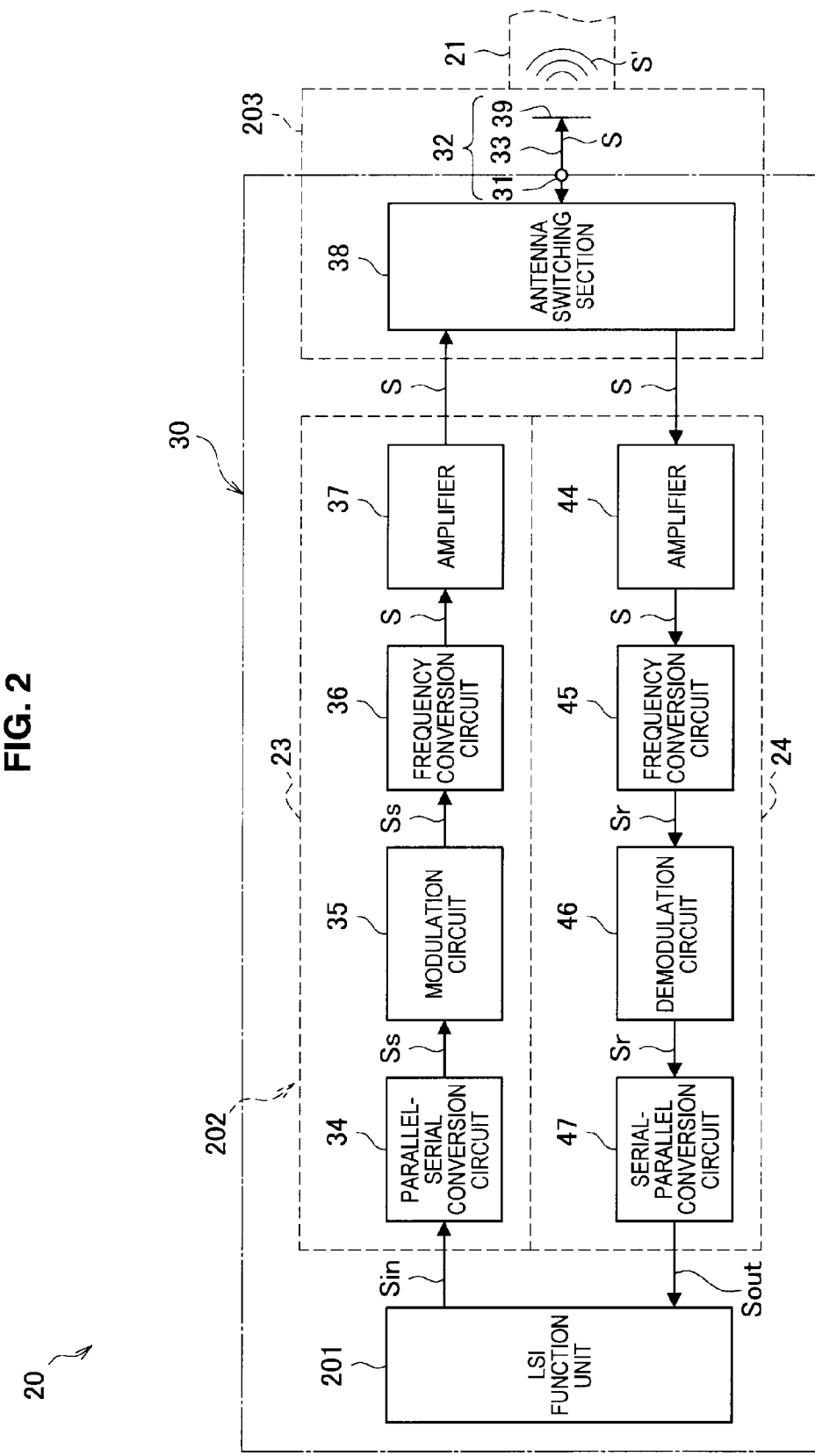

FIG. 24B

| | LENGTH(μm) |
|---|---|
| W | 13 |
| La | 560 |
| Lg | 272 |
| H | 113 |

FIG. 24C

| | RELATIVE DIELECTRIC CONSTANT | DIELECTRIC LOSS TANGENT | RESISTIVITY |
|---|---|---|---|
| OXIDE FILM | 3.5 | 0.02 | — |
| SILICON | 11.9 | — | $10\,\Omega\cdot cm$ |

SEMICONDUCTOR DEVICE, METHOD OF MANUFACTURING THE SAME, IN-MILLIMETER-WAVE DIELECTRIC TRANSMISSION DEVICE, METHOD OF MANUFACTURING THE SAME, AND IN-MILLIMETER-WAVE DIELECTRIC TRANSMISSION SYSTEM

TECHNICAL FIELD

The present invention relates to a semiconductor device, a method of manufacturing the same, an in-millimeter-wave dielectric transmission device, a method of manufacturing the same, and an in-millimeter-wave dielectric transmission system.

BACKGROUND ART

In recent years, with a significant increase in the amount of information on movie images, computer images and the like, various devices have been used to transmit a baseband signal such as a millimeter wave at a high speed. For such a high speed baseband signal transmission device, it is necessary to transmit a high speed baseband signal such as a millimeter wave with no error.

Meanwhile, according to a semiconductor package for transmitting a baseband signal, there are many cases in which a semiconductor chip including a plurality of circuit elements formed on a semiconductor element to constitute a large-scale electronic circuit is sealed into a small package provided with a plurality of terminals.

FIG. 38A is a plan view illustrating a configuration example of a semiconductor package 1 according to the related art, and FIG. 38B is a sectional view taken along line X3-X3 of FIG. 38A. The semiconductor package 1 illustrated in FIG. 38A includes a semiconductor chip 2 and an interposer substrate 4.

The semiconductor chip 2 is mounted on the interposer substrate 4 and includes an electrical circuit for transmitting a baseband signal. The semiconductor chip 2 is provided on the surface thereof with a plurality of pad electrodes 3. The interposer substrate 4 is provided on the rear surface side thereof with a plurality of terminal electrodes 5. The terminal electrodes 5 are terminals for an electrical connection with a mounting substrate to which the semiconductor package 1 is applied, and are used for a power source, grounding, and inputting/outputting an electrical signal. The interposer substrate 4 connects the pad electrodes 3 of the semiconductor chip 2 to the terminal electrodes 5. The pad electrodes 3 of the semiconductor chip 2 are connected to lead electrodes 6 by bonding wires 7.

Furthermore, the interposer substrate 4 is provided on the surface thereof with the lead electrodes 6 corresponding to the pad electrodes 3. The lead electrodes 6 are connected to the terminal electrodes 5 via wiring patterns in the interposer substrate 4. In general, in order to connect the semiconductor chip 2 to the interposer substrate 4, lead frames or the bonding wires 7 are used. Otherwise, there is a flip-chip bonding method using solder balls. According to the flip-chip bonding method, protrusion electrodes 9 (bumps: solder balls) are provided on the rear surface of the semiconductor chip 2 and the surface of the interposer substrate 4, and the semiconductor chip 2 is bonded to the interposer substrate 4 via the solder balls.

The semiconductor chip 2 and the bonding wires 7 mounted on the interposer substrate 4 are sealed with a molded resin 8. The molded resin 8 is a dielectric material, and the main sealing purpose is to protect the semiconductor chip 2 in the package and wirings using the bonding wires 7. The semiconductor package 1 is normally mounted on the surface of a mounting substrate such as a printed board for use. The semiconductor package 1 is wired to the same printed board or an electrical circuit of another printed board.

In general, in the wiring in a printed board, there are many cases in which a multilayer substrate is used with an increase in the number of wirings. The multilayer substrate is formed by patterning wirings on a thin dielectric substrate, bonding the wirings to one another in an overlapped state, and connecting wirings of each layer to one another through vias. In layers of the multilayer substrate, connectors are mounted on each dielectric substrate, and wiring is performed through a direct connection among the connectors or a cable connection among the connectors.

FIG. 39 is a sectional view illustrating a configuration example of an electronic device 700 including stacked semiconductor packages 1a and 1b. According to the electronic device 700 illustrated in FIG. 39, a housing 12 includes the two semiconductor packages 1a and 1b, mounting substrates 10a and 10b, a chassis 11, connectors 14, and cables 15.

The semiconductor package 1a is mounted on the lower substrate 10a and the semiconductor package 1b is mounted on the upper substrate 10b. The semiconductor packages 1a and 1b are bonded to the chassis 11 so that the surfaces of the semiconductor packages 1a and 1b are brought into contact with the chassis 11. This allows heat generated from the semiconductor packages 1a and 1b to be discharged to the chassis 11. The two substrates 10a and 10b are fixed to the chassis 11. The chassis 11 is further fixed to the housing 12. For the fixing of the substrates 10a and 10b to the chassis 11 and the fixing of the chassis 11 to the housing 12, a screw structure 13 is employed. As a material of the chassis 11, a metal, a solid plastic material and the like are used. Furthermore, data transmission between the semiconductor packages 1a and 1b is performed by providing the connectors 14 to the lower substrate 10a and the upper substrate 10b and connecting the connectors 14 to each other using the cables 15.

In relation to such an electronic device 700 for transmitting/receiving a millimeter signal, Patent Literature 1 discloses a dielectric waveguide line. According to the dielectric waveguide line, a pair of main conductor layers, via hole groups of two rows, and a sub-conductor layer are provided, and the main conductor layers are formed in parallel to each other with the dielectric interposed therebetween. The via hole groups are formed to allow the main conductor layers to be electrically connected to each other at an interval equal to or less than a cut-off wavelength in a signal transmission direction. The sub-conductor layer is connected to the via hole groups and is formed in parallel to the main conductor layers. In the dielectric waveguide line, when transmitting an electrical signal by a waveguide area surrounded by the main conductor layers, the via hole groups, and the sub-conductor layer, at least one of the main conductor layers is formed with a slot hole for electromagnetic coupling with a high frequency transmission line. The high frequency transmission line includes a microstrip line and is formed at a position facing the slot hole. When the dielectric waveguide line is formed as described above, the dielectric waveguide line can be easily electromagnetically coupled with another high frequency transmission line, and signal transmission is possible. In addition, it is possible to provide a waveguide line having stable characteristics from microwaves to millimeter waves.

CITATION LIST

Patent Literature

Patent Literature 1: JP 2004-104816 A (page 4, FIG. 1)

SUMMARY OF INVENTION

Technical Problem

However, in accordance with the electronic device 700 for transmitting/receiving a millimeter signal according to the related art, the following problems occur.

i. According to the electronic device 700, the semiconductor packages 1a and 1b illustrated in FIG. 39 are bonded to the chassis 11 so that the surfaces of the semiconductor packages 1a and 1b are brought into contact with the chassis 11, and the cable 15 is connected between the connectors 14 provided to the lower substrate 10a and the upper substrate 10b. Furthermore, data is transmitted between the semiconductor packages 1a and 1b. However, with an increase in the capacity of data processed in the electronic device, the number of wirings connected to the semiconductor packages 1a and 1b may increase.

For example, in a semiconductor package to be used as a memory, as a data width increases to 32 bits and 64 bits, an address width also increases. Therefore, the number of the terminal electrodes 5 of the semiconductor packages 1a and 1b increases. Thus, a problem in which a package size increases may occur. This is specifically caused by the fact that the size of the terminal electrode 5 of the interposer substrate 4 increases as compared with the size of the pad electrode 3 of the semiconductor chip 2.

ii. Since there is an increase in the number of wirings connected to the semiconductor package 1a in the substrate 10, it is necessary to allow the substrate 10 to employ a multilayer structure more and more. As a consequence, a problem in which the cost increases may occur.

iii. The substrates 10a and 10b employ the multilayer structure, resulting in an increase in the number of the connectors 14 for connecting the lower substrate 10a to the upper substrate 10b and the number of terminals of the cable 15. As a consequence, problems in which the physical size of the connector 14 and the cable 15 increases, the shape of the connector 14 and the cable 15 is complicated, the reliability of the connector 14 and the cable 15 is reduced, and the cost increases may occur.

iv. Since the multilayer structure causes the use of a plurality of connectors 14 and cables 15, the configuration, shape and arrangement of the substrates 10a and 10b, the chassis 11 and the housing 12 in the electronic device are complicated. As a consequence, problems in which the manufacturing cost increases, the number of assembling steps increases, and the difficulty of assembling work increases may occur.

v. In addition, it may be possible to consider the case in which an electronic device for transmitting/receiving a millimeter wave signal is configured with reference to the dielectric waveguide line as disclosed in Patent Literature 1.

In such a case, in the structure of the electronic device 700 including the stacked semiconductor packages 1a and 1b illustrated in FIG. 39, replacement of the connector 14 and the cable 15 with the dielectric waveguide line has been considered. However, even if the connector 14 and the cable 15 are replaced with the dielectric waveguide line, a problem in which it is difficult to transmit a high speed baseband signal such as a millimeter wave with no error may occur.

The present invention is made in view of the above-mentioned issues, and aims to easily construct an in-millimeter-wave dielectric transmission system without depending on connectors having a number of terminals and cables having a large mounting area. An object of the present invention is to provide a semiconductor device, a method of manufacturing the same, an in-millimeter-wave dielectric transmission device, a method of manufacturing the same, and an in-millimeter-wave dielectric transmission system.

Solution to Problem

According to the first aspect of the present invention in order to achieve the above-mentioned object, there is provide a semiconductor device including: a semiconductor chip provided on a substrate and capable of millimeter-wave band communication; an antenna structure connected to the semiconductor chip; an insulating member configured to cover the semiconductor chip; and a millimeter wave transmission member made of a dielectric material including a dielectric capable of millimeter wave signal transmission and matched with the antenna structure.

When the antenna structure is covered with the insulating member, the insulating member includes a dielectric capable of allowing a millimeter wave signal to pass therethrough. For example, in the case of employing a configuration in which a plurality of semiconductor chips capable of millimeter wave communication are received in the same package, when the whole of the antenna structure is also covered with the insulating member, the insulating member covering the semiconductor chips serves as a millimeter wave transmission member enabling millimeter wave signal transmission between the plurality of semiconductor chips.

In accordance with the semiconductor device according to the present invention, when allowing two semiconductor devices having the same configuration and capable of in-millimeter-wave dielectric transmission according to the present invention to contact each other with millimeter wave transmission members thereof interposed therebetween, and operating the semiconductor devices, it is possible to transmit a millimeter wave signal from one semiconductor device to another semiconductor device.

According to the second aspect of the present invention in order to achieve the above-mentioned object, there is provided an in-millimeter-wave dielectric transmission device including: a first semiconductor device capable of in-millimeter-wave dielectric transmission, including a semiconductor chip provided on one substrate and capable of millimeter-wave band communication, an antenna structure connected to the semiconductor chip, and an insulating member configured to cover the semiconductor chip; a second semiconductor device capable of in-millimeter-wave dielectric transmission, including a semiconductor chip provided on another substrate and capable of millimeter-wave band communication, an antenna structure connected to the semiconductor chip, and an insulating member configured to cover the semiconductor chip; and a millimeter wave signal transmission member made of a dielectric material including a dielectric capable of in-millimeter-wave dielectric transmission and provided between the first semiconductor device and the second semiconductor device, wherein the first semiconductor device and the second semiconductor device are mounted with the millimeter wave signal transmission member interposed therebetween such that a millimeter wave signal is transmitted between the antenna structure of the first semiconductor device and the antenna structure of the second semiconductor device.

In accordance with the in-millimeter-wave dielectric transmission device according to the present invention, it is possible to transmit a millimeter wave signal from the first semiconductor device to the second semiconductor device via the millimeter wave signal transmission member provided between the first semiconductor device and the second semiconductor device.

According to the third aspect of the present invention in order to achieve the above-mentioned object, there is provided a method of manufacturing a semiconductor device, the method including the steps of: forming a semiconductor chip capable of millimeter-wave band communication on a substrate; connecting an antenna structure to the semiconductor chip formed on the substrate; insulating the semiconductor chip by covering the semiconductor chip with an insulating member; and matching the antenna structure with a millimeter wave transmission member using a dielectric material including a dielectric capable of millimeter wave signal transmission.

According to the fourth aspect of the present invention in order to achieve the above-mentioned object, there is provided a method of manufacturing an in-millimeter-wave dielectric transmission device, the method including the steps of: forming a first semiconductor device capable of in-millimeter-wave dielectric transmission by providing a semiconductor chip capable of millimeter-wave band communication on one substrate, connecting an antenna structure to the semiconductor chip, and covering the semiconductor chip with an insulating member; forming a second semiconductor device capable of in-millimeter-wave dielectric transmission by providing a semiconductor chip capable of millimeter-wave band communication on another substrate, connecting an antenna structure to the semiconductor chip, and covering the semiconductor chip with an insulating member; and forming a millimeter wave transmission member between the first semiconductor device and the second semiconductor device using a dielectric material including a dielectric capable of millimeter wave signal transmission, wherein, in the forming of the millimeter wave transmission member, the first and second semiconductor devices are mounted via the millimeter wave transmission member such that a millimeter wave signal is transmitted between the antenna structure of the first semiconductor device and the antenna structure of the second semiconductor device.

According to the fifth aspect of the present invention in order to achieve the above-mentioned object, there is provided an in-millimeter-wave dielectric transmission system including: a first semiconductor device capable of in-millimeter-wave dielectric transmission, including a semiconductor chip provided on a substrate of one electronic device and capable of millimeter-wave band communication, an antenna structure connected to the semiconductor chip, and an insulating member configured to cover the semiconductor chip of the electronic device; a second semiconductor device capable of in-millimeter-wave dielectric transmission, including a semiconductor chip provided on a substrate of another electronic device and capable of millimeter-wave band communication, an antenna structure connected to the semiconductor chip, and an insulating member configured to cover the semiconductor chip of the electronic device; and a millimeter wave transmission member made of a dielectric material including a dielectric capable of millimeter wave signal transmission and provided between the first semiconductor device and the second semiconductor device, wherein the one electronic device and the other electronic device contact each other via the millimeter wave transmission member such that a millimeter wave signal is transmitted between the antenna structure of the first semiconductor device and the antenna structure of the second semiconductor device.

As described above, in an aspect according to the present invention, the first and second semiconductor devices including semiconductor chips capable of millimeter-wave band communication are arranged such that the antenna structures thereof face each other with a dielectric transmission path interposed therebetween. Therefore, it is possible to transmit a millimeter wave signal from the first semiconductor device to the second semiconductor device via the dielectric transmission path provided between the first semiconductor device and the second semiconductor device and capable of millimeter wave signal transmission. In addition, it is possible to easily construct an in-millimeter-wave dielectric transmission system without depending on a connector having a large number of terminals and a printed wiring sheet cable with a large mounting area.

It is possible to apply an aspect of the present invention having the configuration as described above, for example, to a millimeter-wave band communication system that transmits a millimeter-wave band signal with a carrier frequency of 30 GHz to 300 GHz, which carries a movie image, a computer image and the like, at a high speed.

Advantageous Effects of Invention

In accordance with a semiconductor device and a manufacturing method thereof according to the present invention, an antenna structure is connected to a semiconductor chip. Furthermore, there is provided a millimeter wave transmission member made of a dielectric material including a dielectric capable of transmitting a millimeter wave signal and matched with the antenna structure. When the whole of the antenna structure is covered with an insulating member, an insulating member covering the semiconductor chip also includes a dielectric capable of allowing a millimeter wave signal to pass therethrough to constitute an in-millimeter-wave dielectric transmission path.

With such a configuration, two semiconductor devices having the same configuration and capable of in-millimeter-wave dielectric transmission according to the present invention are allowed to contact each other with millimeter wave transmission members thereof interposed therebetween, and operate. Consequently, it is possible to transmit a millimeter wave signal from one semiconductor device to another semiconductor device. Moreover, it is possible to achieve high speed data transmission between the semiconductor devices.

In this way, it is possible to easily construct a millimeter-wave dielectric transmission device capable of transmitting a millimeter wave signal using a simple and inexpensive configuration in one direction or two directions, without depending on a connector having a large number of terminals and a printed wiring sheet cable with a large mounting area.

In accordance with an in-millimeter-wave dielectric transmission device and a manufacturing method thereof according to the present invention, antenna structures of first and second semiconductor devices, which are respectively provided with semiconductor chips capable of millimeter-wave band communication, are arranged with a millimeter wave transmission member interposed therebetween.

With such a configuration, it is possible to transmit a millimeter wave signal from the first semiconductor device to the second semiconductor device via the millimeter wave transmission member provided between the first semiconductor device and the second semiconductor device and capable of millimeter wave signal transmission. In this way, it is possible to easily construct a millimeter-wave dielectric transmission system capable of transmitting a millimeter wave signal in one direction or two directions, without depending on a connector having a large number of terminals and a printed wiring sheet cable with a large mounting area.

In accordance with an in-millimeter-wave dielectric transmission system according to the present invention, a first semiconductor device capable of in-millimeter-wave dielectric transmission is provided on a substrate of one electronic device, and a second semiconductor device capable of in-millimeter-wave dielectric transmission is provided on a substrate of another electronic device. A millimeter wave transmission member capable of transmitting a millimeter wave signal is provided between the first semiconductor device and the second semiconductor device, and one electronic device and another electronic device contact each other to transmit the millimeter wave signal between the antenna structure of the first semiconductor device and the antenna structure of the second semiconductor device via the millimeter wave transmission member.

With such a configuration, it is possible to transmit a millimeter wave signal from the first semiconductor device to the second semiconductor device via the millimeter wave transmission member provided between the first semiconductor device and the second semiconductor device and capable of millimeter wave signal transmission. In this way, it is possible to perform a communication process between one electronic device and another electronic device, without depending on a communication cable and the like for connecting the two electronic devices to each other.

BRIEF DESCRIPTION OF DRAWINGS

FIG. 2 is a block diagram illustrating an internal configuration example of the semiconductor package 20;

FIG. 24B is a diagram explaining the sizes of each portion of an antenna used in the semiconductor package of the seventh embodiment;

FIG. 24C is a diagram explaining the properties of each portion of the antenna used in the semiconductor package of the seventh embodiment;

DESCRIPTION OF EMBODIMENTS

Figure 1:
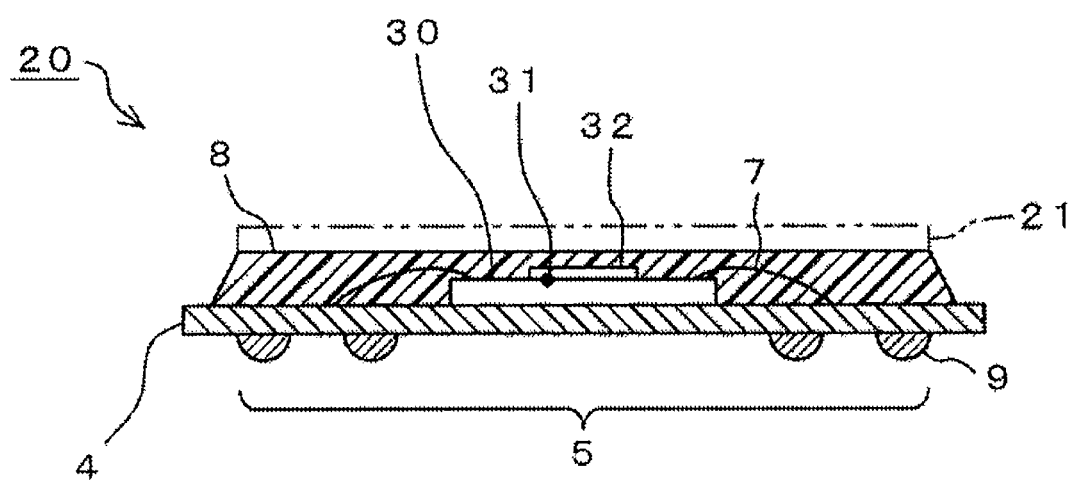
FIG. 1 is a sectional view illustrating a configuration example of a semiconductor package 20 as a first embodiment according to the present invention.

Hereinafter, a semiconductor device, a method of manufacturing the same, an in-millimeter-wave dielectric transmission device, and a method of manufacturing the same according to the present invention will be described with reference to the appended drawings.

1. First Embodiment (semiconductor package 20: configuration example, internal configuration example, and process diagram)

2. Second Embodiment (in-millimeter-wave dielectric transmission device 200: configuration example, assembling example, internal configuration example, enlargement configuration example, simulation model example, characteristic example)

3. Third Embodiment (in-millimeter-wave dielectric transmission device 300: configuration example)

4. Fourth Embodiment (semiconductor package 20c: configuration example, formation example/in-millimeter-wave dielectric transmission device 400: configuration example and assembling example)

5. Fifth Embodiment (in-millimeter-wave dielectric transmission device 500: configuration example and formation example)

6. Sixth Embodiment (in-millimeter-wave dielectric transmission system 600: configuration example/formation example of electronic devices 201 and 202)

7. Seventh Embodiment (millimeter-wave transmission between a plurality of semiconductor chips in the same package)

8. Eighth Embodiment (Seventh Embodiment+millimeter-wave transmission between different packages)

9. Modified Example (first to fourth modified examples)

<First Embodiment>

[Configuration Example of Semiconductor Package 20]

The configuration example of the semiconductor package 20 will be described as the first embodiment according to the present invention with reference to FIG. 1 below. The semiconductor package 20 illustrated in FIG. 1 constitutes an example of a semiconductor device. The semiconductor package 20 can be applied to an in-millimeter-wave dielectric transmission system that transmits a millimeter-wave band signal at a high speed, which has a carrier frequency of 30 GHz to 300 GHz for carrying a movie image, a computer image and the like. The in-millimeter-wave dielectric transmission system includes a digital recording reproduction apparatus, a terrestrial television receiver, a cell phone, a game machine, a computer, a communication apparatus and the like.

The semiconductor package 20 includes an interposer substrate 4, a molded resin 8, a dielectric transmission path 21 capable of transmitting a millimeter wave signal, a semiconductor chip 30 capable of millimeter-wave band communication, and an antenna structure 32. The interposer substrate 4 constitutes a chip mounting substrate, and the semiconductor chip 30 is provided on the interposer substrate 4. A sheet member obtained by combining a heat-reinforced resin having a predetermined specific dielectric constant with copper foil is used as the interposer substrate 4. The semiconductor chip 30 performs a communication process in a millimeter wave band. The semiconductor chip 30 uses a system LSI obtained by integrally forming an LSI function unit 201 with a signal generation unit 202 illustrated in FIG. 2 (refer to FIG. 2).

In addition, in the same manner as the related art, terminals of a power supply unit and the like, which do not convert a millimeter wave signal, are wired from pad electrodes 3 of the semiconductor chip 30 to lead electrodes 6 via bonding wires 7, and are connected to terminal electrodes 5 via the interposer substrate 4.

The antenna structure 32 is connected to the semiconductor chip 30. In this example, the antenna structure 32 is provided on the semiconductor chip 30 of the interposer substrate 4. The antenna structure 32 includes an antenna terminal 31, a microstrip line 33, an antenna 39 and the like (refer to FIG. 2).

Package elements of the semiconductor chip 30, the antenna structure 32 and the like on the interposer substrate 4 are covered with the molded resin 8 as an example of an insulation member so that the package elements are insulated (sealed). As the molded resin 8, for example, an epoxy resin having a specific dielectric constant ∈1 is used. According to the semiconductor package 1 in the related art, a printed wiring sheet cable for data transmission is connected from the pad electrodes 3 of the semiconductor chip 2 illustrated in FIG. 39 to the terminal electrodes 5.

In accordance with the semiconductor package 20 according to the present invention, the antenna terminal 31 is wired to a semiconductor integrated circuit realizing the signal generation unit 202 in the semiconductor chip 30. With such a structure, a part of the terminal electrodes 5 of the semiconductor package 1 in the related art is replaced with the antenna structure 32 in the semiconductor package 20 of the present invention. As a consequence, it is possible to reduce the number of the terminal electrodes 5.

When the whole of the antenna structure is covered with the molded resin 8, the molded resin 8 is made of a dielectric material including a dielectric capable of transmitting a millimeter wave signal and is configured to constitute the whole or a part of the dielectric transmission path 21. When the present embodiment is not applied, the object of the molded resin 8 is to protect the semiconductor chip in the package and wirings using bonding wires. However, the present embodiment differs further in that the dielectric transmission path 21 is achieved.

The dielectric transmission path 21 capable of transmitting a millimeter wave signal as indicated by a two-dot chain line is provided on the molded resin 8. The dielectric transmission path 21 constitutes an example of a millimeter wave transmission member, and includes a part of a chassis 11 made of a metal and a dielectric material with a predetermined specific dielectric constant ∈3 as illustrated in FIGS. 3A to 3E. The dielectric material includes a dielectric capable of transmitting a millimeter wave signal. As the dielectric material, for example, a member including an acryl resin-based, urethane resin-based, epoxy resin-based, silicon-based, or polyimide-based dielectric material is used. The chassis 11 constitutes an example of an area-defining member, and is formed with through portions 11a matched with the upper portion of the antenna structure 32. The opened cross-section of the through portions 11a may have a circular shape or a rectangular shape. The depth (height) of the through portions 11a formed in the thickness direction of the chassis 11 defines (regulates) the length of the dielectric transmission path 21 (waveguide).

The dielectric transmission path 21 is not limited to the thickness direction of the chassis 11, and may be arranged in the surface direction of the chassis 11. The dielectric material is provided in the through portion 11a of the chassis 11 to constitute an in-dielectric transmission path of electromagnetic waves based on a millimeter wave signal. Furthermore, the dielectric transmission path 21 is not limited to the dielectric material provided to the through portion 11a of the chassis 11, and a part of the molded resin 8 sealing the semiconductor chip 30 may be used as the dielectric transmission path 21.

[Internal Configuration Example of Semiconductor Package 20]

The internal configuration example of the semiconductor package 20 will be described with reference to FIG. 2 below. The semiconductor chip 30 illustrated in FIG. 2 includes the LSI function unit 201, the signal generation unit 202, and a bidirectional antenna coupling unit 203. The antenna coupling unit 203 constitutes an example of a signal coupling unit or a part thereof. Here, the antenna coupling unit 203 refers to a unit for coupling an electronic circuit in the semiconductor chip 30 to an antenna arranged inside or outside the chip in a narrow sense. In a broad sense, the antenna coupling unit 203 refers to a unit for signal-coupling the semiconductor chip 30 to the dielectric transmission path 21.

Figure 39:
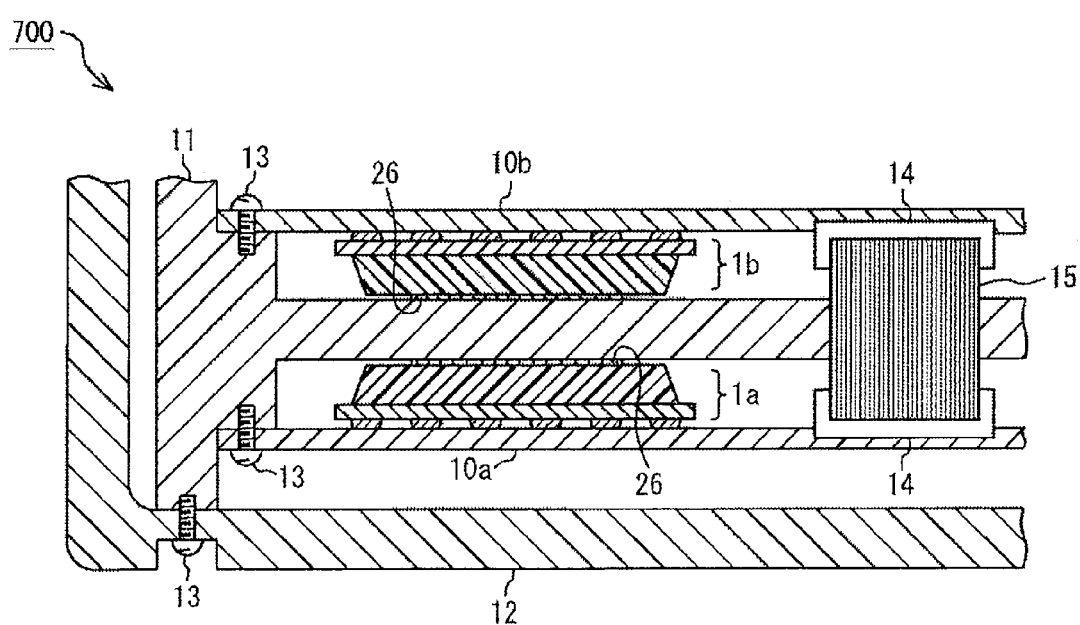
FIG. 39 is a sectional view illustrating a configuration example of an electronic device including the semiconductor package 1 stacked therein.

The LSI function unit 201 has a predetermined function provided by the semiconductor chip 2 illustrated in FIG. 39 in the related art. For example, the LSI function unit 201 includes a circuit for processing image, sound data and the like to be transmitted to a counterpart, or a circuit for processing image and sound data received from the counterpart.

The signal generation unit 202 is connected to the LSI function unit 201. The signal generation unit 202 includes a downlink signal generation block 23 constituting an example of a first signal generation block, and an uplink signal generation block 24 constituting an example of a second signal generation block. The downlink signal generation block 23 includes a parallel-serial conversion circuit 34, a modulation circuit 35, a frequency conversion circuit 36, and an amplifier 37 in order to generate a millimeter wave signal S by performing signal-processing with respect to an input signal Sin.

The parallel-serial conversion circuit 34 constitutes an example of a first signal conversion unit and converts a parallel input signal Sin (data) to a serial transmission signal Ss (data). The modulation circuit 35 is connected to the parallel-serial conversion circuit 34. The modulation circuit 35 is configured to modulate the serial transmission signal Ss. As the modulation circuit 35, for example, a phase modulation circuit or a frequency modulation circuit is used.

The frequency conversion circuit 36 is connected to the modulation circuit 35. The frequency conversion circuit 36 frequency-converts the transmission signal Ss modulated by the modulation circuit 35 and generates the millimeter wave signal S. Here, the millimeter wave signal S refers to a signal with a frequency in the range of 30 GHz to 300 GHz. The amplifier 37 is connected to the frequency conversion circuit 36. The amplifier 37 is configured to amplify the frequency-converted millimeter wave signal S.

The amplifier 37 is connected to the bidirectional antenna coupling unit 203 via the antennal terminal 31 (not illustrated). The antenna coupling unit 203 transmits the millimeter wave signal S generated by the downlink signal generation block 23 to the dielectric transmission path 21, and receives the millimeter wave signal S from the dielectric transmission path 21 to output the millimeter wave signal S to the uplink signal generation block 24. The dielectric transmission path 21 includes the dielectric material with the predetermined specific dielectric constant ∈3.

The antenna coupling unit 203, for example, includes the antenna structure 32 and an antenna switching section 38 (an antenna duplexer). The antenna structure 32 refers to a structure in the antenna coupling unit 203 of the semiconductor package 20 sharing the dielectric transmission path 21. The antenna structure 32 includes the antennal terminal 31, the microstrip line 33, and the antenna 39. When the antenna switching section 38 is formed in the same chip, the antenna terminal 31 and the microstrip line 33, but not the antenna switching section 38, constitute the antenna coupling unit 203.

The antenna 39 has a predetermined length based on the wavelength λ of the millimeter wave signal S, for example, a length of about 600 μm, and is coupled to the dielectric transmission path 21. A probe antenna (a dipole and the like), a loop antenna, or a small aperture coupling element (a slot antenna and the like), in addition to a patch antenna, are used as the antenna 39.

The antenna 39 radiates electromagnetic waves S' based on a downlink millimeter wave signal S to the dielectric transmission path 21. Furthermore, the antenna 39 receives the electromagnetic waves S' based on an uplink millimeter wave signal S from the dielectric transmission path 21. The antenna structure 32 includes the microstrip line 33 in addition to the antenna 39. The microstrip line 33 connects the antenna terminal 31 to the antenna 39, transmits the downlink millimeter wave signal S from the antenna terminal 31 to the antenna 39, and transmits the uplink millimeter wave signal S from the antenna 39 to the antenna terminal 31.

The antenna switching section 38 is used when the antenna 39 is shared by a downlink and an uplink. For example, when transmitting the millimeter wave signal S to a counterpart, the antenna switching section 38 connects the antenna 39 to the downlink signal generation block 23. Furthermore, when receiving the millimeter wave signal S from the counterpart, the antenna switching section 38 connects the antenna 39 to the uplink signal generation block 24. The antenna switching section 38 is provided on the semiconductor chip 30. However, the present invention is not limited thereto. For example, the antenna switching section 38 may be provided inside the semiconductor chip 30. In addition, when providing a downlink antenna separately from an uplink antenna, the antenna switching section 38 may be omitted.

If the antenna coupling unit 203 has a fractional bandwidth (=a signal band/an operating center frequency) of about 10% to 20%, the antenna coupling unit 203 may be easily formed using a resonance structure and the like. In this embodiment, the dielectric material with the specific dielectric constant ∈1 is used and constitutes the dielectric transmission path 21 having a loss. In the transmission path 21, electromagnetic waves S' of millimeter waves propagate. Since the dielectric transmission path 21 has a large loss, reflection is also attenuated.

The uplink signal generation block 24 is connected to the antenna coupling unit 203. The uplink signal generation block 24 includes an amplifier 44, a frequency conversion circuit 45, a demodulation circuit 46, and a serial-parallel conversion circuit 47 in order to generate an output signal Sout by performing signal processing with respect to the millimeter wave signal S received by the antenna coupling unit 203.

The amplifier 44 is connected to the antenna coupling unit 203 and is configured to amplify the millimeter wave signal S received by the antenna 39. The frequency conversion circuit 45 is connected to the amplifier 44, and frequency-converts the amplified millimeter wave signal S to output a frequency-converted serial reception signal Sr. The demodulation circuit 46 is connected to the frequency conversion circuit 45 and is configured to demodulate the frequency-converted serial reception signal Sr.

The serial-parallel conversion circuit 47 constituting an example of a second signal conversion unit is connected to the demodulation circuit 46. The serial-parallel conversion circuit 47 converts the serial reception signal Sr (data) to a parallel output signal Sout (data). When forming the semiconductor chip 30 as described above, the input signal Sin is subject to serial-parallel conversion (a miswriting of parallel-serial conversion) and the reception signal Sr is subject to a serial-parallel conversion process, so that the number of signal wirings is reduced. Furthermore, it is possible to reduce the number of stacked layers of a multilayer substrate. As a consequence, it is possible to reduce the number of connectors having a number of terminals and printed wiring sheet cables.

In this way, the semiconductor package 20 is formed and operates. Thus, the dielectric material provided in one side of the through portion 11a of the chassis 11 and the dielectric material provided in the other side of the through portion 11a of the chassis 11 constitute an in-millimeter-wave dielectric transmission path. Consequently, it is possible to transmit the millimeter wave signal S from one semiconductor package 20 capable of in-millimeter-wave dielectric transmission to another semiconductor package 20 capable of in-millimeter-wave dielectric transmission.

[Formation Example of Semiconductor Package 20]

Next, the formation example of the semiconductor package 20 will be described with reference to FIGS. 3A to 3E. First, the semiconductor chip 30 capable of millimeter-wave band communication is formed on the interposer substrate 4 (a die) illustrated in FIG. 3A. The semiconductor chip 30 uses the system LSI obtained by integrally forming the reception system and the transmission system illustrated in FIG. 2 with the semiconductor integrated circuit. The transmission system includes the LSI function unit 201, the parallel-serial conversion circuit 34, the modulation circuit 35, the frequency conversion circuit 36, the amplifier 37, and the antenna switching section 38, and the reception system includes the amplifier 44, the frequency conversion circuit 45, the demodulation circuit 46, and the serial-parallel conversion circuit 47. The semiconductor chip 30 may be mounted on the interposer substrate 4 through a manufacturing method apparent from the related art.

Next, the antenna terminal 31 is formed on the upper portion of the semiconductor chip 30. The antenna terminal 31, for example, is drawn from an output point of the antenna switching section 38 mounted in the antenna coupling unit 203 of an area providing the antenna structure 32. When the semiconductor chip 30 includes the antenna switching section 39, the antenna terminal 31 is drawn from an output point of the antenna switching section 38 mounted in the semiconductor chip 30.

Figure 3A:
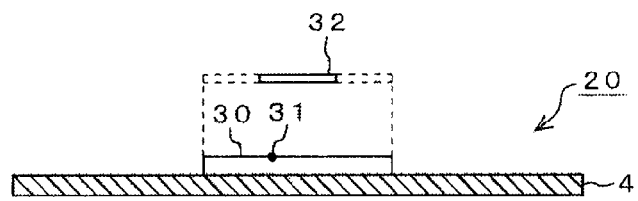
FIG. 3A is a process diagram illustrating a formation example of the semiconductor package 20.
Figure 3B:
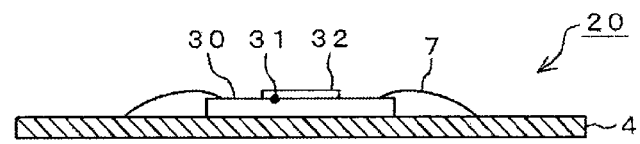
FIG. 3B is a process diagram illustrating a formation example of the semiconductor package 20.

Then, the antenna structure 32 is connected to the semiconductor chip 30 mounted on the interposer substrate 4 illustrated in FIG. 3B. For example, the microstrip line 33 is formed from the antenna terminal 31 on the above-described semiconductor chip 30, and the antenna 39 is formed at the front end of the microstrip line 33. A patch antenna having a predetermined length based on the wavelength λ of the millimeter wave signal S is used as the antenna 39, and for example, one side of the patch antenna has a length of about 600 μm. In addition to the patch antenna, a probe antenna (a dipole and the like), a loop antenna, or a small aperture coupling element (a slot antenna and the like) may be used as the antenna 39. The antenna structure 32 is achieved by the antenna terminal 31, the microstrip line 33, and the antenna 39 on the semiconductor chip 30.

Figure 3C:
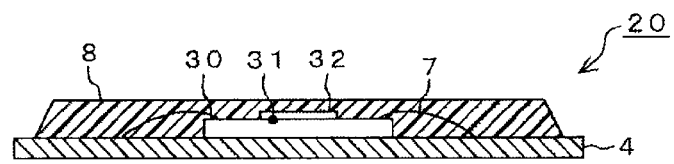
FIG. 3C is a process diagram illustrating a formation example of the semiconductor package 20.
Figure 3D:
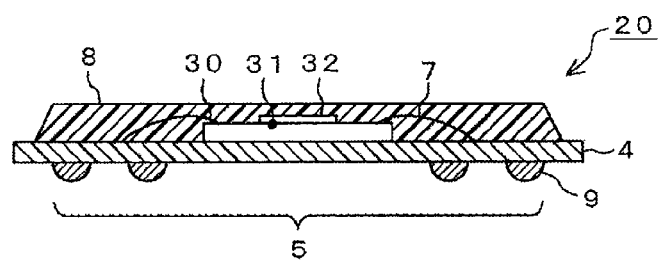
FIG. 3D is a process diagram illustrating a formation example of the semiconductor package 20.

In addition, as illustrated in FIG. 3C, the semiconductor chip 30 and the antenna structure 32 on the interposer substrate 4 are covered with the molded resin 8 so that the semiconductor chip 30 and the antenna structure 32 are insulated. An epoxy resin with a specific dielectric constant ∈1 is used as the molded resin 8. A resin obtained by synthesizing cresol novolac type epoxy resin (ECN) with a fused silica filler, or a biphenyl type epoxy resin is used as the epoxy resin. Thereafter, as illustrated in FIG. 3D, protrusion electrodes 9 (bumps) for flip-chip bonding are formed under the interposer substrate 4. The protrusion electrodes 9 include a solder member having a spherical shape.

Figure 3E:
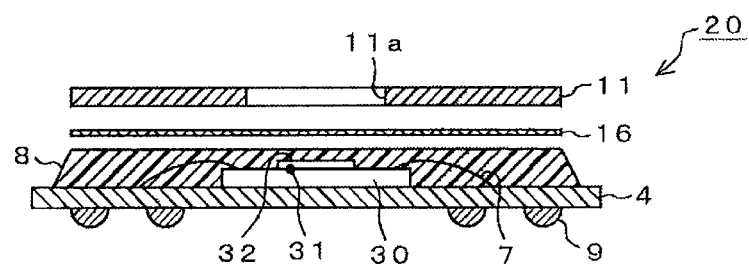
FIG. 3E is a process diagram illustrating a formation example of the semiconductor package 20.

Then, as illustrated in FIG. 3E, the dielectric transmission path 21 capable of transmitting a millimeter wave signal is formed on the molded resin 8. When forming the dielectric transmission path 21, for example, the metallic chassis 11 formed with the through portions 11a is formed on the molded resin 8. The through portion 11a matches with the upper portion of the antenna structure 32 of the semiconductor chip 30. In this example, the through portion 11a having a diameter φ is opened at a predetermined position of the chassis 11. Thereafter, a dielectric material is filled in the through portion 11a of the chassis 11 to form the dielectric transmission path 21 for a millimeter wave signal. A glass epoxy resin member with a specific dielectric constant ∈1 is used as the dielectric material.

When bonding the chassis 11 to the semiconductor package 20, a viscoelastic material 16, which includes a dielectric material capable of in-millimeter-wave dielectric transmission, may be inserted between the semiconductor package 20 and the dielectric transmission path 21. The viscoelastic material 16 produces a heat dissipation effect between the semiconductor package 20 and the chassis 11, and produces an effect of improving antenna coupling performance by improving an adhesion property with the dielectric transmission path 21. The viscoelastic material 16 has a predetermined specific dielectric constant and a predetermined dielectric loss tangent. As the viscoelastic material 16, for example, a dielectric material including an acryl resin-based, urethane resin-based, epoxy resin-based, silicon-based, or polyimide-based dielectric material is used. In order to transmit a millimeter wave signal in the viscoelastic material 16 at a high speed, it is preferable that the viscoelastic material 16 has a specific dielectric constant of about 3 to about 6 and a dielectric loss tangent of about 0.0001 to about 0.001.

In addition, the acryl resin-based dielectric material has a specific dielectric constant of about 2.5 to about 4.5 and a dielectric loss tangent of about 0.001 to about 0.05. The urethane resin-based dielectric material has a specific dielectric constant of about 2.8 to about 4.0 and a dielectric loss tangent of about 0.001 to about 0.05. The epoxy resin-based dielectric material has a specific dielectric constant of about 4.0 to about 6.0 and a dielectric loss tangent of about 0.001 to about 0.01. The silicon-based dielectric material has a specific dielectric constant of about 3.0 to about 6.0 and a dielectric loss tangent of about 0.0001 to about 0.001. The polyimide-based dielectric material has a specific dielectric constant of about 3.0 to about 4.0 and a dielectric loss tangent of about 0.001 to about 0.01. These dielectric materials can also be applied to the dielectric transmission path 21. In this way, the semiconductor package 20 capable of transmitting a millimeter wave signal is completed.

As described above, according to the semiconductor package 20 of the first embodiment, the semiconductor chip 30 and the antenna structure 32 on the interposer substrate 4 are covered with the molded resin 8 so that the semiconductor chip 30 and the antenna structure 32 are insulated, and the dielectric transmission path 21 is provided on the molded resin 8. Consequently, the dielectric transmission paths 21 of two semiconductor packages 20a and 20b, which have the same configuration and are capable of in-millimeter-wave dielectric transmission, are brought in contact while facing each other, and the semiconductor packages 20a and 20b operate. Thus, it is possible to transmit the millimeter wave signal S from one semiconductor package 20a to the other semiconductor package 20b. In addition, it is possible to perform high speed data transmission between the semiconductor packages 20a and 20b.

Since the molded resin 8 covered on the semiconductor chip 30 and the antenna structure 32 also constitutes an in-millimeter-wave dielectric transmission path, it is possible to reduce a mounting area of the semiconductor package 20. In this way, it is possible to easily construct an in-millimeter-wave dielectric transmission system (apparatus) capable of transmitting the millimeter wave signal S using a simple and inexpensive configuration in one direction or two directions, without depending on a connector having a large number of terminals and a printed wiring sheet cable.

Furthermore, in a mounting substrate for mounting the semiconductor package 20, terminal electrodes formed at the substrate-side are replaced with the antenna structure 32 applied to the antenna coupling unit 203. As a consequence, since it is possible to form the antenna structure 32 with the smallest size, a package size can be miniaturized. In addition, in the mounting substrate, the number of wirings is reduced. As a consequence, it is possible to reduce the number of layers when forming a multilayer substrate.

<Second Embodiment>
[Configuration Example of In-Millimeter-Wave Dielectric Transmission Device 200]

Figure 4:
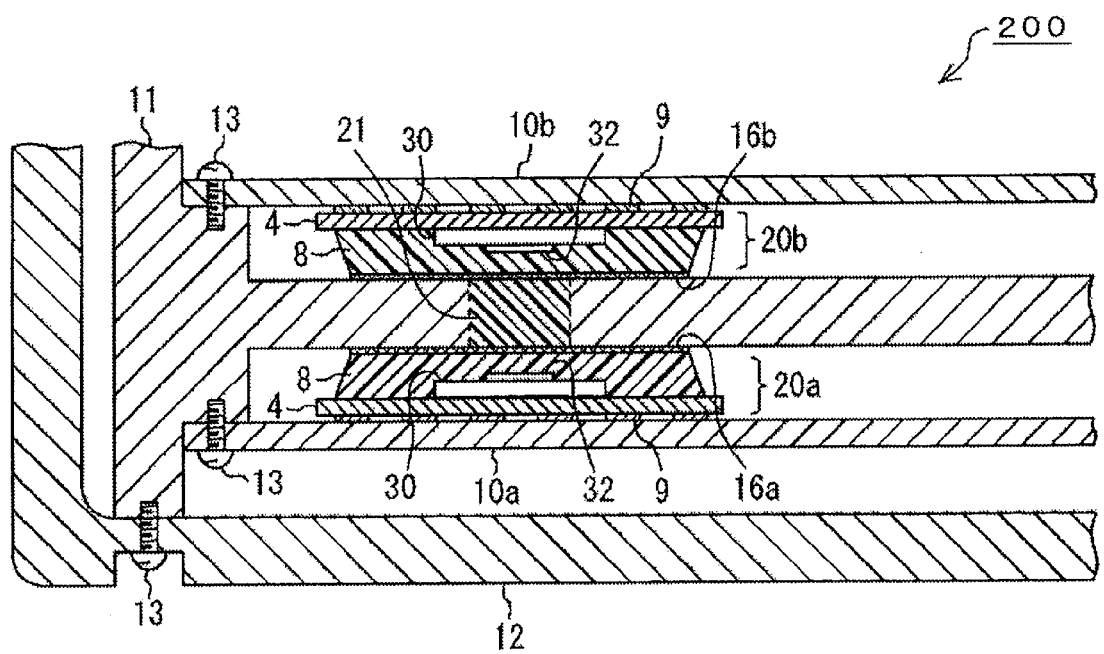
FIG. 4 is a sectional view illustrating a configuration example of an in-millimeter-wave dielectric transmission device 200 as a second embodiment.

In this embodiment, as illustrated in FIG. 4, the chassis 11 provided with a dielectric transmission path is interposed between the two semiconductor packages 20a and 20b, which are capable of in-millimeter-wave dielectric transmission, and they are stacked.

The in-millimeter-wave dielectric transmission device 200 illustrated in FIG. 4 includes mounting substrates 10a and 10b, the chassis 11, the housing 12, and the semiconductor packages 20a and 20b. The two semiconductor packages 20a and 20b are arranged such that the surfaces thereof contact the chassis 11. The housing 12 is a set box (a case) of a digital recording reproduction apparatus, a terrestrial television receiver, a cell phone, a game machine, a computer or a communication apparatus or the like.

The chassis 11 provided with the dielectric transmission path 21 is mounted in the housing 12. The chassis 11 is fixed to the lateral side, the bottom surface, the upper surface and the like in the housing 12 using the screw structure 13. The mounting substrates 10a and 10b are mounted in the chassis 11. In this example, two upper and lower spaces for substrate mounting are provided at predetermined positions of the chassis 11, and the substrates 10a and 10b are mounted in the two spaces using the screw structure 13 with the chassis 11 interposed therebetween, respectively.

The semiconductor package 20a is mounted on the lower substrate 10a. The semiconductor package 20 described in the first embodiment is used as the semiconductor package 20a. The lower substrate 10a is soldered to the semiconductor package 20a using the protrusion electrodes 9 such as bumps according to the flip-chip bonding method in the related art. In the semiconductor package 20a, the semiconductor chip 30 capable of millimeter-wave band communication is provided on one interposer substrate 4. The antenna structure 32 is connected to the semiconductor chip 30. The semiconductor chip 30 and the antenna structure 32 on the interposer substrate 4 are covered with the molded resin 8.

The semiconductor package 20b is mounted downward from the upper substrate 10b. The semiconductor package 20b is mounted with its posture reversed at an angle of 180°, as compared with the semiconductor package 20a. The semiconductor package 20 described in the first embodiment is used as the semiconductor package 20b. The upper substrate 10a is soldered to the semiconductor package 20b using protrusion electrodes 9 such as bumps according to the flip-chip bonding method in the same manner as that in the related art. In this example, in the semiconductor package 20b, the semiconductor chip 30 capable of millimeter-wave band communication is provided under the other interposer substrate 4. The antenna structure 32 is connected to the semiconductor chip 30 in the same manner as the semiconductor package 20a. The semiconductor chip 30 and the antenna structure 32 under the interposer substrate 4 are covered with the molded resin 8.

The in-millimeter-wave dielectric transmission device 200 has a stack structure in which the chassis 11 is mounted such that the antenna structures 32 of the two semiconductor packages 20a and 20b face each other. The antenna structure 32 of the semiconductor package 20a is provided on the semiconductor chip 30 of the interposer substrate 4 of the semiconductor package 20a. The antenna structure 32 of the semiconductor package 20b is provided under the semiconductor chip 30 under the interposer substrate 4 of the semiconductor package 20b. A patch antenna is used as each antenna structure 32. In this example, the antenna structures 32 are formed on the surfaces of the semiconductor packages 20a and 20b while making direct contact with the dielectric transmission path 21. The stack structure as described above is employed, so that it is possible to improve antenna coupling performance. In this example, the semiconductor package 20a mounted on the lower substrate 10a is fixed to the chassis 11 via a viscoelastic material 16 while making close contact with the chassis 11. A viscoelastic resin with a specific dielectric constant $\in 4$ is used as the viscoelastic material 16. In the same manner, the semiconductor package 20b mounted under the upper substrate 10b is also fixed to the chassis 11 via a viscoelastic material 16 while making close contact with the chassis 11. The semiconductor packages 20a and 20b are fixed using the viscoelastic material 16 to prevent a material having a different specific dielectric constant $\in 1$ from being interposed into the dielectric transmission path 21.

The dielectric transmission path 21 capable of transmitting a millimeter wave signal is provided between the semiconductor package 20a and the semiconductor package 20b, and the semiconductor packages 20a and 20b are mounted such that the antenna structures 32 of the semiconductor packages 20a and 20b face each other with the dielectric transmission path 21 interposed therebetween. The inner portion indicated by broken lines in the chassis 11 denotes the dielectric transmission path 21.

The dielectric transmission path 21 is arranged at the position at which the upper portion of the antenna structure 32 of the semiconductor package 20a matches with the lower portion of the antenna structure 32 of the semiconductor package 20b. In this example, the through portion 11a (refer to FIG. 5) is provided at the portion of the chassis 11 for allowing the upper antenna structure 32 to match with the lower antenna structure 32. A dielectric material 21' is filled in the through portion 11a, thereby forming the dielectric transmission path 21. A glass epoxy resin and the like with a specific dielectric constant $\in 1$ is used as the dielectric material 21'.

The in-millimeter-wave dielectric transmission device 200 is configured as above, so that the two semiconductor packages 20a and 20b operate. A millimeter wave signal S is transmitted between the antenna structures 32 of the semiconductor packages 20a and 20b as electromagnetic waves S' via the molded resin 8, the viscoelastic material 16, and the dielectric transmission path 21 inside the chassis 11. In this way, it is possible to perform a bidirectional communication process based on the millimeter wave signal S between one semiconductor package 20a and the other semiconductor package 20b via the dielectric material 21' provided in the through portion 11a of the chassis 11, which constitutes the dielectric transmission path 21. In addition, there is no need for the connector 14 and the cable 15 which are used in the configuration of the circuit mounting substrate illustrated in FIG. 39 in the related art.

[Assembling Example of In-Millimeter-Wave Dielectric Transmission Device 200]

Figure 5:
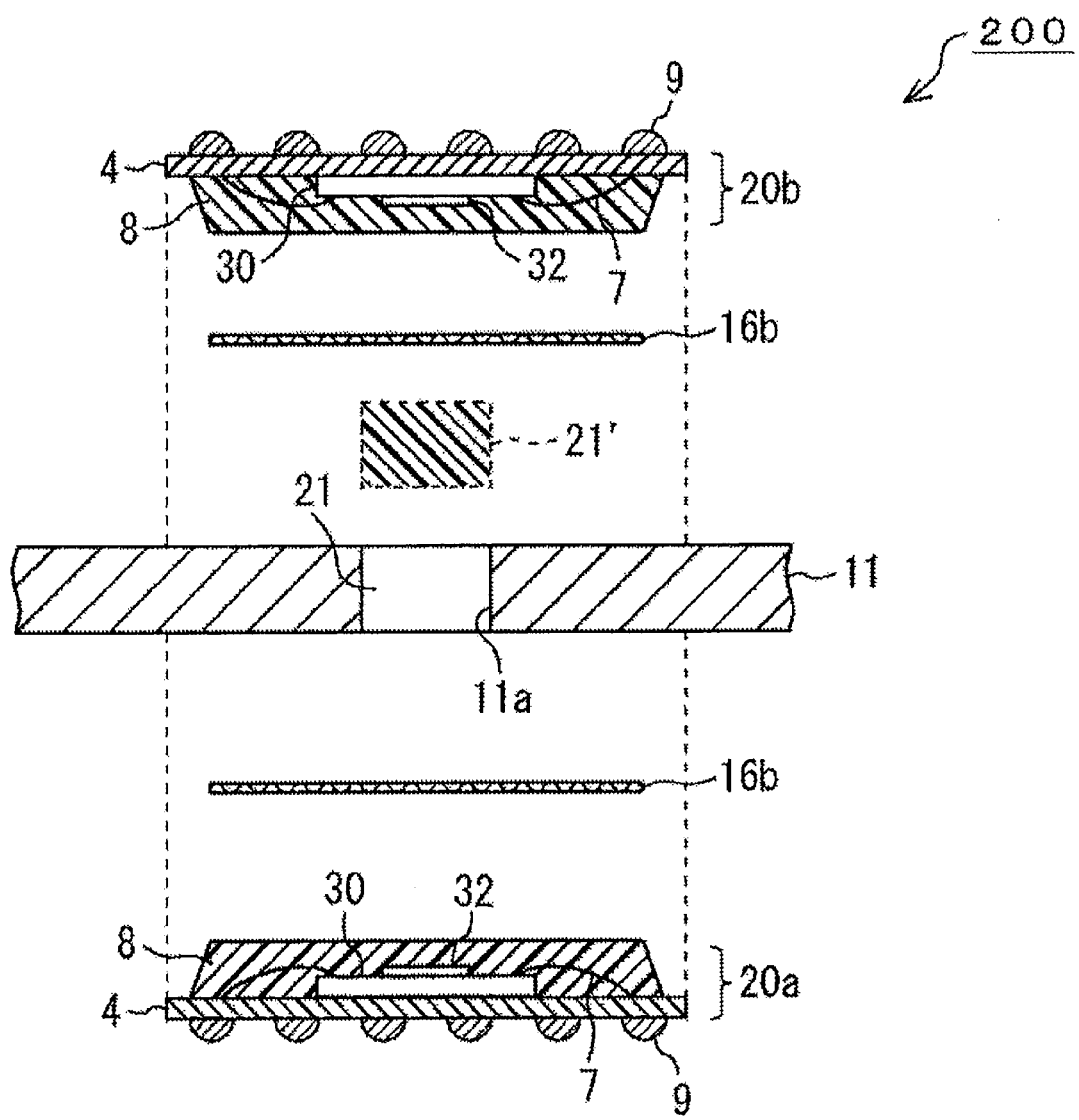
FIG. 5 is sectional views illustrating an example of assembling the in-millimeter-wave dielectric transmission device 200.

Next, the manufacturing method of the in-millimeter-wave dielectric transmission device 200 will be described with reference to FIG. 5. In this example, during manufacture of the in-millimeter-wave dielectric transmission device 200 illustrated in FIG. 4, the semiconductor packages 20a and 20b are first formed. In the semiconductor package 20a, the semiconductor chip 30 capable of millimeter-wave band communication is provided on one interposer substrate 4. Next, the antenna structure 32 is connected to the semiconductor chip 30. Then, the semiconductor chip 30 and the antenna structure 32 on the interposer substrate 4 are covered with the molded resin 8 so that the semiconductor chip 30 and the antenna structure 32 are insulated. In this way, it is possible to form the semiconductor package 20a which are capable of in-millimeter-wave dielectric transmission (refer to FIGS. 3A to 3E).

In the semiconductor package 20b, the semiconductor chip 30 capable of millimeter-wave band communication is provided on the other (separate) interposer substrate 4. Next, the antenna structure 32 is connected to the semiconductor chip 30. Then, the semiconductor chip 30 and the antenna structure 32 on the interposer substrate 4 are covered with the molded resin 8 so that the semiconductor chip 30 and the antenna structure 32 are insulated. In this way, it is possible to form the semiconductor package 20b which are capable of in-millimeter-wave dielectric transmission (refer to FIGS. 3A to 3E).

Next, the dielectric transmission path 21 capable of transmitting a millimeter wave signal is formed between the semiconductor package 20a and the semiconductor package 20b. When forming the dielectric transmission path 21, the through portion 11a having a cylindrical shape, for example, is formed at a predetermined position of the chassis 11 made of a metal. Then, the dielectric material 21' is filled in the through portion 11a. For example, a member for a resin stopper is brought into contact with one side of the through portion 11a, and the dielectric material 21' is coated from the upper portion of the through portion 11a in a bottomed state using a squeegee and the like. In this way, a dielectric waveguide is formed.

Thereafter, the two semiconductor packages 20a and 20b are mounted in the chassis 11 such that the antenna structure 32 of the semiconductor package 20a and the antenna structure 32 of the semiconductor package 20b face each other with the dielectric transmission path 21 interposed therebetween. At this time, the semiconductor packages 20a and 20b are positioned such that the center of the antenna 39 of the antenna structure 32 of the semiconductor package 20a coincides with the center of the antenna 39 of the antenna structure 32 of the semiconductor package 20b.

Furthermore, when mounting the semiconductor packages 20a and 20b in the chassis 11, the upper surface of the semiconductor package 20a adheres to (is closely fixed to) the lower surface of the chassis 11 via the viscoelastic material 16a. In the same manner, the lower surface of the semiconductor package 20b adheres to the upper surface of the chassis 11 via the viscoelastic material 16a. In this way, the in-millimeter-wave dielectric transmission device 200 illustrated in FIG. 4 is completed.

[Internal Configuration Example of In-Millimeter-Wave Dielectric Transmission Device 200]

Figure 6:
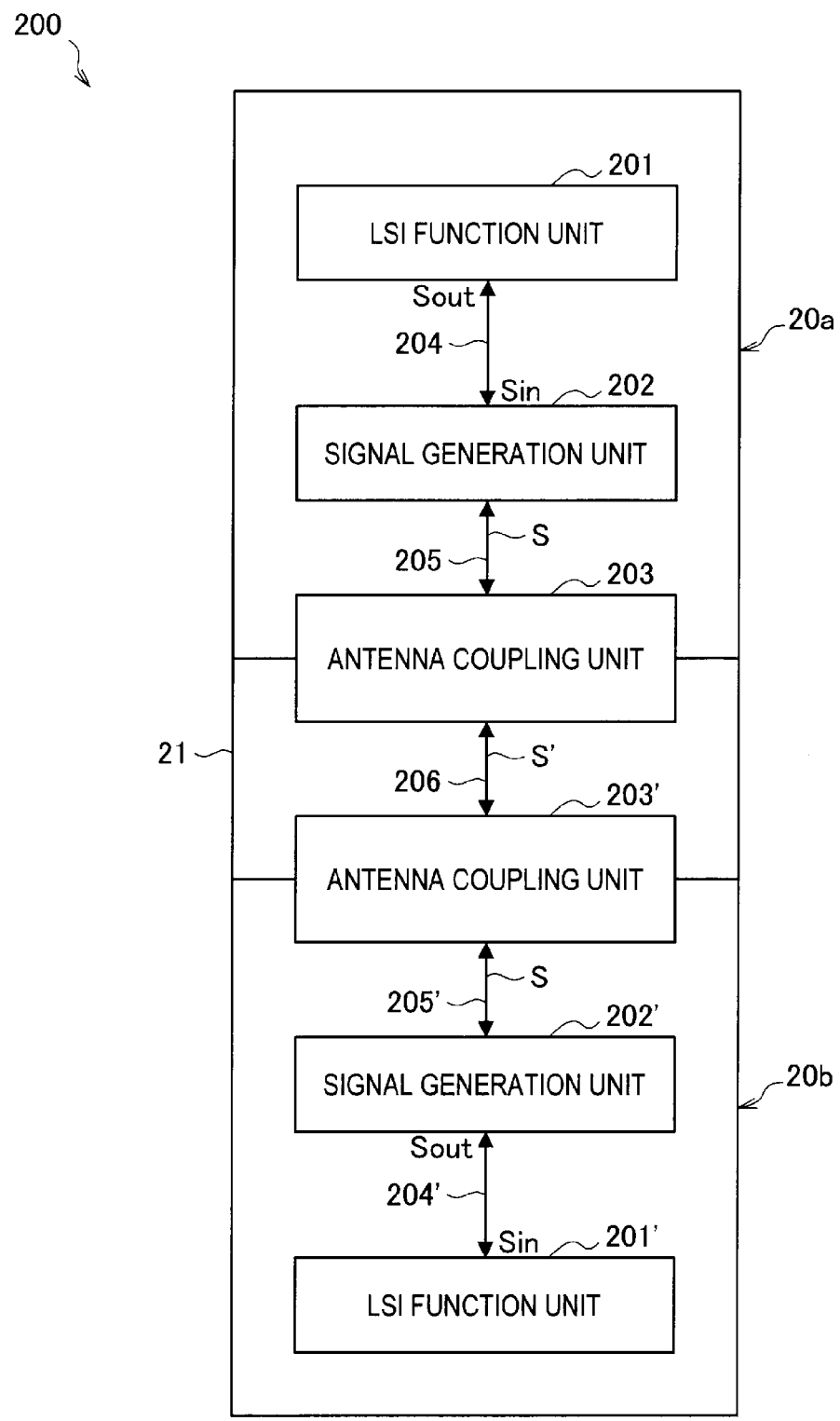
FIG. 6 is a block diagram illustrating an internal configuration example of the in-millimeter-wave dielectric transmission device 200.

Next, the internal configuration example of the in-millimeter-wave dielectric transmission device 200 will be described with reference to FIG. 6. The in-millimeter-wave dielectric transmission device 200 illustrated in FIG. 6 includes the semiconductor package 20a, the dielectric transmission path 21, and the semiconductor package 20b.

The semiconductor package 20a includes an LSI function unit 201, a signal generation unit 202, and an antenna coupling unit 203. The function of the LSI function unit 201, and the internal configurations of the signal generation unit 202 and the antenna coupling unit 203 are as illustrated in FIG. 2. An electrical interface 204 between the LSI function unit 201 and the signal generation unit 202 is an interface for data transmission provided by pad electrodes 3 and is realized by an electrical wiring, in the semiconductor chip 2 in the related art.

A millimeter wave interface 205 between the signal generation unit 202 and the antenna coupling unit 203 is an interface for millimeter wave transmission provided by the antenna terminal 31 and the microstrip line 33 illustrated in FIG. 2. The signal generation unit 202 converts an input (electrical) signal Sin provided through the interface 204 to a millimeter wave signal S. Furthermore, the signal generation unit 202 converts a millimeter wave signal S provided through the millimeter wave interface 205 to an output (electrical) signal Sout.

The semiconductor package 20b includes an LSI function unit 201', a signal generation unit 202', and an antenna coupling unit 203'. Since the function of the LSI function unit 201', and the internal configurations of the signal generation unit 202' and the antenna coupling unit 203' are the same as those of the LSI function unit 201, the signal generation unit 202 and the antenna coupling unit 203 illustrated in FIG. 2, description thereof will be omitted.

A millimeter wave interface 205' between the signal generation unit 202' and the antenna coupling unit 203' is an interface for millimeter wave transmission provided by the antenna terminal 31 and the microstrip line 33 illustrated in FIG. 2. The signal generation unit 202' converts an input (electrical) signal Sin provided through the interface 204' to a millimeter wave signal S. Furthermore, the signal generation unit 202' converts a millimeter wave signal S provided through the millimeter wave interface 205' to an output (electrical) signal Sout.

The dielectric transmission path 21 includes a dielectric section 206 between the antenna coupling unit 203 and the antenna coupling unit 203' as described above. The antenna coupling unit 203 transfers the millimeter wave signal S provided through the interface 205 of the millimeter wave signal S to the dielectric transmission path 21. In this way, it is possible to efficiently transmit the millimeter wave signal S to the other antenna coupling unit 203' via the dielectric section 206. Here, the term 'efficiently' indicates that a transmission characteristic between the antenna coupling units 203 and 203' is high, and reflection characteristics in the antenna coupling units 203 and 203' are low in a predetermined millimeter-band frequency of 30 GHz to 300 GHz.

[Enlargement Configuration Example of In-Millimeter-Wave Dielectric Transmission Device 200]

Next, the enlargement configuration example of the in-millimeter-wave dielectric transmission device 200 illustrated in FIG. 4 will be described with reference to FIG. 7.

Figure 7:
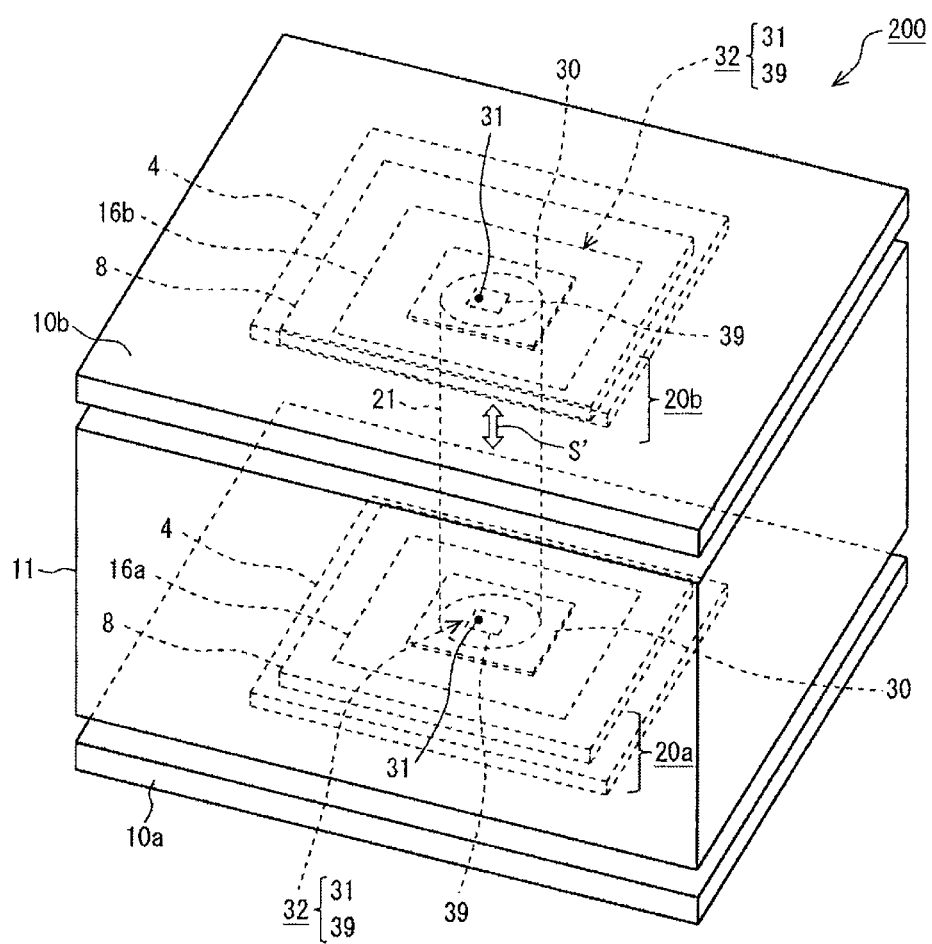
FIG. 7 is a perspective view illustrating an enlargement configuration example of the in-millimeter-wave dielectric transmission device 200 illustrated in FIG. 4.

According to the in-millimeter-wave dielectric transmission device 200 illustrated in FIG. 7, the antenna structures 32 of the semiconductor packages 20a and 20b use patch antennas as the antennas 39. In the semiconductor package 20a, the antenna 39 is loaded on the semiconductor chip 30 and is directly connected to the antenna terminal 31 formed on the surface of the semiconductor chip, or is connected to the antenna terminal 31 using a bonding wire. Since the antenna 39 is formed on the surface of the semiconductor chip 30, it is possible to employ a structure in which the antenna 39 makes direct contact with the dielectric transmission path 21. The semiconductor package 20b is also configured in the same manner as the semiconductor package 20a.

In FIG. 7, a cylindrical portion indicated by broken lines is the dielectric transmission path 21. According to the stack structure of the in-millimeter-wave dielectric transmission device 200, the two semiconductor packages 20a and 20b are mounted in the chassis 11 such that the antenna structures 32 of the semiconductor packages 20a and 20b face each other with the dielectric transmission path 21 interposed therebetween. The dielectric transmission path 21, for example, is arranged (constructed) such that the antenna structures 32 are in a see-through range.

In the semiconductor package 20a, the millimeter wave signal S is transferred to the antenna structure 32 via the antenna terminal 31. The antenna structure 32 irradiates a millimeter wave signal S to the dielectric transmission path 21 via the antenna 39. In the semiconductor package 20b, the antenna structure 32 receives electromagnetic waves S' from the dielectric transmission path 21 and transfers a millimeter wave signal S to the antenna terminal 31. In this way, it is possible to perform a communication process using the dielectric transmission path 21 between the semiconductor packages 20a and 20b.

[Example of Simulation Model]

Next, the example of a simulation model for verifying the transmission characteristic and the reflection characteristic of the in-millimeter-wave dielectric transmission device 200 will be described with reference to FIG. 8. The simulation model illustrated in FIG. 8 employs the configuration example of the in-millimeter-wave dielectric transmission device 200 illustrated in FIG. 7. Table 1 collectively shows parameters set in the simulation model.

TABLE 1

| | |
|---|---|
| Length l1 of one side of molded resin | 10 mm |
| Thickness t1 of molded resin | 0.8 mm |
| Specific dielectric constant ∈1 of molded resin | 4 |
| Dielectric loss tangent tan δ1 of molded resin | 0.01 |
| Length l2 of one side of patch antenna | 1.1 mm |
| Length l3 of microstrip line | 1 mm |
| Width w1 of microstrip line | 0.03 mm |
| Thickness t2 of dielectric of microstrip line | 0.1 mm |
| Thickness t3 of microstrip line | 0.018 mm |
| Specific dielectric constant ∈2 of interposer substrate | 3.5 |
| Dielectric loss tangent tan δ2 of interposer substrate | 0.01 |
| Impedance Z of antenna terminal | 108 Ω |
| Diameter φ of dielectric transmission path | 2.75 mm |
| Length l4 of dielectric transmission path | 4.8 mm |
| Specific dielectric constant ∈3 of dielectric transmission path | 4.0 |
| Dielectric loss tangent tan δ3 of dielectric transmission path | 0.01 |
| Thickness t4 of viscoelastic material | 0.13 mm |
| Specific dielectric constant ∈4 of viscoelastic material | 4.0 |
| Dielectric loss tangent tan δ4 of viscoelastic material | 0.01 |

Figure 8:
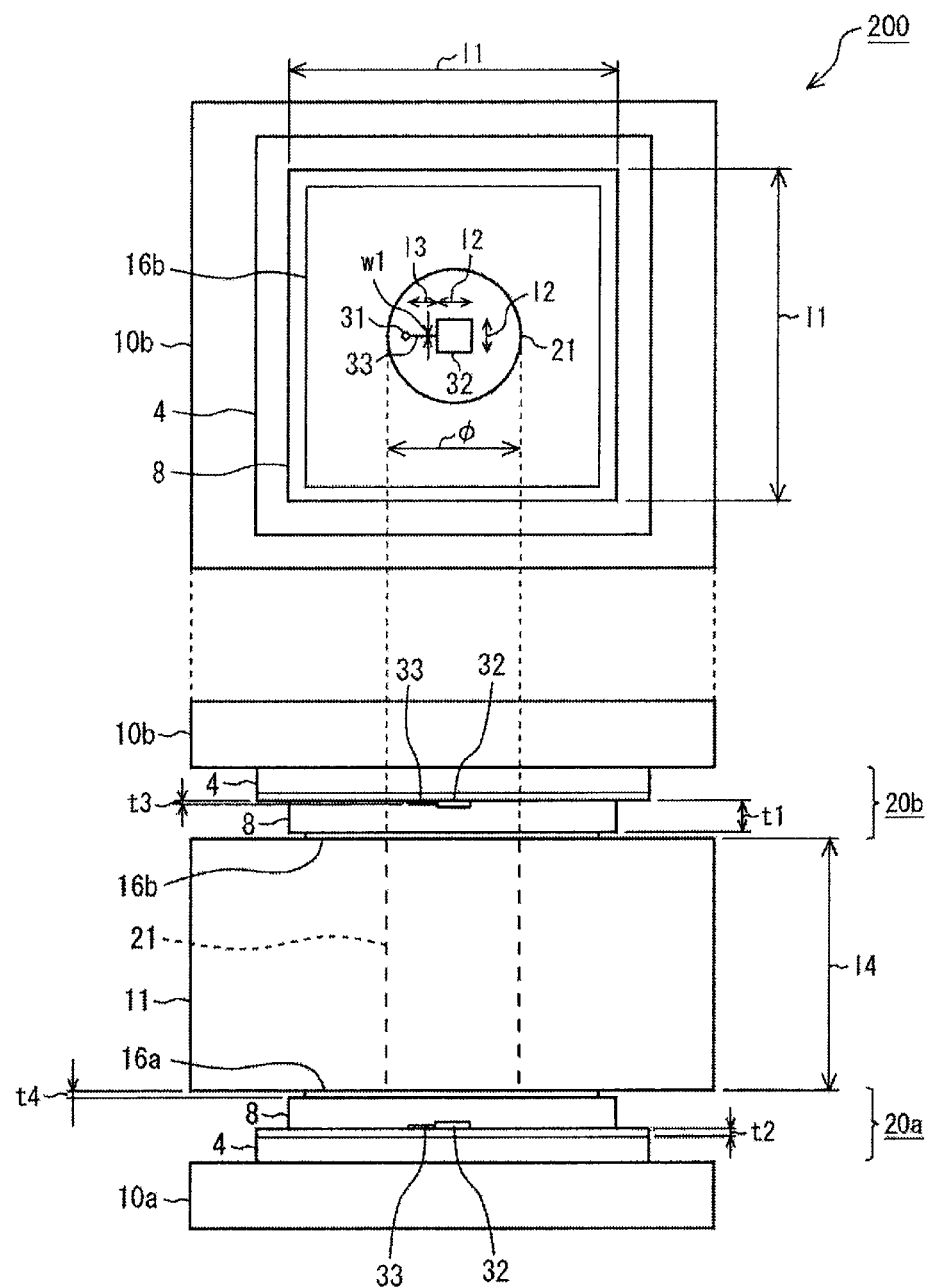
FIG. 8 is an explanation diagram illustrating a simulation model example for verifying transmission characteristics and reflection characteristics of the in-millimeter-wave dielectric transmission device 200.

In Table 1, l1 denotes the length of one side of the molded resin 8 of the simulation model illustrated in FIG. 8 and is set to 10 mm in the simulation model. t1 denotes the thickness of the molded resin 8 and is set to 0.8 mm in the model. ∈1 denotes the specific dielectric constant of the molded resin 8 and is set to 4 in the same manner. tan δ1 denotes the dielectric loss tangent of the molded resin 8 and is set to 0.01 in the model.

Furthermore, 12 denotes the length of one side of the antenna 39 (the patch antenna) illustrated in the same drawing and is set to 1.1 mm in the model. 13 denotes the length of the microstrip line 33 and is set to 1 mm in the model. w1 denotes the width of the microstrip line 33 and is set to 0.03 mm in the model. t2 denotes the thickness of the dielectric of the microstrip line 33 and is set to 0.1 mm in the model. t3 denotes the thickness of the microstrip line 33 and is set to 0.018 mm in the model. ∈2 denotes the specific dielectric constant of the interposer substrate 4 illustrated in the same drawing and is set to 3.5 in the model. tan δ2 denotes the dielectric loss tangent of the interposer substrate 4 and is set to 0.01 in the model.

Z denotes the impedance of the antenna terminal 31 illustrated in the same drawing and is set to 108Ω in the model. φ denotes the diameter of the dielectric transmission path 21 illustrated in the same drawing and is set to 2.75 mm in the model. 14 denotes the length of the dielectric transmission path 21 and is set to 4.8 mm in the model. ∈3 denotes the specific dielectric constant of the dielectric transmission path 21 (the dielectric material 21') and is set to 4.0 in the model. tan δ3 denotes the dielectric loss tangent of the dielectric transmission path 21 and is set to 0.01 in the model.

t4 denotes the thickness of the viscoelastic material illustrated in the same drawing and is set to 0.13 mm in the model. ∈4 denotes the specific dielectric constant of the viscoelastic material and is set to 4.0 in the model. tan δ4 denotes the dielectric loss tangent of the viscoelastic material 16 and is set to 0.01 in the model. In addition, the same parameters are provided to the upper and lower semiconductor packages 20a and 20b illustrated in the same drawing.

[Example of Simulation Characteristics]

Next, the example of the simulation characteristics of the in-millimeter-wave dielectric transmission device 200 will be described with reference to FIG. 9. The example of the simulation characteristics illustrated in FIG. 9 illustrates examples of the transmission characteristic and the reflection characteristic between the antenna terminals 31, which are provided to the simulation model of the in-millimeter-wave dielectric transmission device 200 illustrated in FIG. 8.

Figure 9:
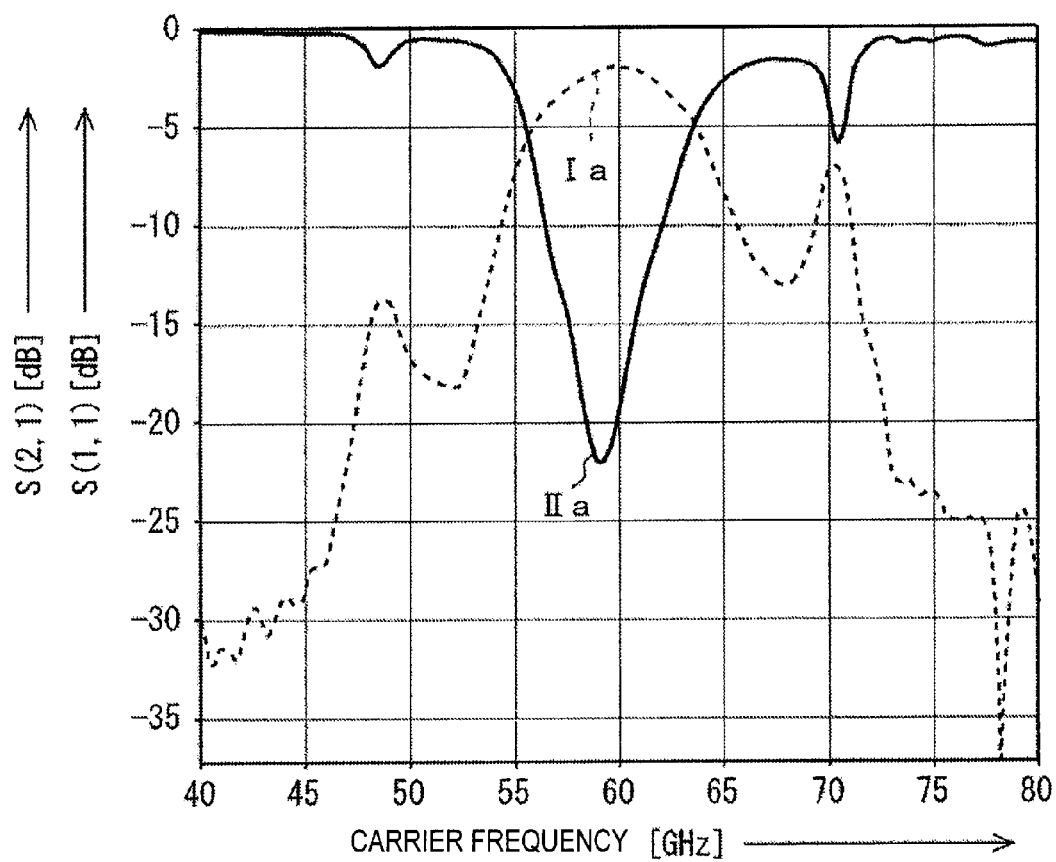
FIG. 9 is a graph illustrating an example of simulation characteristics of the in-millimeter-wave dielectric transmission device 200.

In FIG. 9, a vertical axis denotes a transmission characteristic S (2, 1) dB and a reflection characteristic S (1, 1) dB. A horizontal axis denotes a carrier frequency f (GHz) and a scale is in units of 5 GHz. In FIG. 9, Ia indicated by broken lines denotes the example of the transmission characteristic. The example Ia of the transmission characteristic is shown when the dielectric transmission path 21 includes the viscoelastic materials 16a and 16b and the dielectric material 21', and the antenna coupling units 203 and 203' of the upper and lower semiconductor packages 20a and 20b include the microstrip lines 33 and the antennas 39, respectively.

In the transmission characteristic S (2, 1) dB, the carrier frequency f is increased in units of 1 GHz in the range of 40 GHz to 80 GHz. According to the transmission characteristic S (2, 1) dB between the antenna terminals 31, electromagnetic waves S' based on a millimeter wave signal S are irradiated from the antenna terminal 31 of the semiconductor package 20a. The electromagnetic waves S' pass through the viscoelastic material 16a with a dielectric loss tangent tan δ4 of 0.01 from the molded resin 8 with a dielectric loss tangent tan δ1 of 0.01. Then, the electromagnetic waves S' are transmitted to the dielectric transmission path 21 including the dielectric material 21' with a dielectric loss tangent tan δ3 of 0.01.

In addition, the electromagnetic waves S' pass through the viscoelastic material 16b of the semiconductor package 20b, which has a dielectric loss tangent tan δ4 of 0.01, and propagate to the molded resin 8 with a dielectric loss tangent tan δ1 of 0.01. Then, the transmission characteristic when the electromagnetic waves S' reach the antenna terminal 31 of the semiconductor package 20b is verified using the simulation model. In such a case, the example Ia of the transmission characteristic between the antenna terminals 31 is shown on the frequency characteristic diagram.

According to the simulation result, it is apparent that the electromagnetic waves S' based on the millimeter wave signal S are attenuated by about −2.1 dB around the carrier frequency f of 59 GHz between the antenna terminals 31. In other words, passing loss has a minimum value of about 2.1 dB around the carrier frequency f of 59 GHz.

Furthermore, in FIG. 9, IIa indicated by a solid line denotes the example of the reflection characteristic between the antenna terminals 31. In the reflection characteristic S (1, 1) dB, the carrier frequency f is increased in units of 1 GHz in the range of 40 GHz to 80 GHz. According to the reflection characteristic S (1, 1) dB between the antenna terminals 31, the electromagnetic waves S' based on the millimeter wave signal S are irradiated from the antenna terminal 31 of the semiconductor package 20a. The electromagnetic waves S' pass through the viscoelastic material 16a with a dielectric loss tangent tan δ4 of 0.01 from the molded resin 8 with a dielectric loss tangent tan δ1 of 0.01. Then, the electromagnetic waves S' are transmitted to the dielectric transmission path 21 including the dielectric material 21' with a dielectric loss tangent tan δ3 of 0.01.

In addition, the electromagnetic waves S' pass through the viscoelastic material 16b of the semiconductor package 20b, which has a dielectric loss tangent tan δ4 of 0.01, and propagate to the molded resin 8 with a dielectric loss tangent tan δ1 of 0.01. Then, the reflection characteristic when the electromagnetic waves S' reach the antenna terminal 31 of the semiconductor package 20b is verified using the simulation model. In such a case, the example IIa of the reflection characteristic between the antenna terminals 31 is shown on the frequency characteristic diagram.

According to the simulation result, the electromagnetic waves S' based on the millimeter wave signal S are reflected by about −22 dB around the carrier frequency f of 59 GHz between the antenna terminals 31. In other words, reflection loss has a minimum value of about −22 dB around the carrier frequency f of 59 GHz.

As described above, according to the in-millimeter-wave dielectric transmission device 200 as the second embodiment, the semiconductor packages 20a and 20b provided with the semiconductor chips 30 capable of millimeter-wave band communication are arranged such that the antenna structures 32 of the semiconductor packages 20a and 20b face each other with the dielectric transmission path 21 interposed therebetween.

Consequently, it is possible to transmit the millimeter wave signal S from the semiconductor package 20a to the semiconductor package 20b via the dielectric transmission path 21 provided between the semiconductor package 20a and the semiconductor package 20b. Since the molded resin 8 covering the semiconductor chips 30 and the antenna structures 32 of the semiconductor packages 20a and 20b also constitutes the in-millimeter-wave dielectric transmission path, it is possible to reduce the mounting area of the semiconductor package 20a. Moreover, it is possible to provide a configuration capable of reducing the number of wirings to the semiconductor package 20a on the lower substrate 10a and wirings to the semiconductor package 20b under the upper substrate 10b while maintaining the transmission capacity from the semiconductor package 20a to the semiconductor package 20b.

Furthermore, the viscoelastic material 16 arranged between the semiconductor packages 20a and 20b and the chassis 11 improves the adhesion property between the semiconductor packages 20a and 20b and the dielectric transmission path 21. Since the dielectric transmission path 21 formed in the chassis 11 is arranged such that the surfaces of the semiconductor packages 20a and 20b make close contact with each other, the structure of the chassis 11 for fixing the substrate 10, on which the semiconductor packages 20a and 20b are mounted, can also be achieved.

Moreover, it is possible to transmit the millimeter wave signal S between the semiconductor packages 20a and 20b making close contact with the front and rear surfaces of the chassis 11. Furthermore, since the chassis 11 commonly uses a part of the dielectric transmission path 21, the configuration of an electronic device can be simplified. In this way, it is possible to easily construct the in-millimeter-wave dielectric transmission device 200 capable of transmitting the millimeter wave signal S in one direction or two directions, without depending on a connector having a number of terminals and a printed wiring sheet cable.

<Third Embodiment>

[Configuration Example of In-Millimeter-Wave Dielectric Transmission Device 300]

The configuration example of the in-millimeter-wave dielectric transmission device 300 as the third embodiment will be described with reference to FIG. 10. In this embodiment, the chassis 11 provided between the semiconductor packages 20a and 20b in the second embodiment is omitted, and the dielectric transmission path 21 includes only the molded resin 8 and the viscoelastic material 16.

Figure 10:
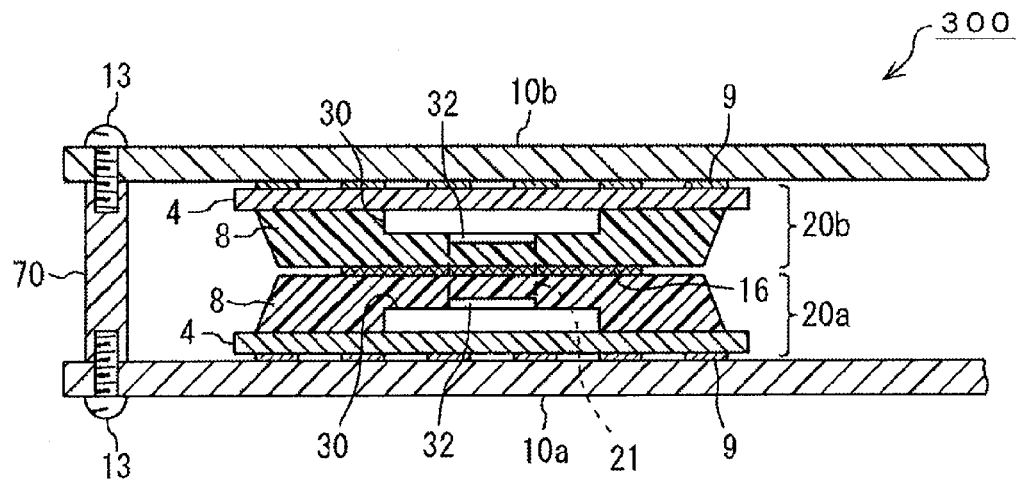
FIG. 10 is a sectional view illustrating a configuration example of an in-millimeter-wave dielectric transmission device 300 as a third embodiment.

According to the in-millimeter-wave dielectric transmission device 300 illustrated in FIG. 10, the viscoelastic material 16 having a heat dissipation function is provided at a bonding portion between the semiconductor packages 20a and 20b and constitutes the dielectric transmission path 21 capable of millimeter-wave band communication. The viscoelastic material 16 uses the dielectric material 21' capable of millimeter-wave band communication. In this example, the chassis 11 is omitted from the in-millimeter-wave dielectric transmission device 200 illustrated in FIG. 4. That is, a millimeter wave signal is transmitted between the semiconductor packages 20a and 20b only via the viscoelastic material 16.

The semiconductor package 20a is mounted on the lower mounting substrate 10a. The semiconductor package 20 described in the first embodiment is used as the semiconductor package 20a. The lower substrate 10a is soldered to the semiconductor package 20a using the protrusion electrodes 9 such as bumps according to the flip-chip bonding method in the related art. In the semiconductor package 20a, the semiconductor chip 30 capable of millimeter-wave band communication is provided on one interposer substrate 4. The antenna structure 32 is connected to the semiconductor chip 30. The semiconductor chip 30 and the antenna structure 32 on the interposer substrate 4 are covered with the molded resin 8.

The semiconductor package 20b is mounted downward from the upper mounting substrate 10b. The semiconductor package 20b is mounted with its posture reversed at an angle of 180°, as compared with the semiconductor package 20a. The semiconductor package 20 described in the first embodiment is used as the semiconductor package 20b. The upper substrate 10b is soldered to the semiconductor package 20b using the protrusion electrodes 9 such as bumps according to the flip-chip bonding method in the related art. In this example, in the semiconductor package 20b, the semiconductor chip 30 capable of millimeter-wave band communication is provided under the other interposer substrate 4. The antenna structure 32 is connected to the semiconductor chip 30 in the same manner as the semiconductor package 20a. The semiconductor chip 30 and the antenna structure 32 under the interposer substrate 4 are covered with the molded resin 8.

The lower mounting substrate 10a and the upper mounting substrate 10b are mounted using a strut 70. The substrates 10a and 10b, for example, are fixed to the strut 70 using the screw structure 13. A metal member having a rod shape is used as the strut 70. In this example, the strut 70 is provided at both ends thereof with female screws. Even in this example, although not illustrated in the drawing, the millimeter wave signal S is transmitted between the antenna structures 32 via a dielectric transmission path including the molded resin 8 and the viscoelastic material 16.

As described above, according to the in-millimeter-wave dielectric transmission device 300 of the third embodiment, the chassis 11 illustrated in FIG. 4 is omitted, and the viscoelastic material 16 is provided between the semiconductor packages 20a and 20b.

With such a structure, since it is possible to improve the adhesion property between the semiconductor package 20a and the semiconductor package 20b, the improvement of antenna coupling performance can be compatible with the heat dissipation effect of the semiconductor packages 20a and 20b.

In addition, since the viscoelastic material 16 constituting the dielectric transmission path 21 between the semiconductor packages 20a and 20b is also used as a heat dissipation material, it is possible to discharge heat generated between the semiconductor packages 20a and 20b. Furthermore, it is possible to transmit the millimeter wave signal S between the two semiconductor packages 20a and 20b via the viscoelastic material 16 constituting the dielectric transmission path 21.

<Fourth Embodiment>

[Configuration Example of Semiconductor Package 20c]

Next, the configuration example of the semiconductor package 20c will be described as the fourth embodiment with reference to FIG. 11. In this example, an antenna structure 32' is provided in parallel to the semiconductor chip 30 of the interposer substrate 4. The semiconductor package 20c including the antenna structure 32' provides the structure of an in-millimeter-wave dielectric transmission device 400 with a package-on-package structure (hereinafter, referred to as a POP structure).

Figure 11:
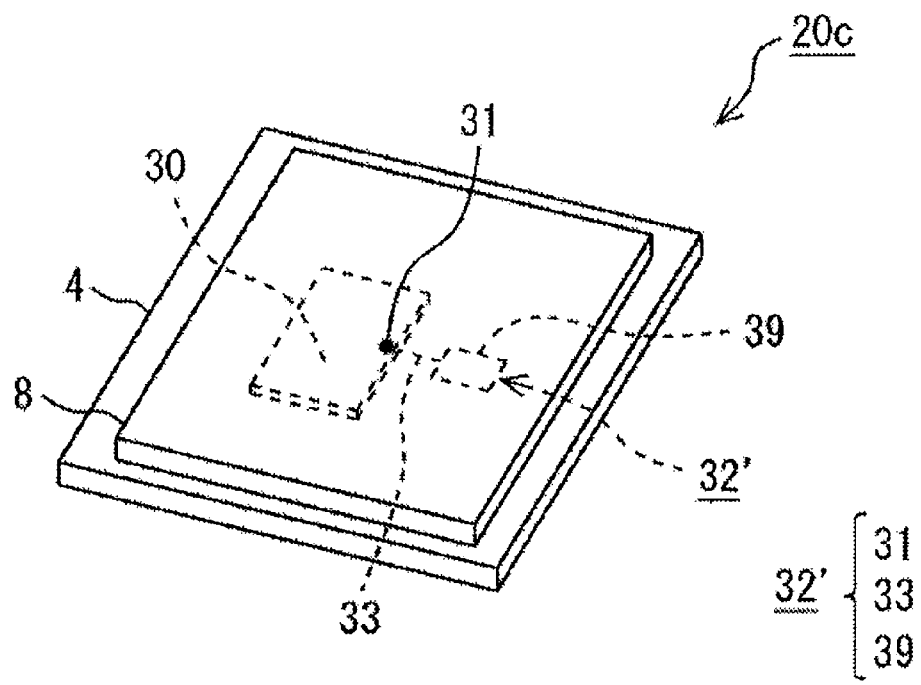
FIG. 11 is a perspective view illustrating a configuration example of a semiconductor package 20c as a fourth embodiment.

The semiconductor package 20c illustrated in FIG. 11 includes the interposer substrate 4, the molded resin 8, the semiconductor chip 30 capable of millimeter-wave band communication, and the antenna structure 32'. The semiconductor chip 30 performs a communication process in a millimeter-wave band. The semiconductor chip 30 uses the system LSI obtained by integrally forming the LSI function unit 201 with the signal generation unit 202 illustrated in FIG. 2 (refer to FIG. 2).

The antenna structure 32' is provided in parallel to the semiconductor chip 30 on the interposer substrate 4. As compared with the other embodiments, the arrangement position of the antenna structure 32' in the semiconductor package 20c is different. In this example, the microstrip line 33 and the antenna 39 are patterned at the right side of the antenna terminal 31 of the semiconductor chip 30. A patch antenna is used as the antenna 39. The antenna terminal 31, for example, is formed on the rear surface of the semiconductor chip 30 and the microstrip line 33 is wired (connected) to the antenna terminal 31. When employing such a formation method, it is possible to efficiently transmit the millimeter wave signal S between the antenna terminal 31 and the antenna 39.

[Formation Example of Semiconductor Package 20c]

Next, the formation example of the semiconductor package 20c constituting the in-millimeter-wave dielectric transmission device 400 with the POP structure will be described with reference to FIGS. 12A to 12D. In this example, when forming the semiconductor package 20c as illustrated in FIG. 11, the semiconductor chip 30 capable of millimeter-wave band communication and the antenna structure 32' are first formed on the interposer substrate 4 illustrated in FIG. 12A.

Figure 12A:
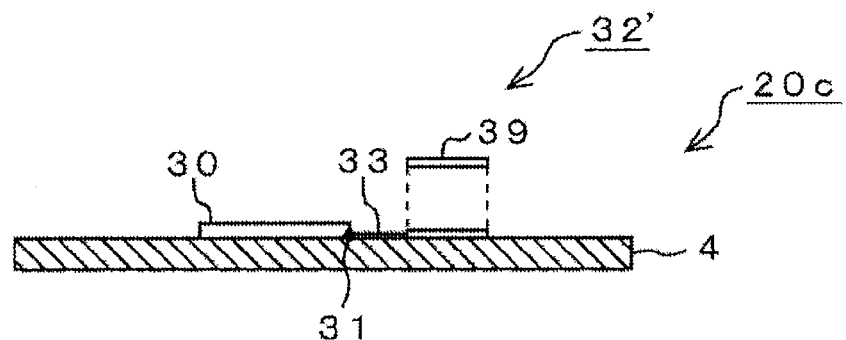
FIG. 12A is a process diagram illustrating a formation example of the semiconductor package 20c.
Figure 12B:
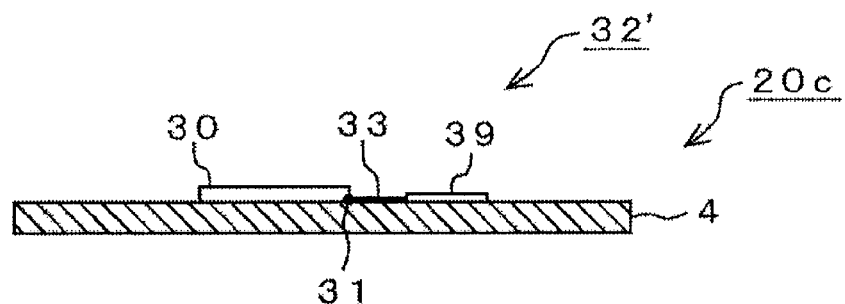
FIG. 12B is a process diagram illustrating a formation example of the semiconductor package 20c.

Since a method of mounting the semiconductor chip 30 on the interposer substrate 4 is the same as that of the first embodiment, description thereof will be omitted. When forming the antenna structure 32' on the interposer substrate 4, the antenna 39 is formed in parallel to the semiconductor chip 30 as illustrated in FIG. 12B. For example, the microstrip line 33 is formed from the antenna terminal 31 on the interposer substrate 4, and the antenna 39 is formed at the front end of the microstrip line 33 while being in parallel to the semiconductor chip 30.

A patch antenna having a predetermined length based on the wavelength λ of the millimeter wave signal S is used as the antenna 39, and for example, a length of one side of the patch antenna is about 600 μm. In addition, the antenna terminal 31 is drawn in advance from the output point of the antenna switching section 38 (refer to FIG. 2) mounted in the semiconductor chip 30. The antenna structure 32' includes the antenna terminal 31, the microstrip line 33, and the antenna 39 of the semiconductor chip 30 on the interposer substrate 4.

Figure 12C:
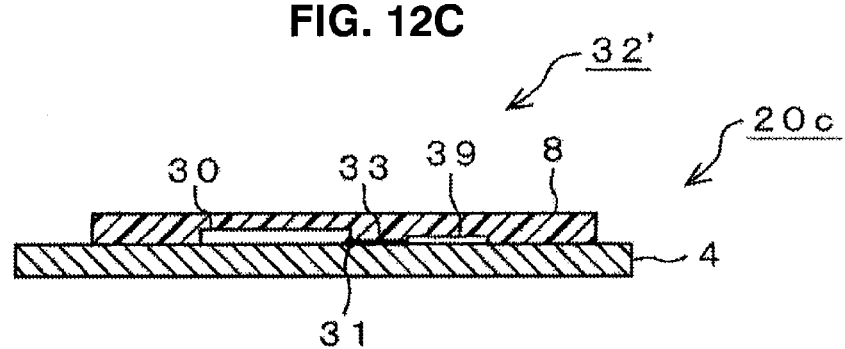
FIG. 12C is a process diagram illustrating a formation example of the semiconductor package 20c.
Figure 12D:
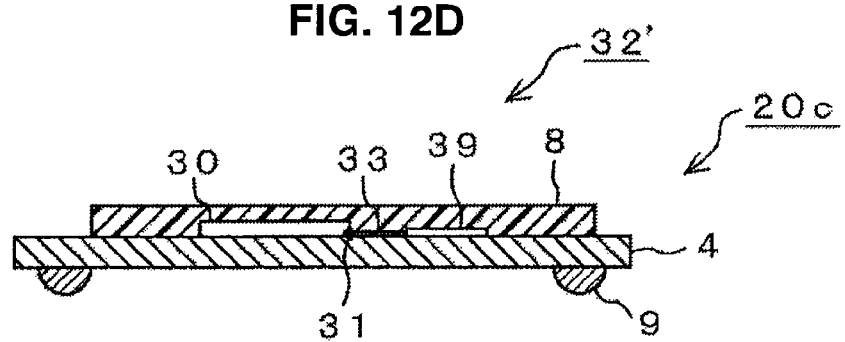
FIG. 12D is a process diagram illustrating a formation example of the semiconductor package 20c.

Then, as illustrated in FIG. 12C, the semiconductor chip 30 and the antenna structure 32' on the interposer substrate 4 are covered with the molded resin 8 so that the semiconductor chip 30 and the antenna structure 32' are insulated. The epoxy-based resin described in the first embodiment is used as the molded resin 8. Thereafter, as illustrated in FIG. 12D, the protrusion electrodes 9 (bumps) for flip-chip bonding are formed under the interposer substrate 4. In this way, the semiconductor package 20c constituting the in-millimeter-wave dielectric transmission device 400 with the POP structure is completed.

[Configuration Example of In-Millimeter-Wave Dielectric Transmission Device 400]

Figure 13:
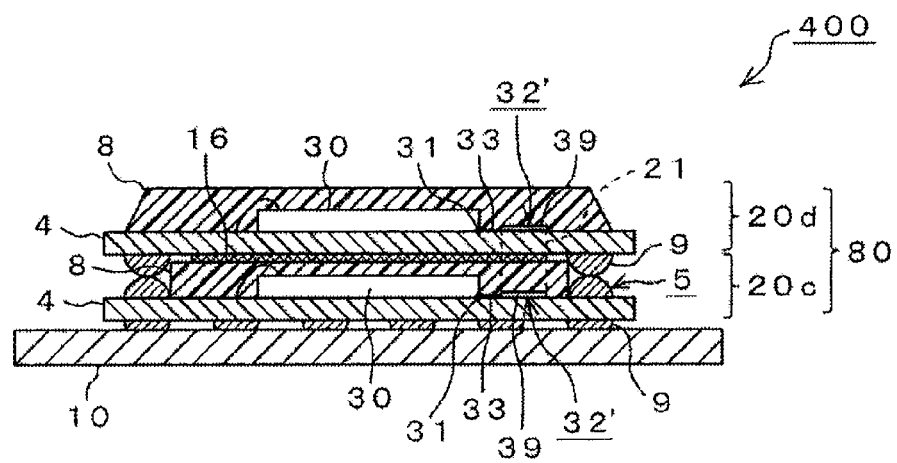
FIG. 13 is a sectional view illustrating a configuration example of an in-millimeter-wave dielectric transmission device 400 with a POP structure.

Next, the configuration example of the in-millimeter-wave dielectric transmission device 400 with the POP structure will be described with reference to FIG. 13. The in-millimeter-wave dielectric transmission device 400 illustrated in FIG. 13 has a structure in which the semiconductor package 20c illustrated in FIG. 11 is stacked in two stages or more. The in-millimeter-wave dielectric transmission device 400 with the POP structure is formed by connecting two semiconductor packages 20c and 20d to each other using the protrusion electrodes 9. In other words, the in-millimeter-wave dielectric transmission device 400 is obtained by integrally forming a plurality of semiconductor packages 20c and 20d and the like on the mounting substrate 10. The internal configuration example of the semiconductor packages 20c and 20d is as illustrated in FIG. 2.

That is, the semiconductor packages 20c and 20d, in which the semiconductor chips 30 and the antenna structures 32' are sealed with the molded resin 8, are bonded to each other using the protrusion electrodes 9 (solder balls), thereby forming a semiconductor package 80 with a stack structure.

The viscoelastic material 16 is arranged between the surface of the lower semiconductor package 20c and the interposer substrate 4 of the upper semiconductor package 20d in order to improve heat dissipation and an adhesion property. A viscoelastic resin with a specific dielectric constant ∈4 is used as the viscoelastic material 16. The millimeter wave signal S is transmitted via each dielectric of the molded resin 8 of the semiconductor package 20c, the viscoelastic material 16, and the interposer substrate 4 of the upper semiconductor package 20d.

In this way, as compared with the semiconductor package with the POP structure in the related art, it is possible to reduce the number of terminal electrode patterns wired to the protrusion electrodes 9 of the interposer substrates 4 of the upper and lower semiconductor packages 20c and 20d.

[Assembling Example of In-Millimeter-Wave Dielectric Transmission Device 400]

Figure 14:
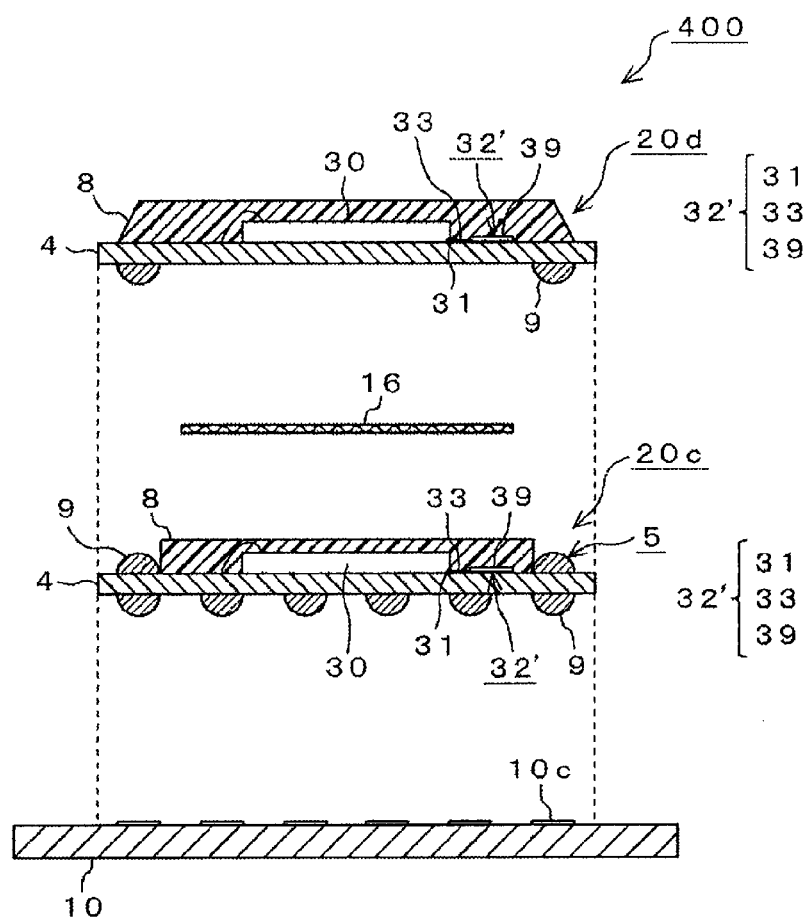
FIG. 14 is sectional views illustrating an example of assembling the in-millimeter-wave dielectric transmission device 400 with a POP structure.

Next, the assembling example of the in-millimeter-wave dielectric transmission device 400 with the POP structure will be described with reference to FIG. 14. This embodiment is based on the case of assembling the in-millimeter-wave dielectric transmission device 400 with the stack structure illustrated in FIG. 13.

First, the semiconductor packages 20c and 20d are prepared, and the semiconductor package 20c is mounted on the mounting substrate 10. The substrate 10 may have terminal electrode patterns 10c for bonding protrusion electrodes. The semiconductor package 20c is mounted by soldering the protrusion electrodes 9 of the semiconductor package 20c to the terminal electrode patterns 10c of the substrate 10. In this way, it is possible to mount the semiconductor package 20c on the mounting substrate 10.

In the semiconductor package 20d, the upper surface of the molded resin 8 may have a mesa shape. The mesa shape of the upper surface of the semiconductor package 20d is obtained by forming a concave section having inclined surfaces in all directions in the cavity of an injection mold, and forming inclined surfaces on the upper portion of the molded resin 8 in all directions using the injection mold.

Next, the semiconductor package 20d is mounted on the semiconductor package 20c. At this time, the viscoelastic material 16 is inserted between the molded resin 8 on the surface (upper surface) of the semiconductor package 20c and the interposer substrate 4 of the rear surface (lower surface) of the semiconductor package 20d. A viscoelastic epoxy resin and the like with a specific dielectric constant ∈4 is used as the viscoelastic material 16. At this time, the semiconductor package 20d overlaps the semiconductor package 20c such that the antenna structure 32' of the semiconductor package 20d matches with the antenna structure 32' of the semiconductor package 20c. The dielectric transmission path 21 includes the molded resin 8 of the semiconductor package 20c, the viscoelastic material 16, and the interposer substrate 4 of the semiconductor package 20d. In this way, the in-millimeter-wave dielectric transmission device 400 with the POP structure as illustrated in FIG. 13 is completed.

As described above, the in-millimeter-wave dielectric transmission device 400 with the POP structure of the fourth embodiment has a POP structure in which the semiconductor chip 30 of the semiconductor package 20d is mounted above the semiconductor chip 30 of the semiconductor package 20c. Consequently, it is possible to provide an integral type in-millimeter-wave dielectric transmission device 400 in which the semiconductor packages 20c and 20d are stacked and bonded to each other.

Furthermore, since the two semiconductor packages 20c and 20d on different substrates 10 are coupled to each other using the dielectric transmission path 21 and the millimeter wave signal S is transmitted via the dielectric transmission path 21, it is possible to reduce the number of connectors having a large number of terminals and cables.

<Fifth Embodiment>

[Configuration Example of In-Millimeter-Wave Dielectric Transmission Device 500]

The configuration example of the in-millimeter-wave dielectric transmission device 500 will be described as the fifth embodiment with reference to FIG. 15. The fifth embodiment is characterized in that data is transmitted between a plurality of semiconductor packages 20 which are offset from one another in the horizontal direction. In the example illustrated in FIG. 15, two semiconductor packages 20e and 20f provided respectively with the semiconductor chip 30 are mounted in parallel to each other on the same mounting substrate 10, thereby performing a communication process via the dielectric transmission path 21 formed in the chassis 11 for defining an area. The internal configuration example of the semiconductor packages 20e and 20f is as illustrated in FIG. 2.

Figure 15:
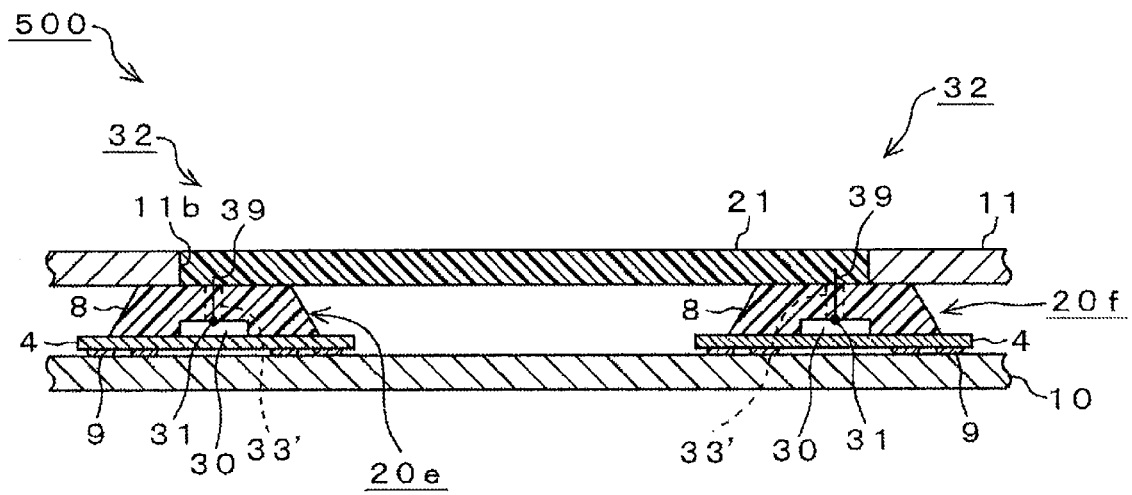
FIG. 15 is a sectional view illustrating a configuration example of an in-millimeter-wave dielectric transmission device 500 as a fifth embodiment.

According to the in-millimeter-wave dielectric transmission device 500 illustrated in FIG. 15, the dielectric transmission path 21 is provided in the chassis 11. As the chassis 11, for example, a metal flat plate having a thickness of about 1 mm is used, and the dielectric transmission path 21 is provided along the substrate surface. In this example, the dielectric transmission path 21 is formed by filling a predetermined dielectric material 21' in a through portion 11b (or a groove) formed in the chassis 11 to define an area. A glass epoxy resin and the like with a specific dielectric constant ∈1 is used as the dielectric material 21'. With such a structure, it is possible to form the dielectric transmission path 21 similar to a waveguide structure.

According to the in-millimeter-wave dielectric transmission device 500, in the dielectric transmission path 21 within the chassis 11, the millimeter wave signal S using the dielectric transmission path 21 is transmitted between the semiconductor packages 20e and 20f, the antenna structures 32 which face each other. The antenna structure 32 is drawn to the surface of the molded resin 8 sealing the semiconductor chip 30. A rod antenna is provided as the antenna structure 32. The antenna terminal 31, for example, may be drawn from the upper portion of the semiconductor chip 30 to a transmission path of a coaxial structure 33' having a characteristic impedance of about 108Ω. The rod antenna may be provided at the front end of the transmission path.

In addition, when it is possible to mount reflectors at the transmission side and the reception side of the dielectric transmission path 21 within the chassis 11, a patch antenna may be used as the antenna structure 32. At this time, electromagnetic waves irradiated from the patch antenna of one semiconductor package 20e travel in the thickness direction of the chassis 11. Then, the electromagnetic waves are reflected by the reflector of the transmission side, travel in the planar direction of the chassis 11, are reflected by the reflector of the reception side, and reach the patch antenna of the other semiconductor package 20f.

[Formation Example of In-Millimeter-Wave Dielectric Transmission Device 500]

Figure 16A:
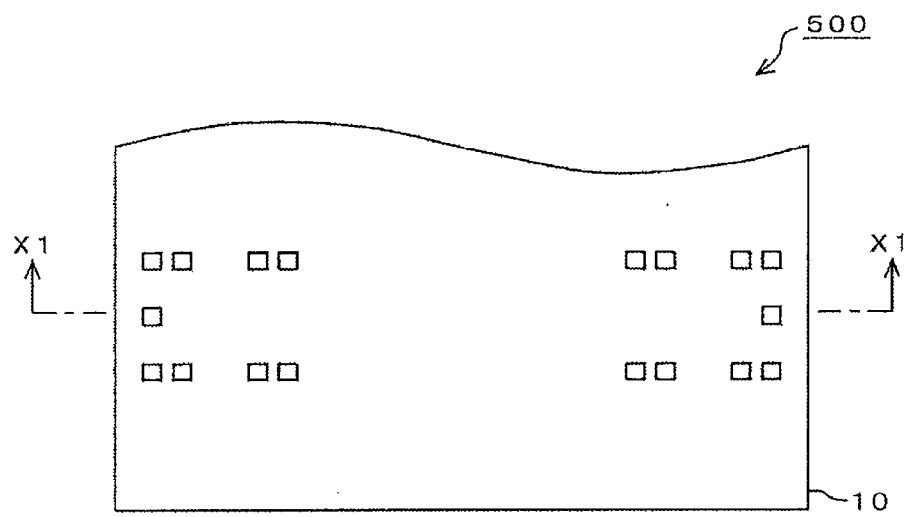
FIG. 16A is a process diagram illustrating a formation example 1 of the in-millimeter-wave dielectric transmission device 500.
Figure 16B:
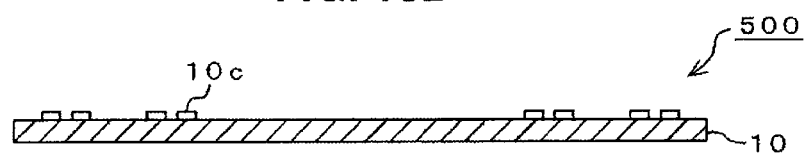
FIG. 16B is a process diagram illustrating a formation example 1 of the in-millimeter-wave dielectric transmission device 500.

Next, the formation example of the in-millimeter-wave dielectric transmission device 500 will be described with reference to FIGS. 16 to 18. FIG. 16A is a plan view illustrating the formation example of the terminal electrodes 5 on the substrate 10, and FIG. 16B is a sectional view of the substrate 10 taken along line X1-X1 illustrated in FIG. 16A. This example is based on the case of assembling the in-millimeter-wave dielectric transmission device 500 illustrated in FIG. 15 using the mounting substrate 10, the chassis 11, and the two semiconductor packages 20e and 20f.

On the one hand, the mounting substrate 10 is formed to allow the semiconductor packages 20e and 20f illustrated in FIG. 16A to be formed in parallel to each other. The semiconductor packages 20e and 20f are provided with the semiconductor chips 30 and the antenna structures 32. First, a plurality of terminal electrode patterns 10c are formed on the substrate 10 as illustrated in FIG. 16B. Since the terminal electrode patterns 10c are to be bonded to the protrusion electrodes 9 of the semiconductor packages 20e and 20f, when the substrate 10 is formed using a copper foil substrate, the terminal electrode patterns 10c, for example, are formed by patterning copper foil using a resist layer as a mask.

Figure 17A:
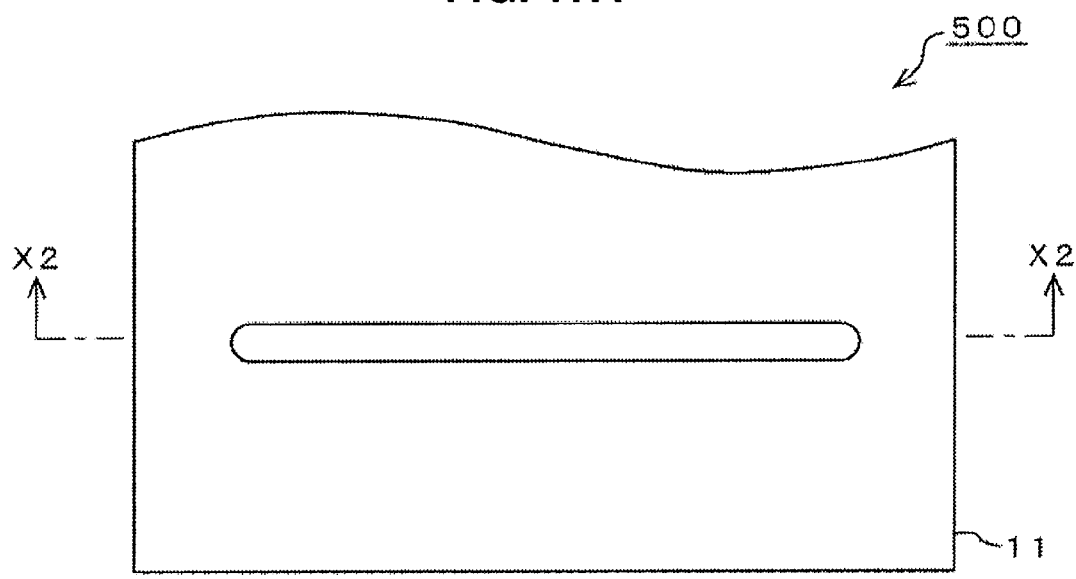
FIG. 17A is a process diagram illustrating a formation example 2 of the in-millimeter-wave dielectric transmission device 500.
Figure 17B:
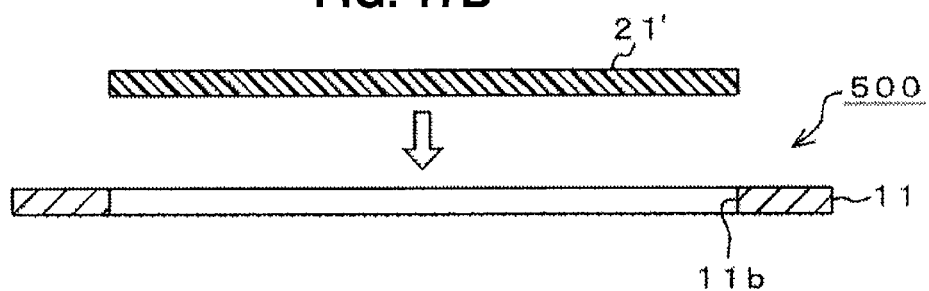
FIG. 17B is a process diagram illustrating a formation example 2 of the in-millimeter-wave dielectric transmission device 500.

FIG. 17A is a plan view illustrating the formation example of the dielectric transmission path 21 in the chassis 11, and FIG. 17B is a sectional view of the substrate 10 taken along line X2-X2 illustrated in FIG. 17A. On the other hand, the chassis 11 for mounting the mounting substrate 10 illustrated in FIG. 17A is prepared. As the chassis 11, for example, a metal flat plate having a thickness t0 of about 1 mm as illustrated in FIG. 17B is used. Then, the dielectric transmission path 21 is formed in the chassis 11.

Figure 17C:
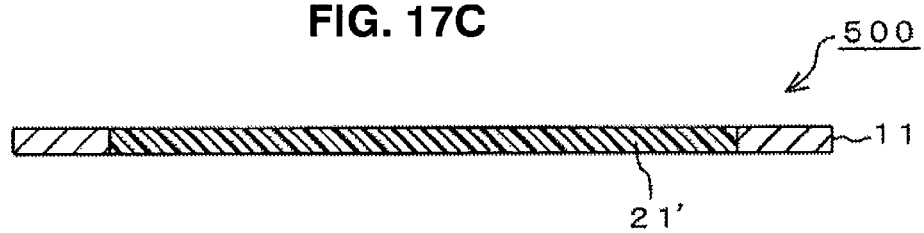
FIG. 17C is a process diagram illustrating a formation example 2 of the in-millimeter-wave dielectric transmission device 500.

At this time, the through portion 11b (or the groove) for defining an area is formed at a predetermined position of the chassis 11. The through portion 11b is provided along the surface of the chassis 11, and may be processed to link the mounting areas of the semiconductor packages 20e and 20f to each other. Then, a predetermined dielectric material 21' is filled in the through portion 11b illustrated in FIG. 17B. A glass epoxy resin and the like with a specific dielectric constant ∈1 is used as the dielectric material 21'. In this way, the dielectric transmission path 21 as illustrated in FIG. 17C is obtained.

Figure 18A:
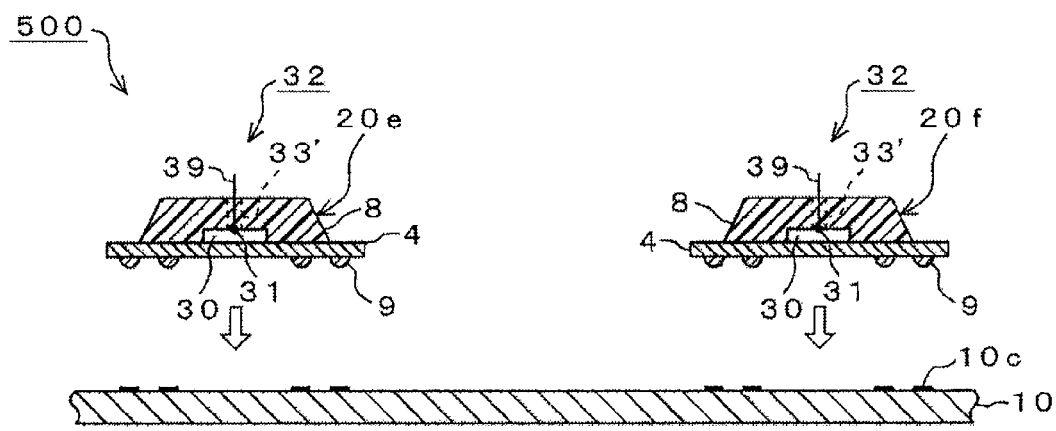
FIG. 18A is a process diagram illustrating a formation example 3 of the in-millimeter-wave dielectric transmission device 500.
Figure 18B:
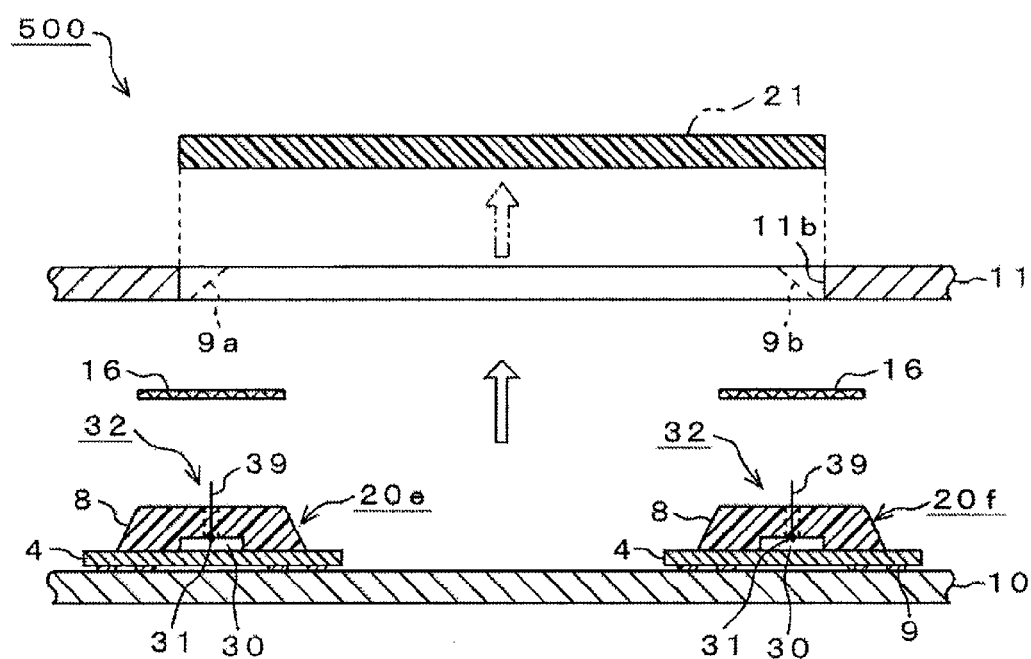
FIG. 18B is a process diagram illustrating a formation example 3 of the in-millimeter-wave dielectric transmission device 500.

Next, the semiconductor packages 20e and 20f are mounted on the mounting substrate 10 as illustrated in FIG. 18A. A method of mounting the semiconductor packages 20e and 20f is as illustrated in FIG. 4. Then, the semiconductor packages 20e and 20f mounted on the mounting substrate 10 as illustrated in FIG. 18B are mounted on the chassis 11 illustrated in FIG. 17C. At this time, the semiconductor packages 20e and 20f are mounted on the chassis 11 such that the antenna 39 of the semiconductor package 20e and the antenna 39 of the semiconductor package 20f are buried in the dielectric transmission path 21. At this time, the viscoelastic material 16 may be inserted between the molded resin 8 of the semiconductor package 20e and the chassis 11, and between the molded resin 8 of the semiconductor package 20f and the chassis 11.

In addition, when reflectors 9a and 9b are mounted at the transmission side and the reception side of the dielectric transmission path 21 within the chassis 11, for example, at the positions indicated by broken lines in the drawing where the dielectric material 21' has been removed from FIG. 18B for the purpose of convenience, the antenna structures 32 including patch antennas can be obtained on the semiconductor chips 30, respectively. At this time, the molded resin 8 is included in the dielectric transmission path 21. The entire path of the dielectric transmission path 21 has a concave shape inclusive of the reflectors 9a and 9b. In this way, it is possible to form the in-millimeter-wave dielectric transmission device 500 in which the two semiconductor packages 20e and 20f are provided in the chassis 11 in parallel to each other as illustrated in FIG. 15.

As described above, according to the in-millimeter-wave dielectric transmission device 500 of the fifth embodiment, the semiconductor packages 20e and 20f provided respectively with the semiconductor chip 30 are mounted on the same mounting substrate 10 in parallel to each other. Furthermore, the dielectric transmission path 21 is provided in the chassis 11 for defining an area.

Consequently, it is possible to perform a communication process using the millimeter wave signal S between the two semiconductor packages 20e and 20f mounted in parallel to each other on the same mounting substrate 10 via the dielectric transmission path 21 provided in the chassis 11. Moreover, since the dielectric transmission path 21 within the chassis 11 is arranged such that the two semiconductor packages 20e and 20f make close contact with each other, the structure of the chassis 11 for fixing the substrate 10, on which the semiconductor packages 20e and 20f are mounted, can also be achieved. Furthermore, since the chassis 11 is also used as the dielectric transmission path 21, the configuration of an electronic device is simplified.

<Sixth Embodiment>

[Configuration Example of In-Millimeter-Wave Dielectric Transmission System 600]

Figure 19A:
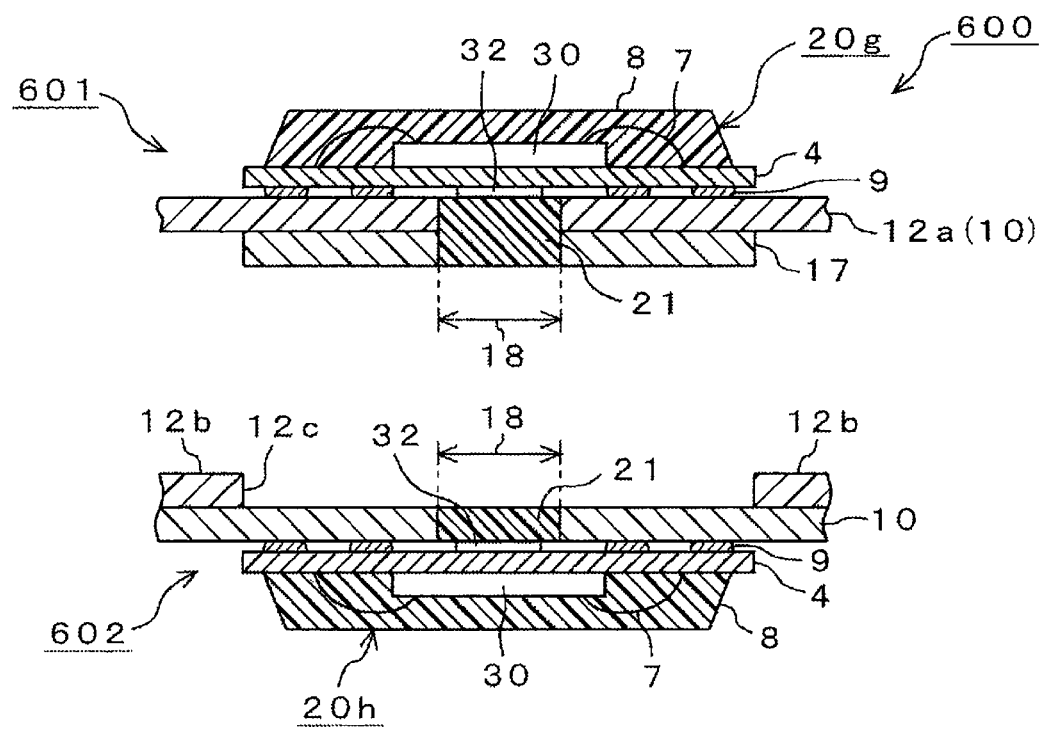
FIG. 19A is a sectional view illustrating a configuration example of an in-millimeter-wave dielectric transmission system 600 as a sixth embodiment.
Figure 19B:
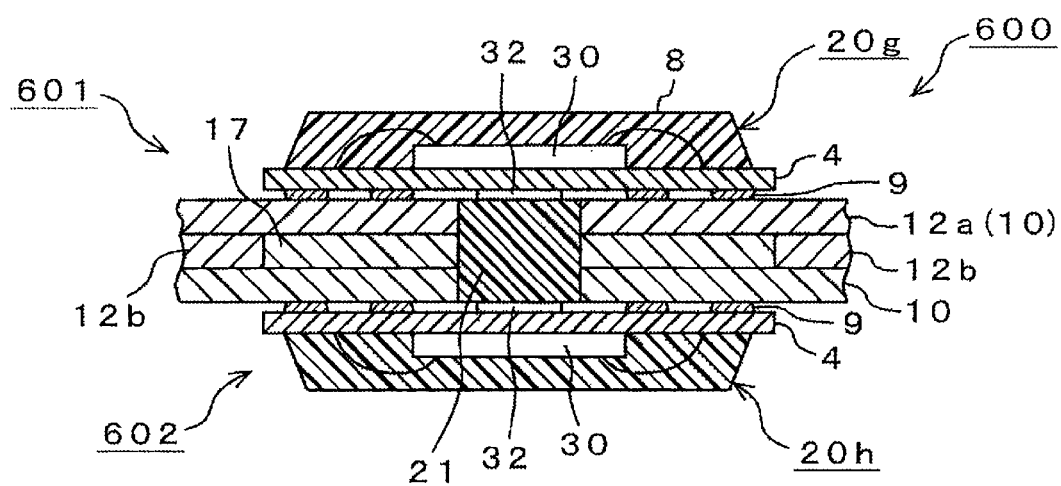
FIG. 19B is a sectional view illustrating a configuration example of the in-millimeter-wave dielectric transmission system 600 as the sixth embodiment.

Next, the configuration example of the in-millimeter-wave dielectric transmission system 600 will be described as the sixth embodiment with reference to FIGS. 19A and 19B. In the in-millimeter-wave dielectric transmission system 600 illustrated in FIG. 19A, semiconductor packages 20g and the like, which are capable of in-millimeter-wave dielectric transmission, are mounted in two electronic devices 601 and 602. In the system 600, predetermined portions of the two electronic devices 601 and 602 are allowed to contact each other so that the millimeter wave signal S is transmitted, as illustrated in FIGS. 19B.

A first semiconductor package 20g capable of in-millimeter-wave dielectric transmission is mounted in the electronic device 601. The semiconductor package 20g includes the semiconductor chip 30 capable of millimeter-wave band communication, the antenna structure 32, and the dielectric transmission path 21 having a convex shape. In the semiconductor package 20g, the semiconductor chip 30 is provided on one interposer substrate 4. The antenna structure 32 is connected to the semiconductor chip 30. The semiconductor chip 30 and the antenna structure 32 on the interposer substrate 4 are covered with the molded resin 8.

The dielectric transmission path 21 having a convex shape of the electronic device 601 includes the mounting substrate 10, a protrusion member 17 having a convex shape, and the dielectric material 21'. The mounting substrate 10 may be a member which is also used as a housing 12a of the electronic device 601. The protrusion member 17 may be made of a metal or resin. The substrate 10 and the protrusion member 17 are formed with an opening hole 18 for defining the dielectric transmission path 21. The opening hole 18 is provided at a position including the antenna structure 32. The opening hole 18 is filled with a predetermined dielectric material 21'. A glass epoxy resin and the like with a specific dielectric constant ∈1 is used as the dielectric material 21'.

A second semiconductor package 20h capable of in-millimeter-wave dielectric transmission is mounted in the electronic device 602. The semiconductor package 20h includes the semiconductor chip 30 capable of millimeter-wave band communication, the antenna structure 32, and the dielectric transmission path 21 having a concave shape. The semiconductor package 20h has the same configuration as the semiconductor package 20g, except that the dielectric transmission path 21 has a concave shape. The internal configuration example of the semiconductor packages 20g and 20h is as illustrated in FIG. 2.

The dielectric transmission path 21 having a concave shape of the electronic device 602 includes the mounting substrate 10, a housing 12b having a convex shape, and the dielectric material 21'. The mounting substrate 10 is mounted on the housing 12b of the electronic device 601. The housing 12b may be made of a metal or resin. The substrate 10 is formed with an opening hole 18 for defining the dielectric transmission path 21. The opening hole 18 is provided at a position including the antenna structure 32. The opening hole 18 is filled with a predetermined dielectric material 21'. A glass epoxy resin and the like with a specific dielectric constant ∈1 is used as the dielectric material 21'.

In this example, as illustrated in FIG. 19B, the dielectric transmission path 21 having a convex shape of the electronic device 601 is fit into the dielectric transmission path 21 having a concave shape of the electronic device 602. In this way, the dielectric transmission path 21 capable of transmitting a millimeter wave signal is constructed between the semiconductor package 20g and the semiconductor package 20h. The antenna structure 32 of the semiconductor package 20g and the antenna structure 32 of the semiconductor package 20h are combined with each other such that they face each other with the dielectric transmission path 21 interposed therebetween.

In the in-millimeter-wave dielectric transmission system 600, the two electronic devices 601 and 602 are normally separated from each other. The electronic device 601, for example, is a portable battery-driven device, and the electronic device 602, for example, is a stationary battery charger, a base station and the like. In the system 600, when charging the battery of the electronic device 601 or transmitting data from the electronic device 601 to the electronic device 602, the two electronic devices 601 and 602 are combined with each other.

In this example, the following combinations are considered for the electronic devices 601 and 602. i. When one electronic device 601 is a battery-driven device such as a cell phone, a digital camera, a video camera, a game machine, a remoter controller or a razor, the other electronic device 602 is a battery charger of the electronic device 601, a base station for performing an image process, and the like.

ii. When one electronic device 601 has an external appearance such as an IC card which is relatively thin as compared with the case of i, the electronic device 602 is a card reading and writing device of the electronic device 601, and the like. A usage mode such as a Felica card (R) can be realized. Of course, the combinations of the electronic devices 601 and 602 as described above are for illustrative purposes only.

[Formation Example of Electronic Devices 601 and 602]

Next, the manufacturing method of the electronic devices 601 and 602 used in the in-millimeter-wave dielectric transmission system 600 will be described with reference to FIGS. 20A and 20B and FIGS. 21A and 21B. Even when the embodiment is applied to any one of the electronic devices 601 and 602, a case in which the semiconductor packages 20g and 20h are mounted on the inner wall surfaces of the housings 12a and the like thereof will be described as an example.

Figure 20A:
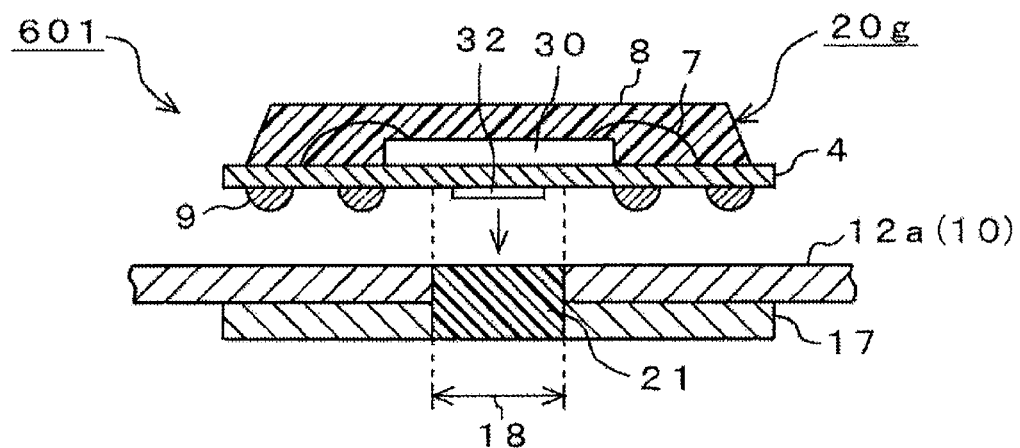
FIG. 20A is a process diagram illustrating a formation example of an electronic device 601.

First, the semiconductor package 20g capable of in-millimeter-wave dielectric transmission and the housing 12a also used as the substrate 10, which are illustrated in FIG. 20A, are prepared in order to form the electronic device 601. In this example, the semiconductor package 20g illustrated in FIG. 20A is mounted in the housing 12a. The semiconductor package 20g includes the semiconductor chip 30 capable of millimeter wave band communication, the antenna structure 32, and the dielectric transmission path 21 having a convex shape.

In the semiconductor package 20g, the semiconductor chip 30 is provided on one interposer substrate 4. The antenna structure 32 is provided to terminals under the interposer substrate 4 on which the semiconductor chip 30 is mounted. The antenna structure 32 is connected to the semiconductor chip 30. The molded resin 8 is formed to cover the semiconductor chip 30 on the interposer substrate 4 and the antenna structure 32. The protrusion electrodes 9 for flip-chip bonding are formed at the terminals under the interposer substrate 4.

When the electronic device 601, for example, is a cell phone, the housing 12a is an external case of the cell phone. Normally, in the substrate 10, since pad electrodes for flip-chip bonding are formed on a semiconductor package mounting surface, when the housing 12a is also used as the substrate 10, it is necessary to form pad electrodes for flip-chip bonding on the semiconductor package mounting surface of the housing 12a. Of course, it may be possible to use a method of mounting the substrate 10, on which the semiconductor package 20g is mounted, at a predetermined position of the housing 12a.

In this example, the dielectric transmission path 21 having a convex shape is formed by bonding the mounting housing 12a to the protrusion member 17 having a convex shape. Of course, the opening hole 18 is opened through the housing 12a and the protrusion member 17 to define the dielectric transmission path 21. Preferably, the opening hole 18 is provided at a position including the antenna structure 32. The protrusion member 17 may be a metal member or a resin member. The opening hole 18 is filled with a predetermined dielectric material 21'. A glass epoxy resin and the like with a specific dielectric constant $\in 1$ may be used as the dielectric material 21'. In this way, it is possible to form the dielectric transmission path 21 having a convex shape in the electronic device 601.

Figure 20B:
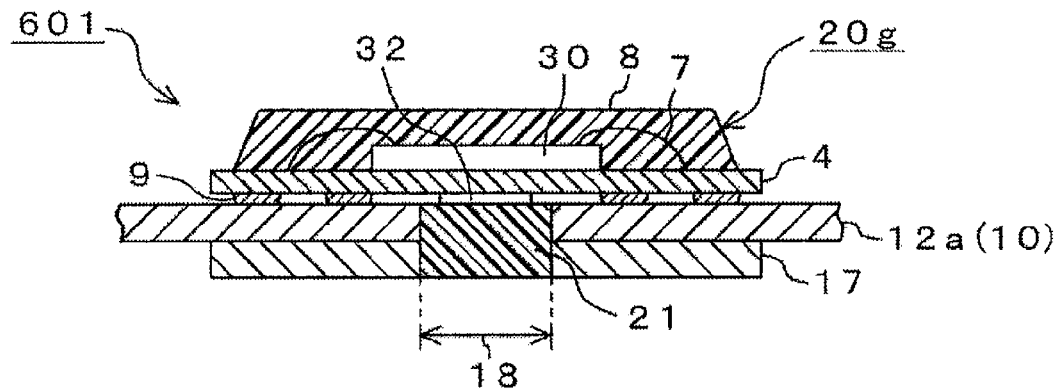
FIG. 20B is a process diagram illustrating a formation example of the electronic device 601.

After preparing the semiconductor package 20g capable of in-millimeter-wave dielectric transmission and the housing 12a provided with the dielectric transmission path having a convex shape, the semiconductor package 20g is bonded to the housing 12a as illustrated in FIG. 20B. At this time, the semiconductor package 20g is bonded to the housing 12a such that the protrusion member 17 is positioned outside the housing 12a and the semiconductor package 20g is positioned at the inner wall surface of the housing 12a.

Furthermore, flip-chip bonding is performed using the protrusion electrode 9 formed at the terminal under the interposer substrate 4. For example, the pad electrodes for flip-chip bonding provided in advance to the semiconductor package mounting surface of the housing 12a also used as the substrate 10 are soldered to the protrusion electrodes 9 formed at the terminals under the interposer substrate 4. In this way, the electronic device 601 available for the in-millimeter-wave dielectric transmission system 600 is completed.

Figure 21A:
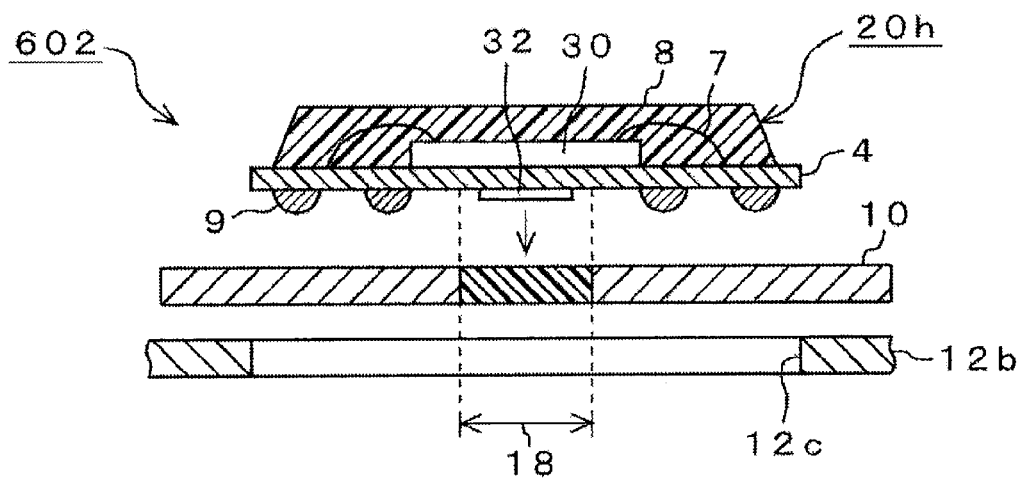
FIG. 21A is a process diagram illustrating a formation example of an electronic device 602.

Next, the semiconductor package 20h capable of in-millimeter-wave dielectric transmission, the substrate 10, and the housing 12a, which are illustrated in FIG. 21A, are prepared in order to form the electronic device 602. In this example, the semiconductor package 20h illustrated in FIG. 21A is first mounted on the substrate 10, and this resultant structure is mounted on the housing 12b. A substrate in which pad electrodes for flip-chip bonding have been formed on a semiconductor package mounting surface is used as the substrate 10. The semiconductor package 20h is subject to flip-chip bonding using the protrusion electrodes 9 formed at the terminals under the interposer substrate 4. For example, the pad electrodes for flip-chip bonding provided in advance to the semiconductor package mounting surface of the substrate 10 are soldered to the protrusion electrodes 9 formed at the terminals under the interposer substrate 4.

In this example, a method in which the substrate 10 including the semiconductor package 20h mounted thereon is mounted to close a window portion 12c opened at a predetermined position of the housing 12b is employed. Furthermore, a semiconductor package which is the same as the semiconductor package 20g including the semiconductor chip 30 capable of millimeter-wave band communication, the antenna structure 32, and the dielectric transmission path 21 having a concave shape is used as the semiconductor package 20h. Since the formation example of the semiconductor package 20h is the same as that of the semiconductor package 20g, description thereof will be omitted.

In this example, the dielectric transmission path 21 having a concave shape is formed using a dielectric transmission path 21 defined by opening the opening hole 18 through the substrate 10, and the window portion 12c of the housing 12b. Preferably, the opening hole 18 is provided at a position including the antenna structure 32. The opening hole 18 is filled with a predetermined dielectric material 21'. A glass epoxy resin and the like with a specific dielectric constant $\in 1$ is used as the dielectric material 21'.

In addition, when an insulating member the same as the dielectric material 21' is used for the substrate 10, the opening hole 18 may be omitted. When the dielectric transmission path 21 is forcedly defined, a conductive cylindrical member may be buried in the thickness direction of the substrate 10 such that the approximate center of the antenna structure 32 of the semiconductor package 20g is positioned at the center of the cylindrical member. An insulating member provided at the inner side of the cylindrical member forms the dielectric transmission path 21. In this way, it is possible to form the dielectric transmission path 21 having a concave shape in the electronic device 602.

Figure 21B:
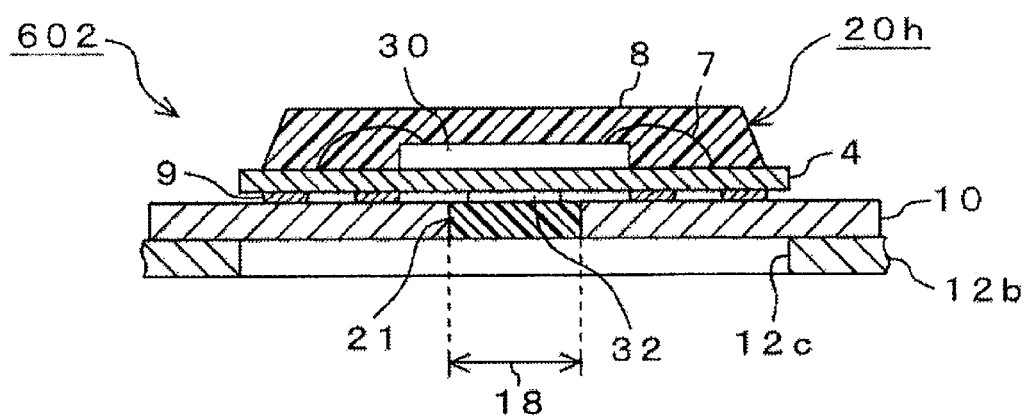
FIG. 21B is a process diagram illustrating a formation example of the electronic device 602.

When the electronic device 602, for example, is a charger for charging the battery of a cell phone, the housing 12b illustrated in FIG. 21B is an external case of the charger. A housing formed at a predetermined position thereof with the window portion 12c is used as the housing 12b. The window portion 12c is fit around the protrusion member 17 of the electronic device 601 illustrated in FIG. 19A.

The substrate 10 provided with the dielectric transmission path having a concave shape, on which the semiconductor package 20h capable of in-millimeter-wave dielectric transmission is mounted, and the housing 12b formed with the window portion 12c are prepared. After they are prepared, the semiconductor package 20h and the substrate 10 provided with the dielectric transmission path having a concave shape are mounted on the window portion 12c of the housing 12b as illustrated in FIG. 21B.

In this example, when the protrusion member 17 of the electronic device 601 is fit into the window portion 12c of the housing 12b, the protrusion member 17 is positioned such that the approximate center of the antenna structure 32 of the semiconductor package 20g of the electronic device 601 coincides with the approximate center of the antenna structure 32 of the semiconductor package 20h. Then, the substrate 10 is mounted on the housing 12b. The substrate 10 is fixed to the housing 12b using a screw clamping structure.

Of course, it may be possible to employ a method of bonding the substrate 10 to the housing 12b using adhesive. In this way, the electronic device 602 available for the in-millimeter-wave dielectric transmission system 600 is completed.

As described above, according to the in-millimeter-wave dielectric transmission system 600 of the sixth embodiment, the semiconductor package 20g capable of millimeter-wave band communication is provided to one electronic device 601, and the semiconductor package 20h capable of millimeter-wave band communication is provided to one electronic device 602. In addition, the dielectric transmission path 21 capable of transmitting a millimeter wave signal is provided between the semiconductor packages 20g and 20h. Then, the semiconductor packages 20g and 20h contact each other such that the antenna structures 32 of the semiconductor packages 20g and 20h face each other with the dielectric transmission path 21 interposed therebetween.

Consequently, it is possible to transmit a millimeter wave signal S from the semiconductor package 20g to the semiconductor package 20h via the dielectric transmission path 21 which is provided between the semiconductor package 20g and the semiconductor package 20h to transmit a millimeter wave signal. In this way, it is possible to perform a communication process and the like between one electronic device 601 and the other electronic device 602 during a charge operation, without depending on a communication cable and the like for connecting the electronic device 601 to the electronic device 602.

Throughout all embodiments, the in-millimeter-wave dielectric transmission devices 200, 300, 400 and 500 and the in-millimeter-wave dielectric transmission system 600 according to the present invention can be realized with a simple and inexpensive configuration. Moreover, it is possible to perform high speed data transmission between the semiconductor packages 20a and 20b, between the semiconductor packages 20c and 20d, between the semiconductor packages 20e and 20f, and between the semiconductor packages 20g and 20h.

<Seventh Embodiment>

Figure 22A:
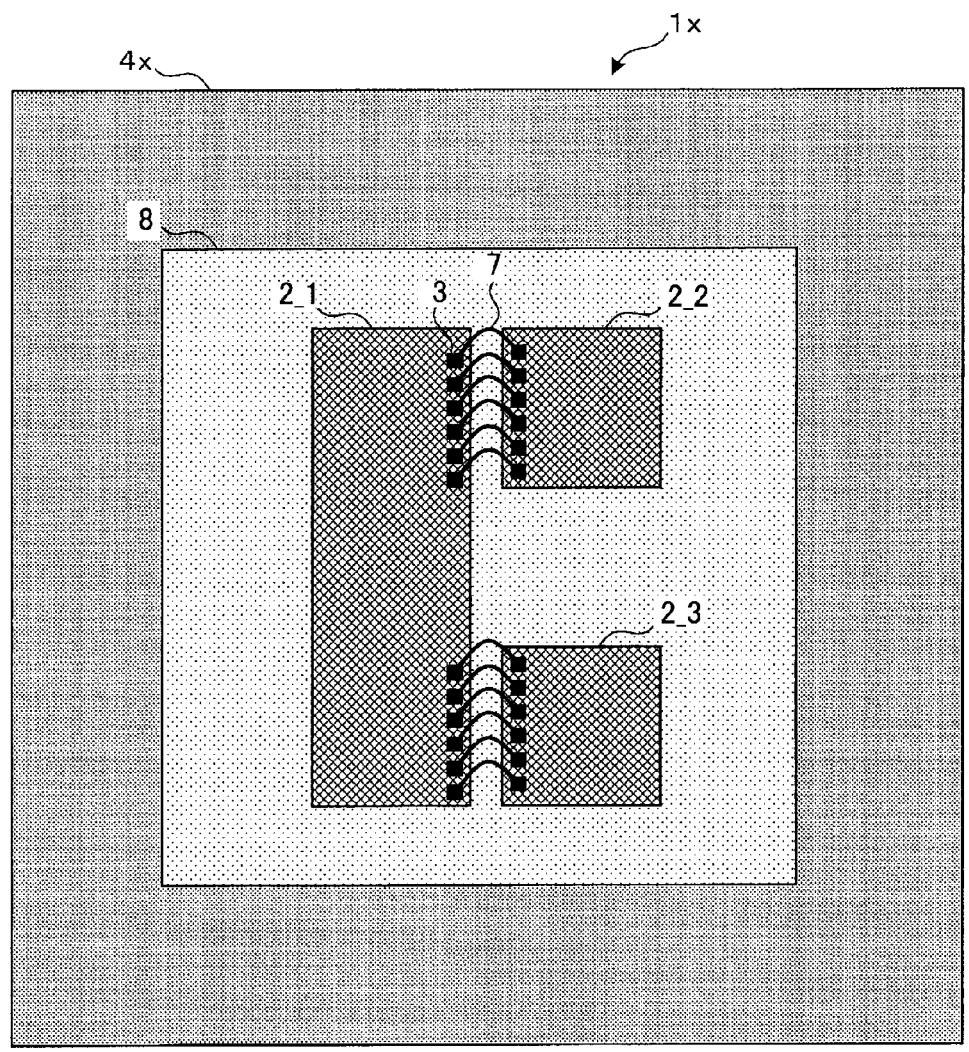
FIG. 22A is a diagram explaining an example compared with a seventh embodiment.
Figure 22B:
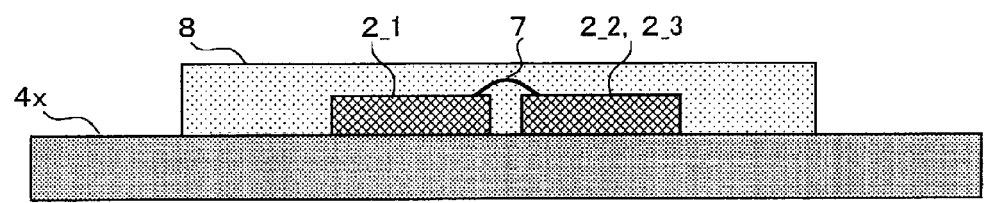
FIG. 22B is a diagram explaining an example compared with the seventh embodiment.
Figure 24A:
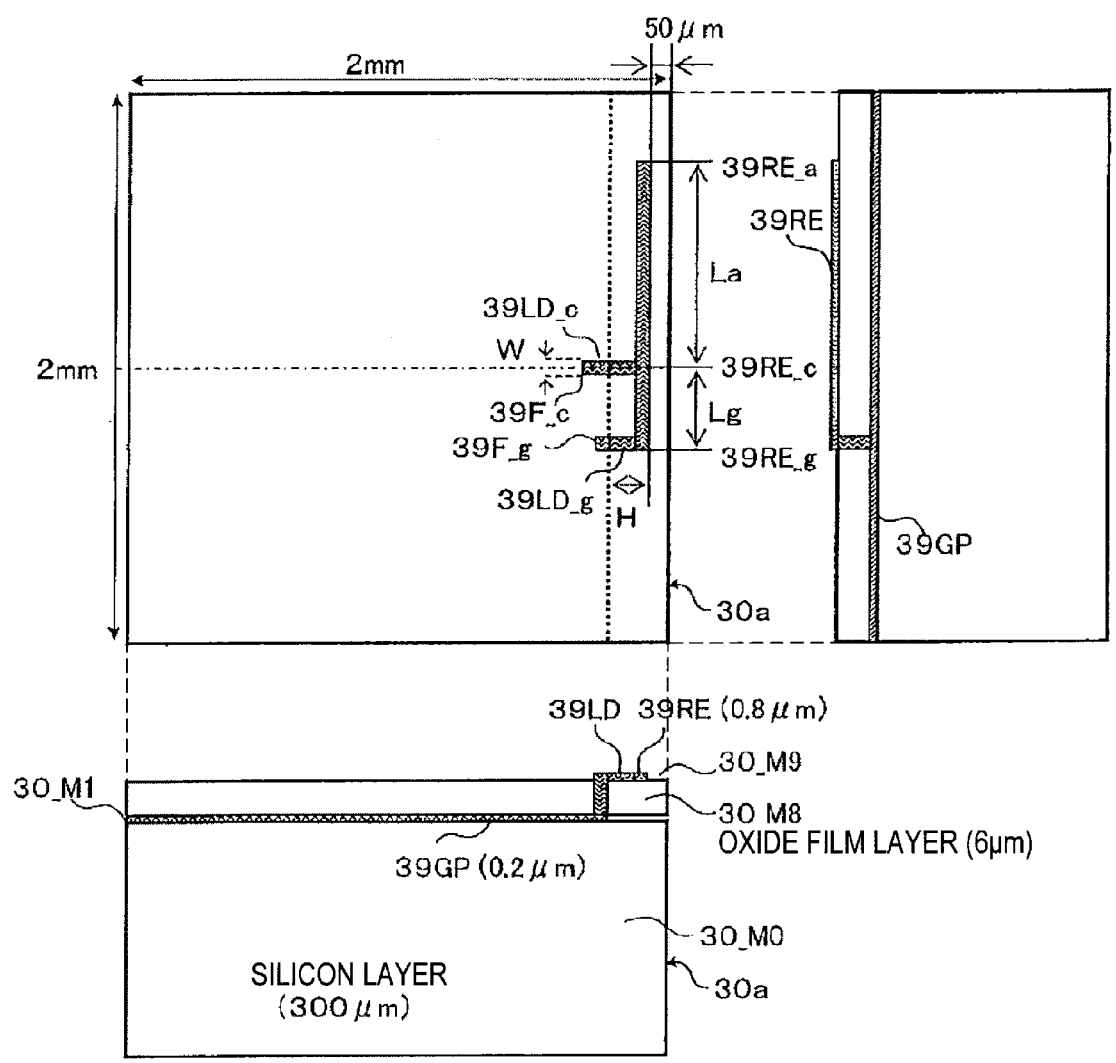
FIG. 24A is a diagram explaining a detailed example of an antenna structure used in the semiconductor package of the seventh embodiment.
Figure 25A:
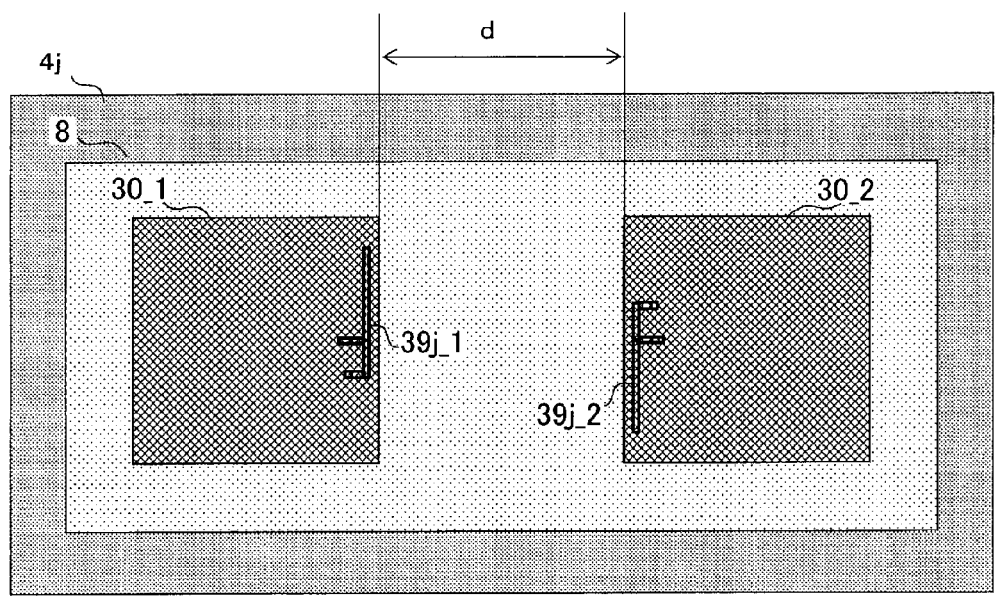
FIG. 25A is a plan view explaining a detailed example of the semiconductor package of the seventh embodiment to which the antenna structure illustrated in FIG. 24 is applied.
Figure 25B:
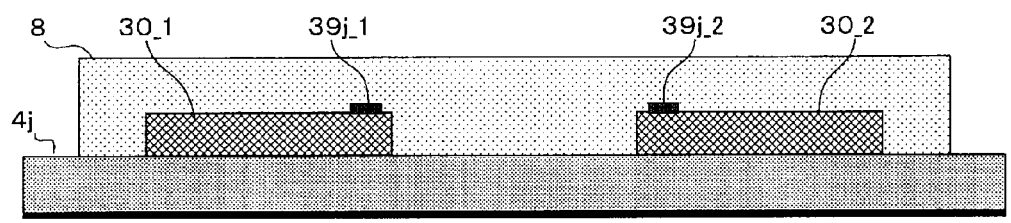
FIG. 25B is a plan view explaining a detailed example of the semiconductor package of the seventh embodiment to which the antenna structure illustrated in FIG. 24 is applied.
Figure 26:
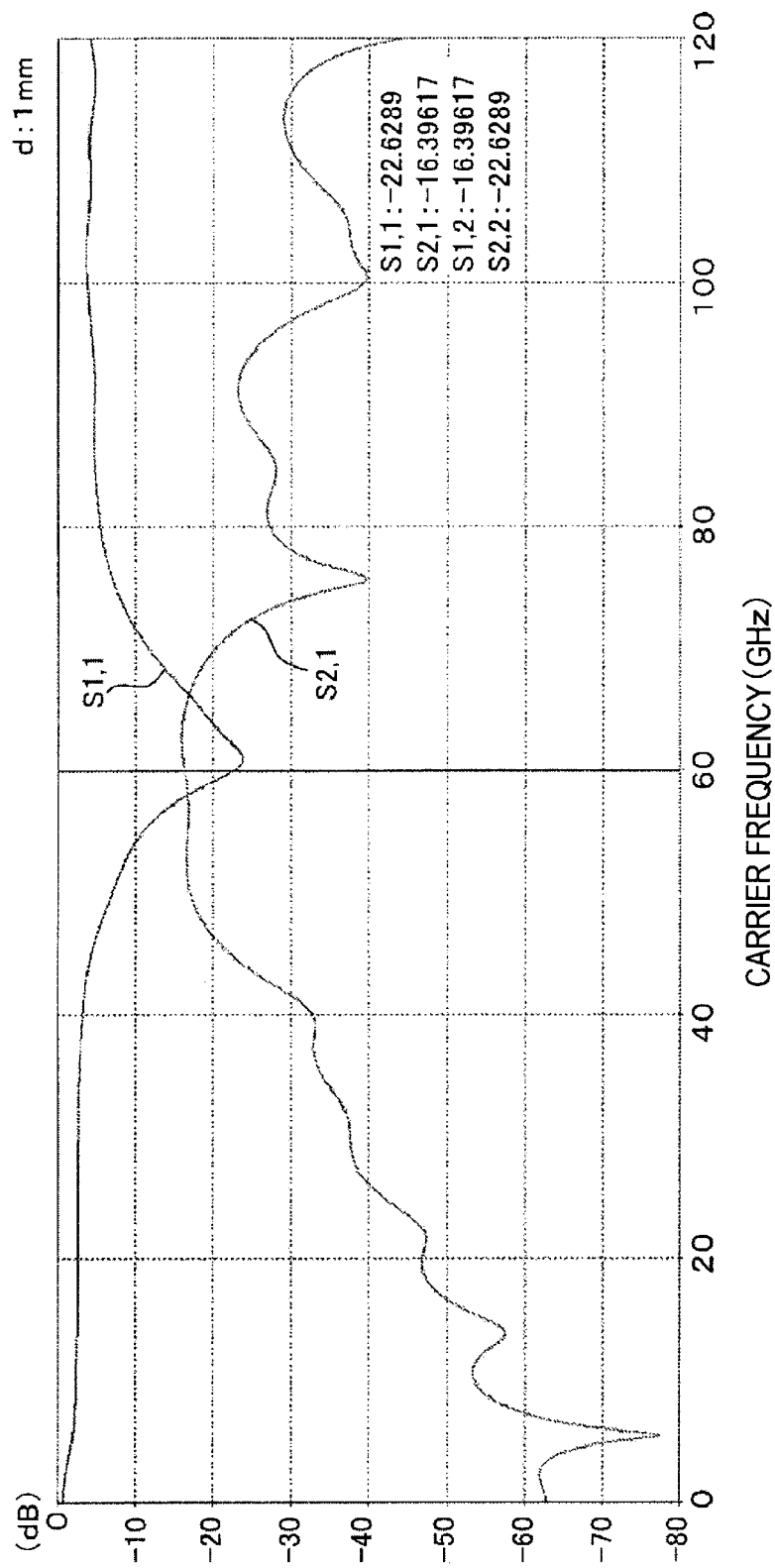
FIG. 26 is a graph illustrating an example 1 of simulation characteristics in the semiconductor package illustrated in FIG. 25 according to the seventh embodiment.
Figure 27:
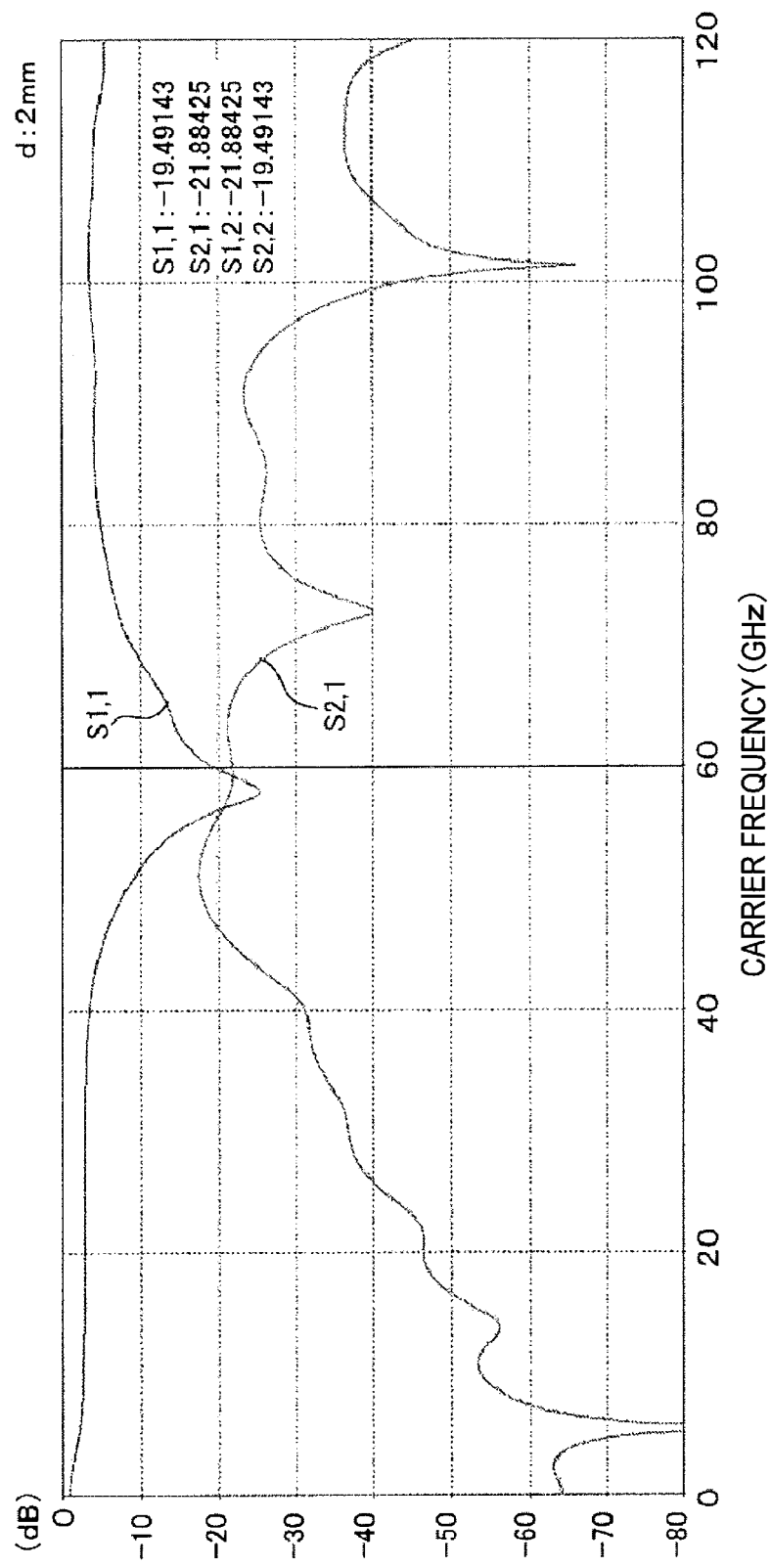
FIG. 27 is a graph illustrating an example 2 of simulation characteristics in the semiconductor package illustrated in FIG. 25 according to the seventh embodiment.
Figure 28:
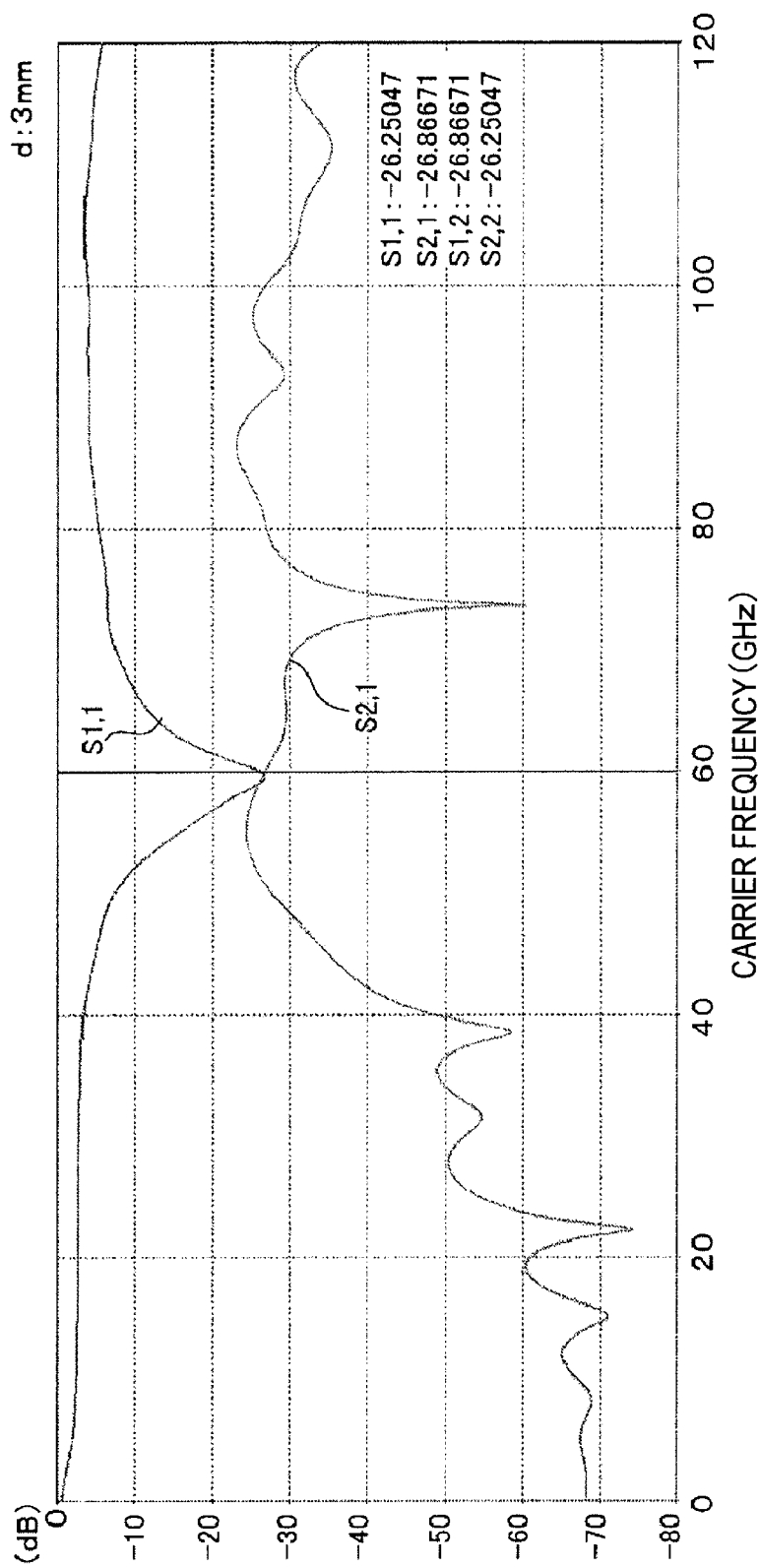
FIG. 28 is a graph illustrating an example 3 of simulation characteristics in the semiconductor package illustrated in FIG. 25 according to the seventh embodiment.

FIGS. 22 to 28 are diagrams explaining a semiconductor package 20j (which is equivalent to an in-millimeter-wave dielectric transmission device in this embodiment) as the seventh embodiment. FIG. 22 is diagrams explaining an example compared with the seventh embodiment, and FIG. 23 is diagrams explaining the configuration overview of the semiconductor package 20j according to the seventh embodiment. FIG. 24 is a diagram explaining a detailed example of an antenna structure used in the semiconductor package 20j according to the seventh embodiment. FIG. 25 is a diagram explaining a detailed example of the semiconductor package 20j employing the antenna structure illustrated in FIG. 24, according to the seventh embodiment. FIGS. 26 to 28 are diagrams illustrating the example of the simulation characteristics in the semiconductor package 20j illustrated in FIG. 25 according to the seventh embodiment.

The seventh embodiment is characterized in that a plurality of semiconductor chips 30 are arranged on a substrate in one semiconductor package 20j, and millimeter wave transmission is performed between the semiconductor chips 30. The millimeter wave transmission is performed between the semiconductor chips 30 within the same package, and the semiconductor package 20j itself constitutes an in-millimeter-wave dielectric transmission device.

Hereinafter, in order to facilitate the understanding of the structure of the seventh embodiment, an example compared with the seventh embodiment will be first described, and then the overview and the detailed example of the seventh embodiment will be described.

COMPARISON EXAMPLE

FIG. 22 illustrates a semiconductor package 1x of the comparison example which does not employ the seventh embodiment. The semiconductor package 1x is a multi-chip package in which semiconductor chips 2_1, 2_2 and 2_3 are arranged in parallel to one another as a plurality of (three in the drawings) system LSIs in one package. A plurality of pad electrodes 3 are formed on the surfaces of the semiconductor chips 2_1, 2_2 and 2_3.

While signal transmission is performed between the semiconductor chips 2_1 and 2_2 and between the semiconductor chips 2_1 and 2_3, signal transmission is not performed between the semiconductor chips 2_2 and 2_3. Here, for a connection for the signal transmission between the semiconductor chips 2_1 and 22 and between the semiconductor chips 2_1 and 2_2, bonding wires 7 are used. All the semiconductor chips 2_1, 2_2 and 2_3 are protected by a resinous LSI package (molded resin 8), and are mounted on an interposer substrate 4x (an LSI package substrate).

Here, with the high performance of system LSI chips and an increase in data capacity, the number of the bonding wires 7 for connecting the system LSI chips to each other is increased and a chip area is increased due to an increase in the number of pad electrodes 3. Furthermore, if a communication speed among the system LSI chips is high, wiring delay due to the extension of the bonding wires 7, reflection due to impedance mismatching and the like may be problematic. Furthermore, since it is necessary to closely connect the system LSI chips to each other using the bonding wires 7, a reduction in the degree of freedom of arrangement of the system LSI chips may also be problematic.

[Configuration Overview of Seventh Embodiment]

Figure 23A:
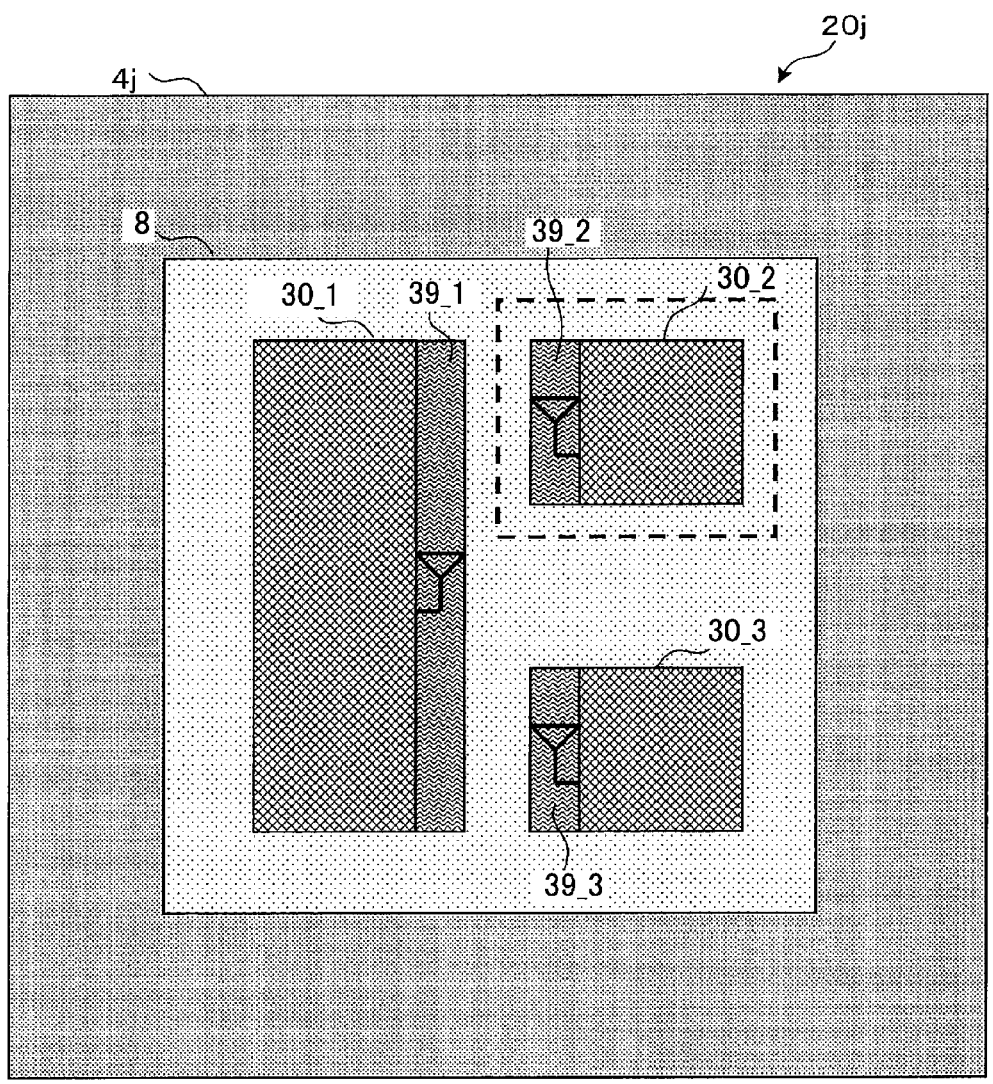
FIG. 23A is a diagram explaining a configuration overview of a semiconductor package of the seventh embodiment.
Figure 23B:
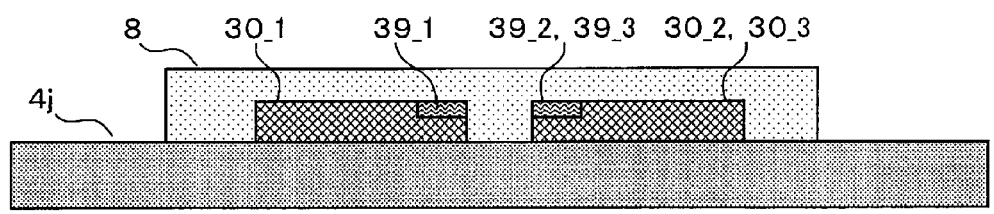
FIG. 23B is a diagram explaining the configuration overview of the semiconductor package of the seventh embodiment.

FIG. 23 illustrates the configuration overview of the seventh embodiment. FIG. 23A is a schematic plan view and FIG. 23B is a schematic sectional view.

The semiconductor package 20j of the seventh embodiment is a multi-chip package in which three semiconductor chips 30_1, 30_2 and 30_3 capable of in-millimeter-wave dielectric transmission are arranged in parallel to one another in one package. Unlike the comparison example, no pad electrodes 3 are formed on the surfaces of the semiconductor chips 30_1, 30_2 and 30_3.

All the semiconductor chips 30_1, 30_2 and 30_3 are protected by a resinous LSI package (molded resin 8), and are mounted on an LSI package substrate 4j (an interposer substrate). The molded resin 8 is made of a dielectric material including a dielectric capable of transmitting a millimeter wave signal.

Although not shown in the drawings, as described in the first embodiment, terminals of a power supply unit and the like, which do not convert a millimeter wave signal, are wired from the pad electrodes 3 of the semiconductor chips 30_1, 30_2 and 30_3 via the bonding wires 7, similarly to the comparison example.

As described in the first embodiment, the LSI function unit 201, the signal generation unit 202, and the antenna switching section 38 of the antenna coupling unit 203 are embedded in each of the semiconductor chips 30_1, 30_2 and 30_3. Since the semiconductor chips 30_1, 30_2 and 30_3 are arranged in parallel to one another in one package, it does not exclude the use of an antenna (e.g., a patch antenna) with directivity in the thickness (normal) direction of a substrate as the antenna 39, but it is preferable to use an antenna with directivity in the planar direction of the substrate.

When using the antenna (e.g., the patch antenna) with directivity in the thickness (normal) direction of the substrate, for example, a change may occur such that millimeter waves travel between the antennas 39 by providing a reflective plate within the molded resin 8 to form the dielectric transmission path 21, resulting in the improvement of transmission efficiency.

As described in the first embodiment, the signal generation unit 202 includes the LSI function unit 201, the parallel-serial conversion circuit 34, the modulation circuit 35, the frequency conversion circuit 36, the amplifier 37, and the antenna switching section 38 as the transmission system, and includes the amplifier 44, the frequency conversion circuit 45, the demodulation circuit 46, and the serial-parallel conversion circuit 47 as the reception system.

For example, while signal transmission is performed between the semiconductor chips 30_1 and 30_2 and between the semiconductor chips 30_1 and 30_3, signal transmission is not performed between the semiconductor chips 30_2 and 30_3. In such a case, in the semiconductor chip 30 of a transmission side, a plurality of data signals generated by the LSI function unit 201 are converted to a serial signal by the parallel-serial conversion circuit 34, modulated by the modulation circuit 35, up-converted to a millimeter-wave band signal by the frequency conversion circuit 36, amplified by the amplifier 37, and irradiated in the molded resin 8 (the LSI package) via the antenna 39 of the antenna coupling unit 203 as an electric wave. In the semiconductor chip 30 of a reception side, electric waves of a millimeter wave band are received by the antenna 39, amplified by the amplifier 44, down-converted to a base band signal by the frequency conversion circuit 45, demodulated by the demodulation circuit 46, converted to a parallel signal by the serial-parallel conversion circuit 47, and transferred to the LSI function unit 201.

According to the semiconductor package 20j of the seventh embodiment, data transmission in the multi-chip package, in which a plurality of semiconductor chips 30 (system LSIs) are arranged in one package, is performed using a millimeter wave. A millimeter wave signal transmission path for transmitting the millimeter waves is not the air (a free space transmission path), but the dielectric transmission path 21 using the molded resin 8 made of a dielectric material including a dielectric capable of transmitting a millimeter wave signal. In this way, it is possible to significantly reduce the number of the bonding wires 7 and the pad electrodes 3 which are necessary for the semiconductor package 1x of the comparison example, and it is possible to reduce a chip area to lead to a reduction in a chip cost. In addition, the degree of freedom of chip arrangement is improved, resulting in the improvement of housing designability. Moreover, signal transmission through an electric wiring using the bonding wires 7 and the pad electrodes 3 is replaced with transmission using a millimeter wave signal, thereby solving problems such as wiring delay and impedance mismatching.

[Antenna Structure of Seventh Embodiment]

FIGS. 24 to 28 illustrate a detailed example and a characteristic example of the antenna structure used in the semiconductor package 20j.

Here, an inverted-F type antenna 39j having a size smaller than a patch antenna as illustrated in FIG. 24A is used as the antenna 39. Since the inverted-F type antenna 39j is non-directional (except for the longitudinal direction of a radiation element), in other words, has directivity in the planar direction of a substrate as well as the thickness (normal) direction of the substrate, it is suitable for transmission using a millimeter wave signal between the semiconductor chips 30_1 and 302 and between the semiconductor chips 30_1 and 30_3, which are arranged in parallel to one another.

The numerical examples illustrated in FIG. 24B and FIG. 24C are examples when the inverted-F type antenna 39j of a 60 GHz band is mounted in the semiconductor package 20j. The inverted-F type antenna 39j having the structure illustrated in FIG. 24A is mounted on each of the 2 mm squared semiconductor chips 30_1, 30_2 and 30_3, and all the semiconductor chips 30_1, 30_2 and 30_3 are sealed with the molded resin 8.

In relation to the inverted-F type antenna 39j, for example, a ground pattern 39GP is formed with a thickness of 0.2 μm on an M1 layer 30_M1 on a silicon layer 30_M0 having a thickness of 300 μm, which constitutes the 2 mm squared semiconductor chip 30, throughout the approximate entire surface of 2 mm squared (details will be given later). An oxide film layer 39_M8 having a thickness of 6 μm is formed on the upper layer of the M1 layer 30_M1 (the ground pattern 39GP). Silicon Si of the silicon layer 30_M0 has a specific dielectric constant of 11.9 and a resistivity of 10 Ω·cm, and oxide film of the oxide film layer 39_M8 has a specific dielectric constant of 3.5 and a dielectric loss tangent tan δ of 0.02.

An irradiation element 39RE having a thickness of 0.8 μm is formed on an M9 layer 30_M9 on the oxide film layer 39_M8 in a protruded state relative to the wide ground pattern 39GP. The irradiation element 39RE is formed at an inner position 50 μm from one side 30_a of the semiconductor chip 30 along the side 30_a, and the longitudinal direction of the irradiation element 39RE is parallel to the side 30_a. In the irradiation element 39RE, a first element length La from the center position 39RE_c of the side 30_a to one end point 39RE_a is set to 560 μm, and a second element length Lg from the center position 39RE_c of the side 30_a to another end point 39RE_g is set to 272 μm.

Power feed wirings 39LD_g and 39LD_c for power feeding are drawn from the end point 39RE_g and the center position 39RE_c of the irradiation element 39RE, respectively. The line widths of the power feed wirings 39LD_g and 39LD_c are set to 13 μm. The power feed wiring 39LD_g has a lead length H of 113 μm and the termination point thereof is a first power feed point 39F_g. In addition, the power feed wiring 39LD_g falls downward from the first power feed point 39F_g to the M1 layer 30_M1 side and is connected to the ground pattern 39GP. The power feed wirings 39LD_c have a lead length H set to be longer than the lead length H (113 μm) of the power feed wiring 39LD_g, and the termination point thereof is a second power feed point 39F_c.

The ground pattern 39GP is not formed in the entire range of 2 mm squared, but is formed at the position spaced apart from the formation position H (50 μm) of the irradiation element 39RE with respect to the side 30_a by the lead length H (113 μm) of the power feed wiring 39LD_g.

FIG. 25 illustrates the state in which two semiconductor chips (e.g., 30_1 and 30_2) provided with the inverted-F type antennas 39j illustrated in FIG. 24 are arranged on the LSI package substrate 4j in parallel to each other at an inter-chip distance d such that the inverted-F type antennas 39j face each other. The LSI package substrate 4j is made of a dielectric material, and has a specific dielectric constant of 3.5, a dielectric loss tangent tan δ of 0.02 and a thickness of 0.4 mm.

FIG. 25B is a schematic sectional view illustrating a first example of the semiconductor chips. The two semiconductor chips 30_1 and 30_2 are sealed with a resinous LSI package (molded resin 8). A dielectric material of the molded resin 8 has a specific dielectric constant of 4.0, a dielectric loss tangent tan δ of 0.01 and a thickness T of 1 mm.

FIGS. 26 to 28 illustrate S parameter frequency characteristics when the semiconductor chips 30_1 and 30_2 illustrated in FIG. 25 are arranged such that the inverted-F type antennas 39j thereof face each other on the plane and the inter-chip distance d is changed. FIG. 26 illustrates the case in which the inter-chip distance d is 1 mm, FIG. 27 illustrates the case in which the inter-chip distance d is 2 mm, and FIG. 28 illustrates the case in which the inter-chip distance d is 3 mm.

As apparent from the comparison of FIGS. 26 to 28, reflection loss shows superior characteristics around 60 GHz regardless of the inter-chip distance d. This means that reflection due to impedance mismatching is small, and it can be said that successful communication is performed.

As described above, according to the seventh embodiment, electromagnetic waves irradiated from the inverted-F type antennas 39*j* propagate between a plurality of semiconductor chips 30 within the same package using the inner portion of the molded resin 8 made of a dielectric material as the dielectric transmission path 21. Between the two semiconductor chips 30 including the inverted-F type antennas 39*j* facing each other, a millimeter wave signal using the dielectric transmission path 21 is transmitted. It is possible to perform a communication process between the semiconductor chips 30 via the dielectric transmission path 21 made of the molded resin 8.

<Eighth Embodiment>

Figure 29A:
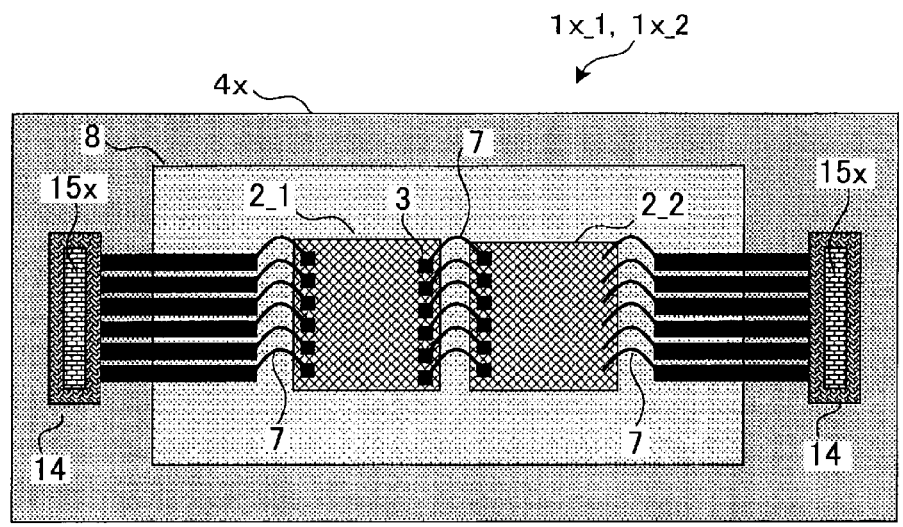
FIG. 29A is a diagram explaining an example compared with an eighth embodiment.
Figure 29B:
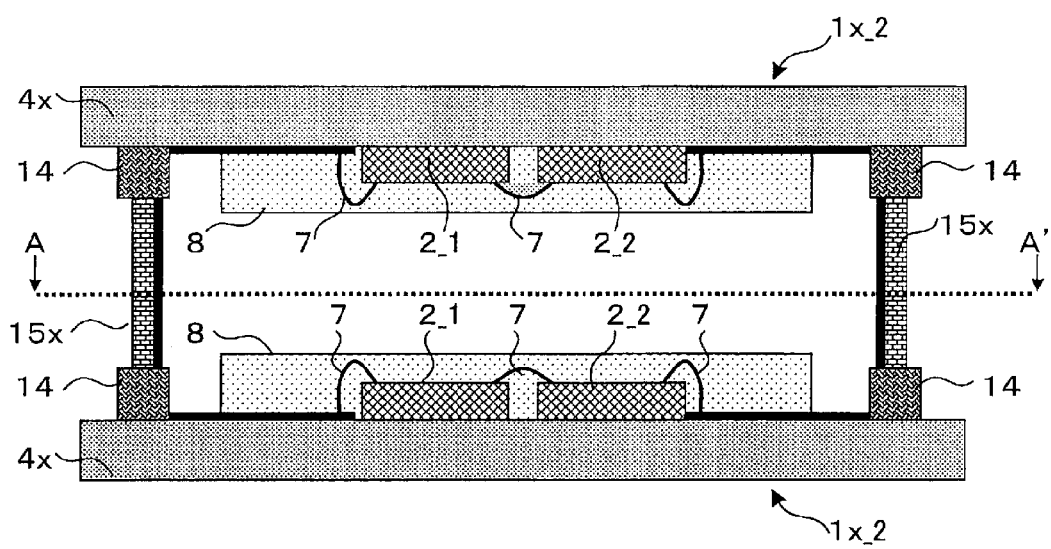
FIG. 29B is a diagram explaining an example compared with the eighth embodiment.
Figure 30A:
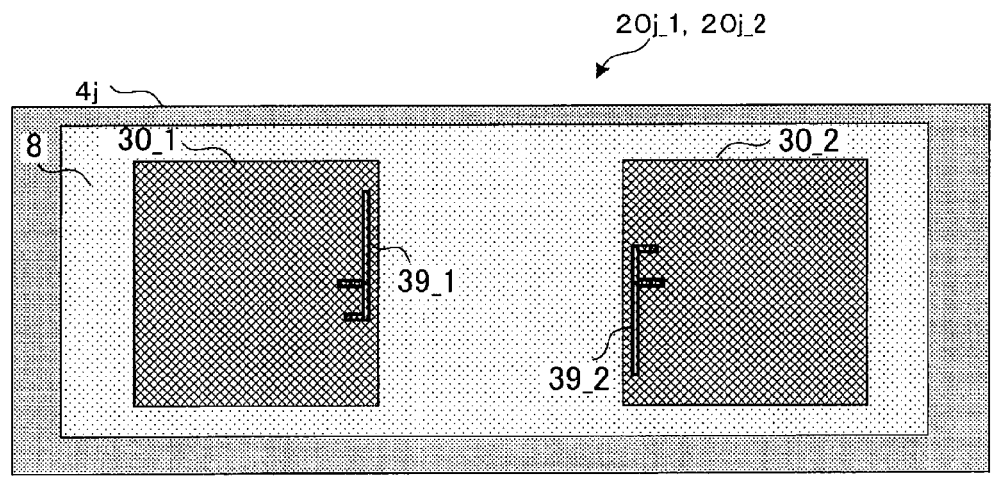
FIG. 30A is a diagram explaining a configuration overview of an in-millimeter-wave dielectric transmission system of the eighth embodiment.
Figure 30B:
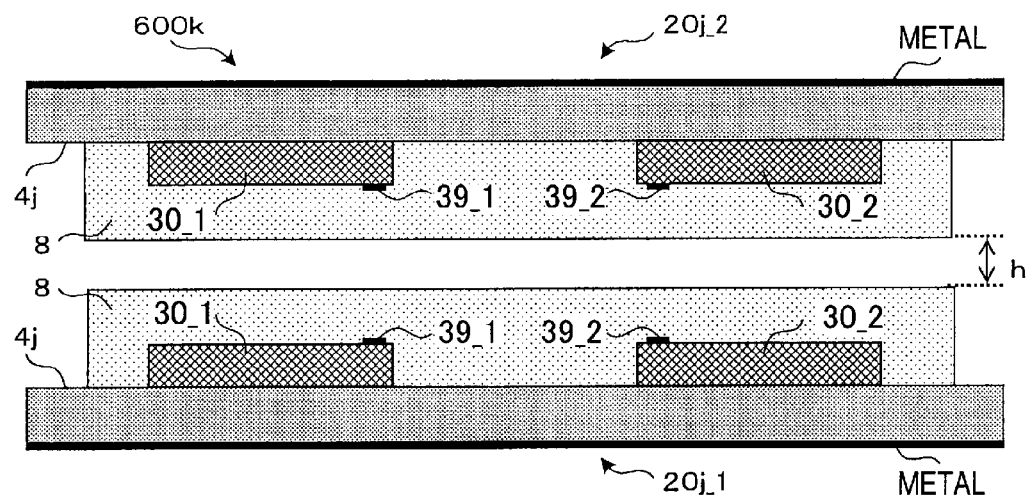
FIG. 30B is a diagram explaining the configuration overview of the in-millimeter-wave dielectric transmission system of the eighth embodiment.
Figure 31:
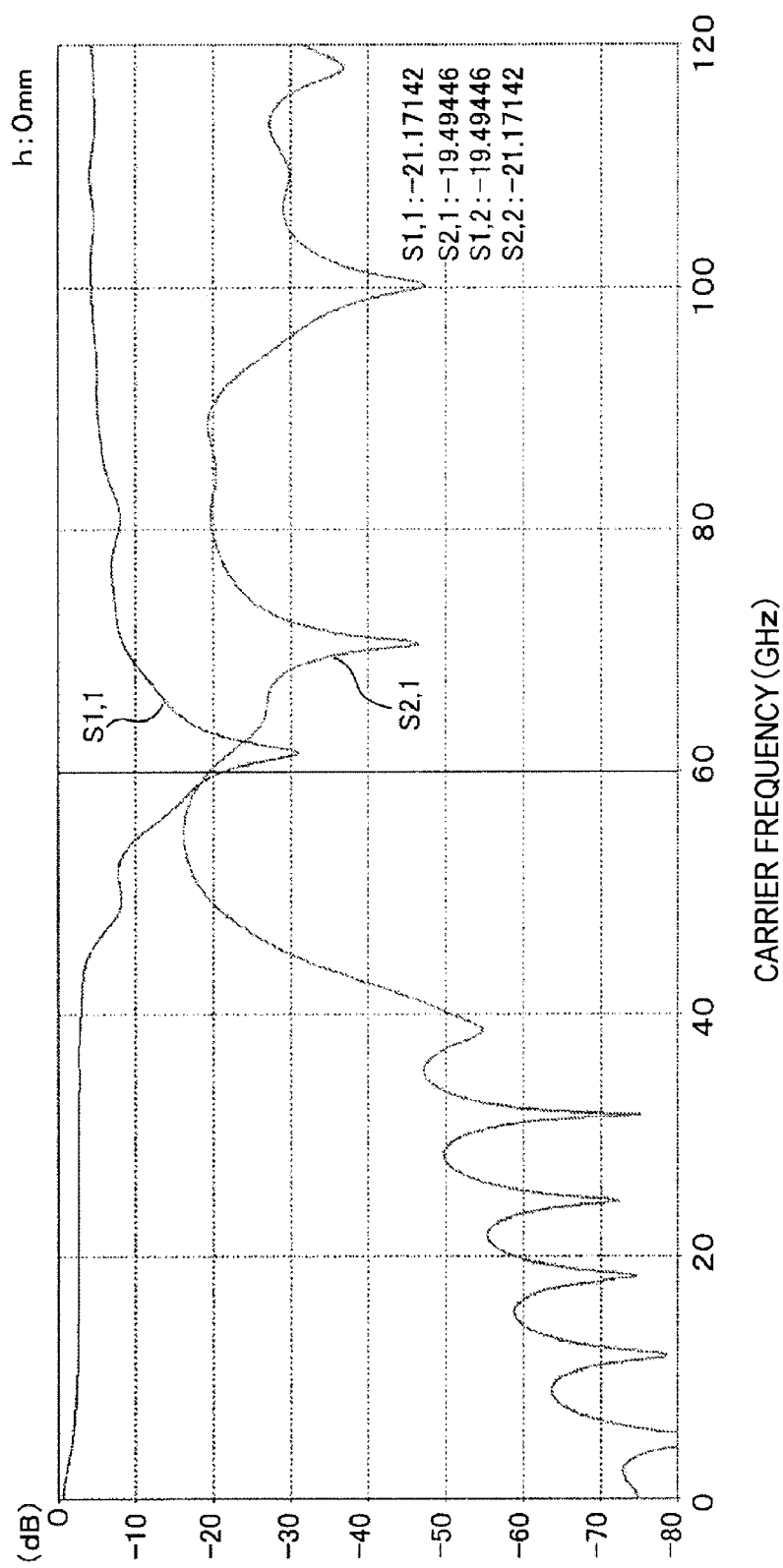
FIG. 31 is a graph illustrating an example 1 of simulation characteristics in the in-millimeter-wave dielectric transmission system illustrated in FIG. 30 according to the eighth embodiment.
Figure 32:
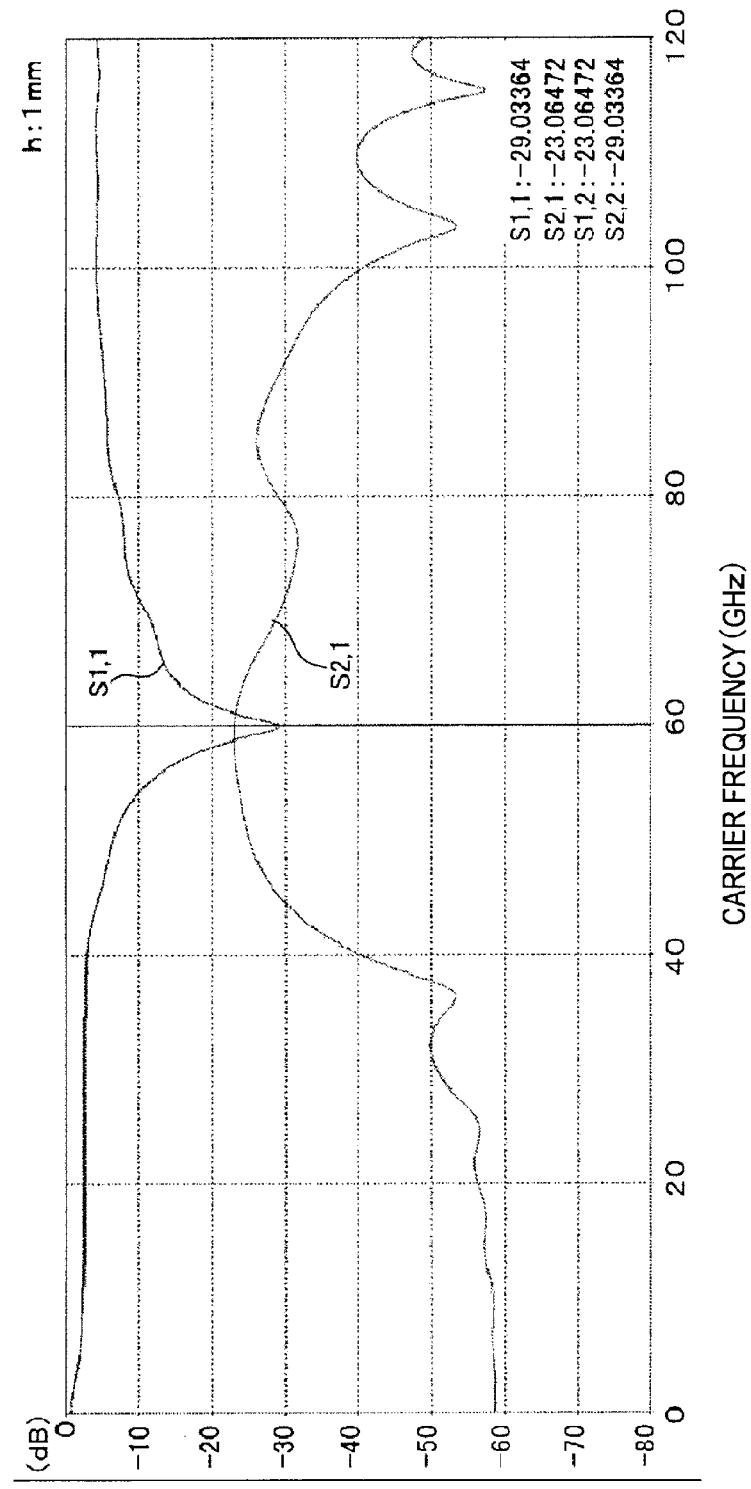
FIG. 32 is a graph illustrating an example 2 of simulation characteristics in the in-millimeter-wave dielectric transmission system illustrated in FIG. 30 according to the eighth embodiment.
Figure 33:
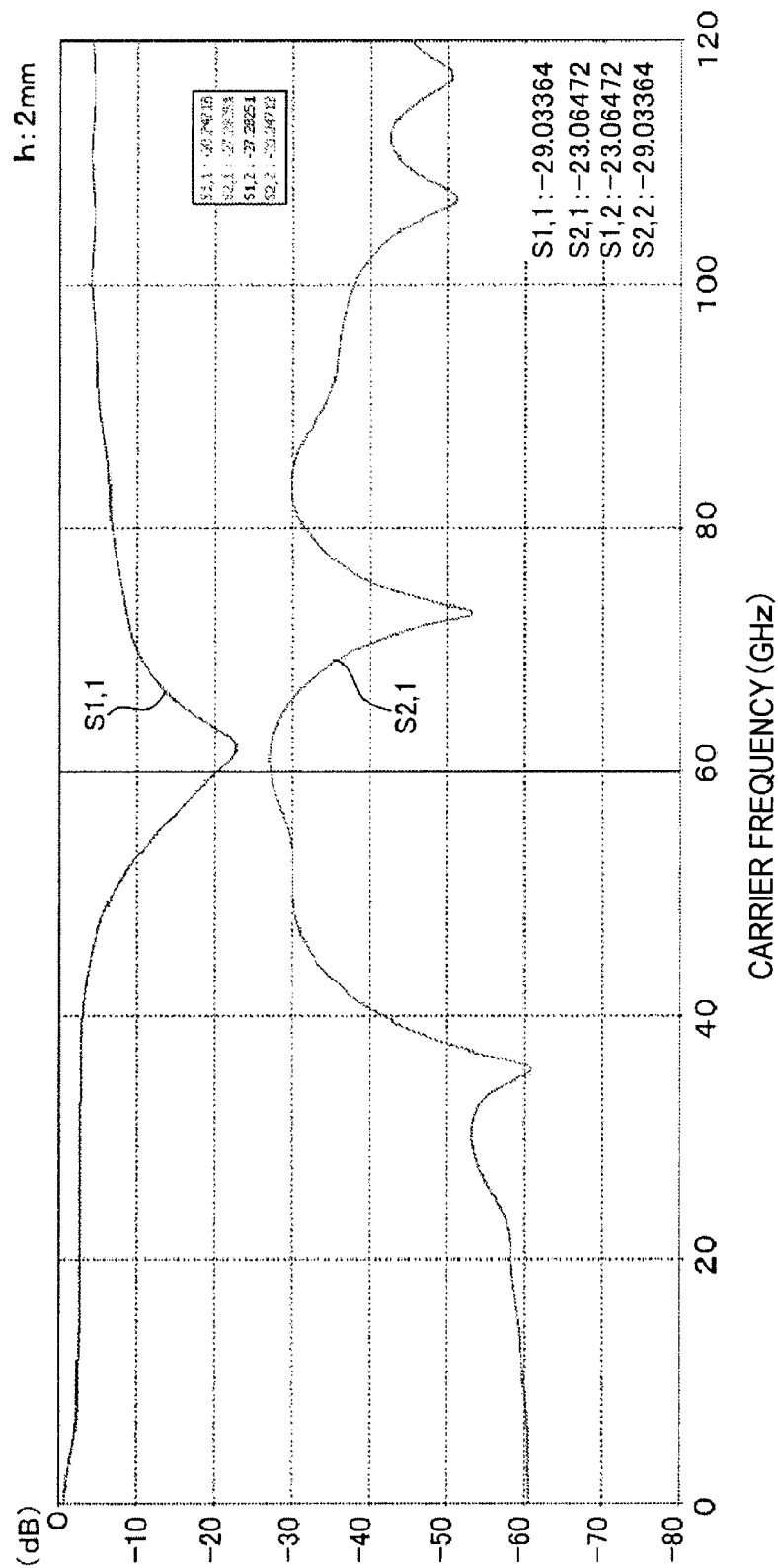
FIG. 33 is a graph illustrating an example 3 of simulation characteristics in the in-millimeter-wave dielectric transmission system illustrated in FIG. 30 according to the eighth embodiment.

FIGS. 29 to 33 are diagrams explaining an in-millimeter wave dielectric transmission system 600*k* (an electronic device) according to the eighth embodiment. FIG. 29 is diagrams explaining an example compared with the eighth embodiment. FIGS. 30A and 30B are diagrams explaining the configuration overview of the in-millimeter wave dielectric transmission system 600*k* according to the eighth embodiment. FIGS. 31 to 33 are diagrams illustrating an example of simulation characteristics in the in-millimeter wave dielectric transmission system 600*k* illustrated in FIG. 30 according to the eighth embodiment.

The eighth embodiment is characterized in that the two semiconductor packages 20*j*_1 and 20*j*_2 of the seventh embodiment including a plurality of semiconductor chips 30 capable of transmitting a millimeter wave signal are arranged facing each other, and millimeter wave transmission is performed between the semiconductor packages 20*j*_1 and 20*j*_2 (of the semiconductor chips 30). Between different packages, millimeter wave transmission is performed between the semiconductor chips 30, and a millimeter wave signal transmission path 21*k* is formed between the semiconductor packages 20*j*_1 and 20*j*_2 facing each other.

Hereinafter, in order to facilitate the understanding of the structure of the eighth embodiment, an example compared with the eighth embodiment will be first described, and then the overview and the detailed example of the eighth embodiment will be described.

COMPARISON EXAMPLE

FIG. 29 illustrates an electronic device 700*x* of the comparison example which does not employ the eighth embodiment. The electronic device 700*x* has a configuration approximately the same as that of the electronic device 700 illustrated in FIG. 39, and includes semiconductor packages 1*x*_1 and 1*x*_2 stacked therein. That is to say, the electronic device 700*x* has a configuration in which two multi-chip packages are vertically arranged. The electronic device 700*x* is different from the electronic device 700 illustrated in FIG. 39 in that a plurality of (two in the drawings) semiconductor chips 2_1 and 2_2 are mounted in each of the semiconductor packages 1*x*_1 and 1*x*_2.

Similarly to the semiconductor packages illustrated in FIG. 22, for data transmission within the semiconductor packages 1*x*_1 and 1*x*_2, the semiconductor chips 2_1 and 2_2 of each of the semiconductor packages 1*x*_1 and 1*x*_2 are provided on the surfaces thereof with a plurality of pad electrodes 3, and the bonding wires 7 are used for a connection for signal transmission. Meanwhile, data transmission between the semiconductor packages 1*x*_1 and 1*x*_2 is performed by providing connectors 14 to substrates 10*a* and 10*b* and connecting data transmission boards 15*x* (or cables 15) to each other between the connectors 14.

In the configuration of the comparison example as described above, it is necessary to perform data transmission between the semiconductor packages 1*x* via the connectors 14 and the data transmission boards 15*x*, and the complication of wiring of a high speed transmission line, the difficulty in realizing a high speed connector, the reduction in the degree of freedom of arrangement and the like may be problematic.

[Configuration Overview of Eighth Embodiment]

FIG. 30 illustrates the configuration overview of the in-millimeter wave dielectric transmission system 600*k* (an electronic device) according to the eighth embodiment. FIG. 30A is a schematic plan view and FIG. 30B is a schematic sectional view. As apparent from the comparison with the semiconductor package 20*j* illustrated in FIG. 25 according to the seventh embodiment, a plurality of semiconductor packages 20*j*_1 and 20*j*_2 according to the seventh embodiment are stacked while being spaced apart from each other by an inter-package distance h. That is, two multi-chip packages employing the seventh embodiment are vertically arranged.

The fact that a plurality of semiconductor packages 20 are stacked is the same as the second embodiment (FIG. 4), the third embodiment (FIG. 10), and the sixth embodiment (FIG. 19), but the eighth embodiment is different in that a plurality of (two in the drawings) semiconductor chips 30_1 and 30_2 are mounted in each semiconductor package 20*j*.

A millimeter wave signal transmission path 21*k*, which is a propagation path of a millimeter wave, is formed between the semiconductor packages 20*j*_1 and 20*j*_2. The millimeter wave signal transmission path 21*k* may be a free space transmission path. However, it is preferable to have a waveguide structure with a millimeter wave-confining structure of a waveguide, a transmission line, a dielectric line, an in-dielectric and the like, and to have characteristics capable of efficiently transmitting electromagnetic waves of a millimeter wave band. For example, it may be possible to use the dielectric transmission path 21 including a dielectric material having a specific dielectric constant within a constant range and a dielectric loss tangent within a constant range.

The "constant range" may be a range in which the specific dielectric constant and dielectric loss tangent of the dielectric material produce the effects of the present embodiment, and may be decided in advance within the range. That is, the dielectric material can transmit a millimeter wave signal having characteristics capable of producing the effects of the present embodiment. Since the dielectric material is not decided only by the above conditions and is associated with the length of a transmission path and the frequency of a millimeter wave, it is not necessarily clearly decided. However, as an example, the dielectric material is decided as follows.

In order to transmit a millimeter wave signal within dielectric transmission path 21 at a high speed, it is preferable that the dielectric material have a specific dielectric constant of about 2 to 10 (preferably 3 to 6) and a dielectric loss tangent of about 0.00001 to 0.01 (preferably 0.00001 to 0.001). As a dielectric material satisfying such conditions, for example, an acryl resin-based, urethane resin-based, epoxy resin-based, silicon-based, polyimide-based, or a cyanoacrylate-based dielectric material is used. In addition, in order to employ a configuration of confining a millimeter wave signal within the millimeter wave signal transmission path 21k, a hollow waveguide having a periphery surrounded by a shield material and a hollow inner portion may be used as the millimeter wave signal transmission path 21k, in addition to a dielectric transmission path.

The inverted-F type antenna 39j within the semiconductor package 20j is directional in the thickness direction (vertical direction) of the substrate as well as the planar direction (horizontal direction) of the substrate. Consequently, the inverted-F type antenna 39j can be applied to the transmission of a millimeter wave signal between the semiconductor chips 30 mounted in each of the semiconductor packages 20j_1 and 20j_2 arranged in parallel to each other in a stacked state.

On the other hand, when using an antenna having directivity only in the planar direction (horizontal direction) of the substrate as the antenna 39 within the package, the above effect is not realized. For example, when using a linear antenna erected with respect to the semiconductor chip 30, the thickness of resin needs to be equal to or more than the length of the antenna. Furthermore, since the used antenna is the linear antenna, the antenna is non-directional in the vertical direction and thus communication is not possible.

According to the in-millimeter wave dielectric transmission system 600k of the eighth embodiment, data transmission is performed between multi-chip packages, in which a plurality of semiconductor chips 30 (system LSIs) are arranged within one package, using a millimeter wave. The millimeter wave signal transmission path 21k, through which the millimeter waves are transmitted, is a free space transmission path, a dielectric transmission path having a millimeter wave-confining function, or a hollow waveguide. In signal transmission between packages, it is possible to reduce the number of the connectors 14 and data transmission boards 15x which are necessary for the electronic device 700x of the comparison example, and to solve the complication of wiring of a high speed transmission line, the difficulty in realizing a high speed connector, the reduction in the degree of freedom of arrangement and the like.

FIGS. 31 to 33 illustrate S parameter frequency characteristics when the semiconductor packages 20j_1 and 20j_2 including a plurality of semiconductor chips 30 provided with the inverted-F type antennas 39j are arranged to face each other in the vertical direction as illustrated in FIG. 30, and the inter-package distance h is changed. In such a case, the millimeter wave signal transmission path 21k is used as the free space transmission path. FIG. 31 illustrates the case in which the inter-package distance h is 0 mm, FIG. 32 illustrates the case in which the inter-package distance h is 1 mm, and FIG. 33 illustrates the case in which the inter-package distance h is 2 mm.

As apparent from the comparison of FIGS. 31 to 33, reflection loss shows superior characteristics around 60 GHz regardless of the inter-package distance h. This means that reflection due to impedance mismatching is small, and it can be said that successful communication is performed.

As described above, according to the eighth embodiment, electromagnetic waves irradiated from the inverted-F type antennas 39j of the semiconductor chips 30 propagate the millimeter wave signal transmission path 21k between the stacked semiconductor packages 20j. A millimeter wave signal using the millimeter wave signal transmission path 21k is transmitted between the two semiconductor chips 30 provided with the inverted-F type antennas 39j facing each other. It is possible to perform a communication process between packages via the millimeter wave signal transmission path 21k.

Specifically, for communication in the horizontal direction within a package in the semiconductor packages 20j illustrated in FIG. 25 according to the seventh embodiment and communication in the vertical direction in the in-millimeter wave dielectric transmission system 600k illustrated in FIG. 30 according to the eighth embodiment, the same inverted-F type antennas 39j illustrated in FIG. 24 are used. It is characterized in that it is possible to perform the communication in the horizontal direction and the communication in the vertical direction using the antenna having the same shape, and communication within a package and between packages is possible.

MODIFIED EXAMPLE

The preferred embodiments of the present invention have been described above with reference to the accompanying drawings, whilst the present invention is not limited to the above examples, of course. A person skilled in the art may find various alternations and modifications within the scope of the appended claims, and it should be understood that they will naturally come under the technical scope of the present invention.

Figure 34:
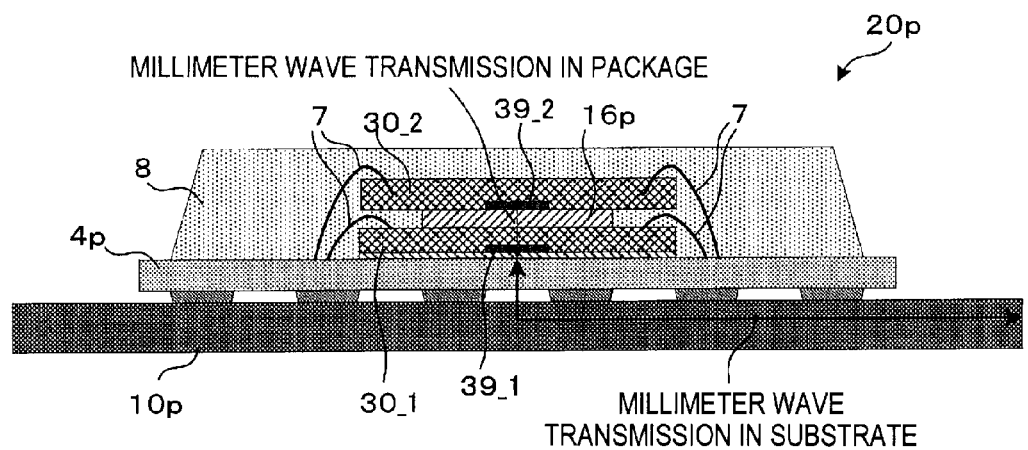
FIG. 34 is a diagram explaining a semiconductor package of a first modified example.

Furthermore, the embodiments are not intended to limit the present invention according to claims, and it should be noted that all combinations of the characteristics described in the embodiments are not necessarily indispensable to the solutions of the present invention. The above-described embodiments include various steps of inventions, and various inventions may be extracted by an appropriate combination of a plurality of elements disclosed. For example, even if some elements are deleted from all elements shown in the embodiments, a configuration with the elements deleted therefrom may be extracted as the invention as far as it can produce effects. Hereinafter, other modified examples will be described in brief First Modified Example FIG. 34 is a diagram explaining a semiconductor package 20p (which is equivalent to an in-millimeter wave dielectric transmission device in the present example) of the first modified example. The first modified example is characterized in that in one semiconductor package 20p, a plurality of semiconductor chips 30 are arranged on a substrate in a stacked state such that parts of antenna structures (antennas 39) are coaxial with each other, and millimeter wave transmission is performed between the semiconductor chips 30. The millimeter wave transmission is performed between the semiconductor chips 30 within the same package, and the semiconductor package 20p itself constitutes an in-millimeter wave dielectric transmission device.

The fact that a plurality of semiconductor chips 30 are stacked is the same as the second embodiment (FIG. 4), the third embodiment (FIG. 10), the sixth embodiment (FIG. 19), and the eighth embodiment (FIG. 30), but the first modified example is different in that all semiconductor chips 30 are mounted in the same package.

An antenna (e.g., a patch antenna) having directivity in the thickness direction of the substrate (the semiconductor chip 30) is used as the antenna 39.

A dielectric material 16p (preferably, a viscoelastic material 16) capable of millimeter-wave band communication is provided at a bonding portion between the plurality of semiconductor chips 30. The dielectric material 16p has a heat dissipation function and constitutes a dielectric transmission path 21 capable of millimeter-wave band communication.

The plurality of semiconductor chips 30 in a stacked state are protected by a molded resin 8, and are mounted on an LSI package substrate 4p (an interposer substrate). The LSI package substrate 4p and the molded resin 8 are made of a dielectric material including a dielectric capable of transmitting a millimeter wave signal.

Such a semiconductor package 20p is further mounted on a mounting substrate 10p. The substrate 10p is also made of a dielectric material including a dielectric capable of transmitting a millimeter wave signal. A millimeter wave signal from (or to) the semiconductor chips 30 positioned at the lowermost portion (the side of the LSI package substrate 4p) within the semiconductor package 20p is transmitted within the substrate 10p. The scheme of transmitting the millimeter wave signal within the substrate 10p will be referred to as an "in-millimeter wave substrate transmission scheme" or an "in-millimeter wave tangible entity transmission scheme." When deciding the transmission direction within the substrate 10p, it is preferable to provide an opening hole array (a through hole fence) in order to decide a transmission range of a millimeter wave signal within the substrate 10p. When making the transmission direction of the millimeter wave signal within the substrate 10p to be non-directional, the opening hole array may be omitted.

In the semiconductor package 20p of the first modified example, data transmission between semiconductor chips 30_1 and 30_2 in a stacked state can be performed using a millimeter wave. This is advantageous in that it is possible to reduce a package area as compared with the seventh embodiment in which semiconductor chips are arranged in parallel to each other when viewed in a plan view. In the example illustrated in the drawing, two semiconductor chips 30 are stacked. However, three or more semiconductor chips may be stacked, or as the number of the semiconductor chips is increased, the superiority with respect to the seventh embodiment is increased.

In the semiconductor package 20p of the first modified example, data transmission between a plurality of semiconductor chips 30 within the same package can be performed using a millimeter wave, and data transmission between the semiconductor chips 30 within different semiconductor packages 20 can be further performed using millimeter waves through transmission in a substrate.

Second Modified Example

Figure 35:
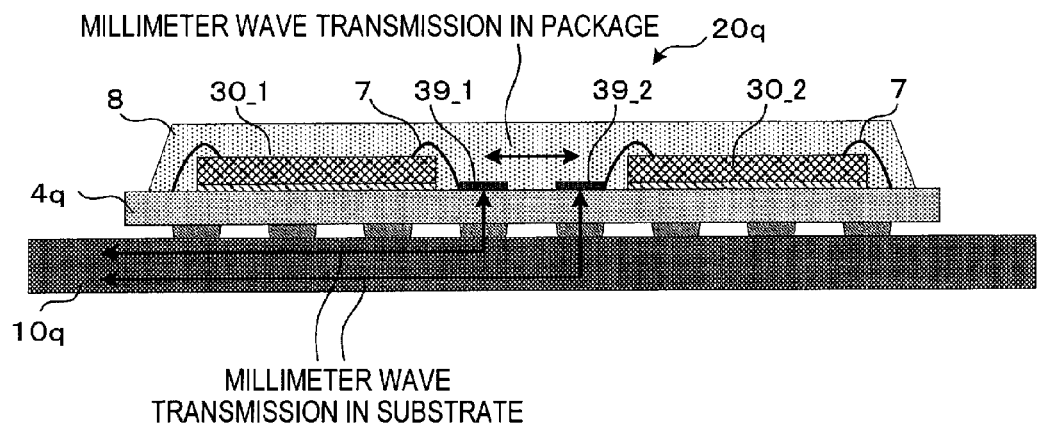
FIG. 35 is a diagram explaining a semiconductor package of a second modified example.

FIG. 35 is a diagram explaining a semiconductor package 20q (which is equivalent to an in-millimeter wave dielectric transmission device in the present example) of the second modified example. In the second modified example, a semiconductor package 20q is mounted on a mounting substrate 10q, similarly to the first modified example. The substrate 10q is also made of a dielectric material including a dielectric capable of transmitting a millimeter wave signal, so that an in-millimeter wave substrate transmission scheme capable of transmitting a millimeter wave signal within the substrate 10q is applied.

Also in the semiconductor package 20q of the second modified example, data transmission between a plurality of semiconductor chips 30 within the same package can be performed using a millimeter wave, and data transmission between the semiconductor chips 30 within different semiconductor packages 20 can be further performed using millimeter waves through transmission in a substrate.

Third Modified Example

Figure 36:
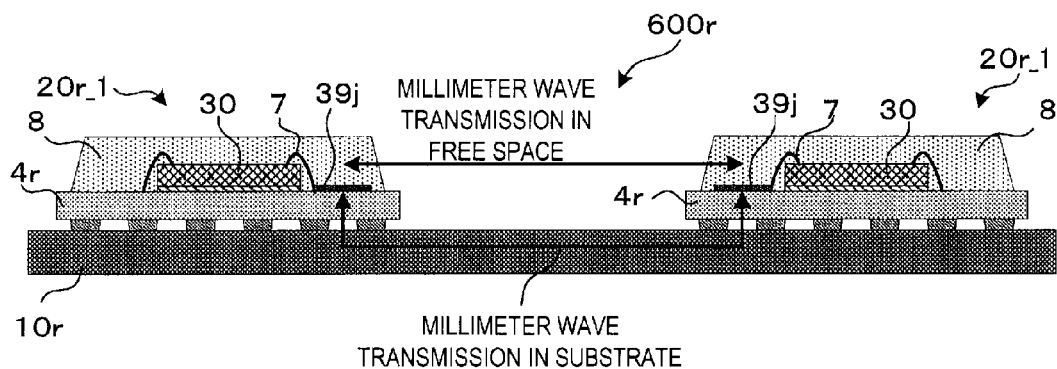
FIG. 36 is a diagram explaining a semiconductor package and an in-millimeter-wave dielectric transmission system of a third modified example.

FIG. 36 is a diagram explaining a plurality of semiconductor packages 20r and an in-millimeter wave dielectric transmission system 600r of the third modified example. The third modified example is characterized in that in data transmission between the plurality of semiconductor packages 20r, free space transmission is used for an in-millimeter wave substrate transmission scheme shown in the first modified example and the second modified example. The number of semiconductor chips 30 mounted in one semiconductor package 20r is not limited.

Preferably, an antenna (e.g., an inverted-F type antenna 39j) having directivity in the thickness direction of a substrate (the semiconductor chip 30) and the planar direction of the substrate is used as an antenna 39.

In each semiconductor package 20r, an antenna structure 32' is arranged in parallel to the semiconductor chip 30 of an interposer substrate 4r, similarly to the fourth embodiment. In addition, each semiconductor package 20r is mounted on a mounting substrate 10r, similarly to the first and second modified examples. The substrate 10r is also made of a dielectric material including a dielectric capable of transmitting a millimeter wave signal, so that an in-millimeter wave substrate transmission scheme capable of transmitting a millimeter wave signal within the substrate 10r is applied.

Since an antenna (e.g., an inverted-F type antenna 39j) having directivity in the thickness direction of the substrate 10r (the semiconductor chip 30) and the planar direction of the substrate 10r is used as the antenna 39, millimeter waves irradiated from the antenna 39 in the planar direction are transmitted to another semiconductor package 20r via a free space transmission path 21r as a millimeter wave signal transmission path.

According to the third modified example, data transmission between a plurality of semiconductor packages 20r can be performed through transmission in a substrate in a millimeter wave band, and performed via the free space transmission path 21r.

Fourth Modified Example

Figure 37:
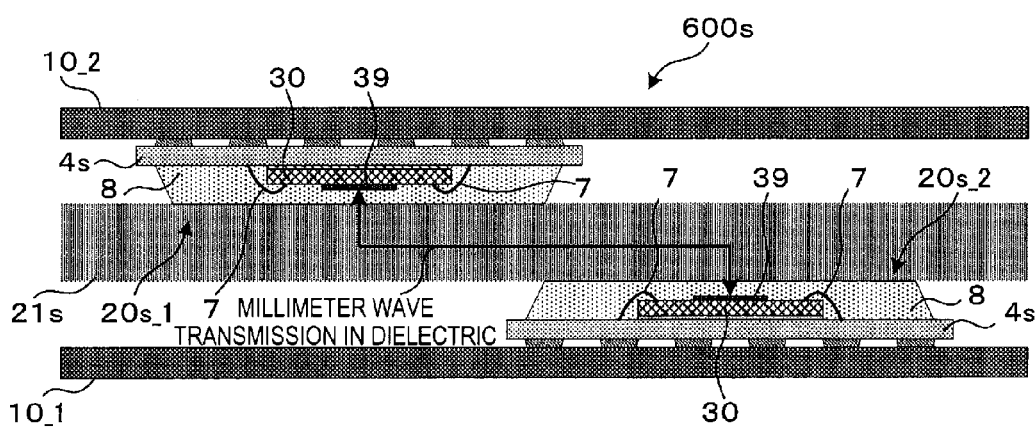
FIG. 37 is a diagram explaining an in-millimeter-wave dielectric transmission system of a fourth modified example.
Figure 38A:
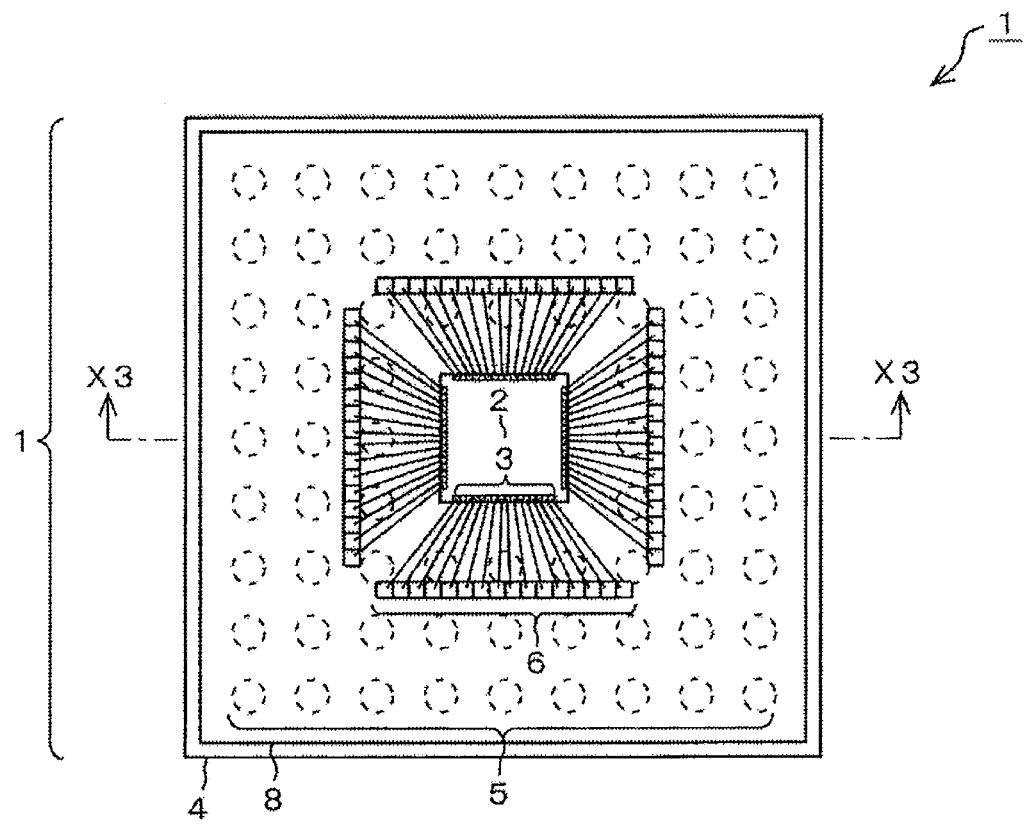
FIG. 38A is a plan view illustrating a configuration example of a semiconductor package 1 according to the related art.
Figure 38B:
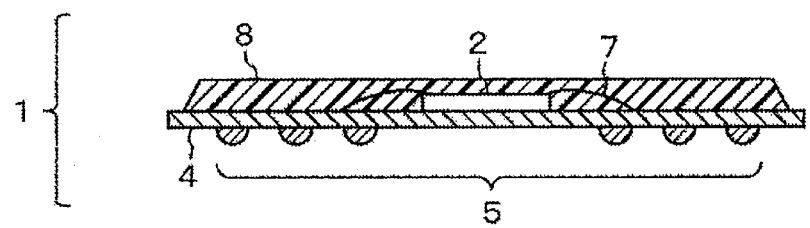
FIG. 38B is a sectional view taken along line X3-X3, which illustrates a configuration example of the semiconductor package 1 according to the related art.

FIG. 37 is a diagram explaining an in-millimeter wave dielectric transmission system 600s of the fourth modified example. The fourth modified example is characterized in that data transmission between a plurality of semiconductor packages 20 arranged to be offset in the horizontal direction is performed using millimeter waves, similarly to the fifth embodiment. The difference relative to the fifth embodiment is that the semiconductor packages 20 are mounted on different mounting substrates 10_1 and 10_2. A millimeter wave signal transmission path 21s may use transmission paths other than the free space transmission path, for example, it is preferable to use a dielectric transmission path made of a dielectric material. The dielectric transmission path, for example, may be a dielectric transmission path formed within the chassis 11 for defining an area, as with the fifth embodiment.

Preferably, an antenna having directivity in the planar direction with respect to a substrate, as with a rod antenna, is used as an antenna structure. For example, as with the fifth embodiment, the antenna 39 is drawn to the surface of the molded resin 8 sealing the semiconductor chip 30 to protrude toward the millimeter wave signal transmission path 21s. Furthermore, when using an antenna having directivity in the thickness direction with respect to the substrate, it is preferable to devise a method of changing a travel direction in the planar direction with respect to the substrate. This point is the same as that described in the fifth embodiment.

For example, when a plurality of semiconductor packages 20 are arranged in a stacked state, the fourth modified example is effective when it is not possible to ensure a space where they are coaxially arranged in the stacked state due to the limitation of a layout.

The present invention is very suitable for an in-millimeter wave dielectric transmission system that transmits a millimeter wave band signal having a carrier frequency of 30 GHz to 300 GHz at a high speed for carrying a movie image, a computer image and the like. The system includes a digital recording reproduction apparatus, a terrestrial television receiver, a cell phone, a game machine, a computer, a communication apparatus and the like.

Reference Signs List

1 Semiconductor package
2 Semiconductor chip
3 Pad electrode
4 Interposer substrate
5 Terminal electrode
6 Lead electrode
7 Bonding wire
8 Molded resin
9 Protrusion electrode (bump)
10, 10' Substrate
11 Chassis
12, 12a 12b Housing
13 Screw structure
14 Connector
15 Cable
16 16a, 16b Viscoelastic material
20, 20a to 20f Semiconductor package
21 Dielectric transmission path (millimeter wave transmission member)
21' Dielectric material
30 Semiconductor chip
31 Antenna terminal
32, 32' Antenna structure
33 Microstrip line
39 Antenna
39j Inverted-F type antenna
70 Strut
80 Semiconductor package
201 LSI function unit
202 Millimeter wave generation unit
203, 203' Antenna coupling unit (signal coupling unit)
204 Electrical interface
205 Millimeter wave interface
206 Dielectric section
200, 300, 400, 500 In-millimeter-wave dielectric transmission device
600 In-millimeter-wave dielectric transmission system
601, 602 Electronic device

The invention claimed is:

1. A semiconductor device comprising:
a semiconductor chip provided on a substrate and capable of millimeter-wave band communication;
an antenna structure connected to the semiconductor chip;
an insulating member configured to cover the semiconductor chip; and
a millimeter wave transmission member made of a dielectric material including a dielectric capable of millimeter wave signal transmission and matched with the antenna structure.

2. The semiconductor device according to claim 1, wherein the millimeter wave transmission member includes:
an area-defining member with a through portion matched with the antenna structure connected to the semiconductor chip; and
the dielectric material provided in the through portion of the area-defining member.

3. The semiconductor device according to claim 2, wherein the antenna structure connected to the semiconductor chip is provided on the semiconductor chip.

4. The semiconductor device according to claim 3, wherein the antenna structure connected to the semiconductor chip is provided with a patch antenna.

5. The semiconductor device according to claim 4, wherein the semiconductor chip includes:
a first signal generation unit configured to perform signal processing for an input signal and generate a millimeter wave signal;
a bidirectional signal coupling unit configured to couple the semiconductor chip to the antenna structure, transmit the millimeter wave signal generated by the first signal generation unit to the millimeter wave transmission member, and receive the millimeter wave signal from the millimeter wave transmission member;
a second signal generation unit configured to perform signal processing for the millimeter wave signal received by the signal coupling unit and generate an output signal.

6. The semiconductor device according to claim 5, wherein the first signal generation unit includes a first signal conversion section configured to convert a parallel input signal to a serial output signal, and
the second signal generation unit includes a second signal conversion section configured to convert a serial input signal to a parallel output signal.

7. The semiconductor device according to claim 2, wherein the antenna structure is arranged in parallel to the semiconductor chip.

8. A method of manufacturing a semiconductor device, the method comprising the steps of:
forming a semiconductor chip capable of millimeter-wave band communication on a substrate;
connecting an antenna structure to the semiconductor chip formed on the substrate;
insulating the semiconductor chip by covering the semiconductor chip with an insulating member; and
matching the antenna structure with a millimeter wave transmission member using a dielectric material including a dielectric capable of millimeter wave signal transmission.

9. The method according to claim 8, wherein the step of matching the antenna structure with the millimeter wave transmission member includes the steps of:
forming an area-defining member in the insulating member;
forming a through portion, which is matched with the antenna structure, in the area-defining member; and
forming the millimeter wave transmission member by providing the dielectric material in the through portion of the area-defining member.

* * * * *